United States Patent [19]
Iwata et al.

[11] Patent Number: 5,960,319
[45] Date of Patent: *Sep. 28, 1999

[54] FABRICATION METHOD FOR A SEMICONDUCTOR DEVICE

[75] Inventors: Hiroshi Iwata, Ikoma-gun; Masayuki Nakano, Tenri; Shigeki Hayashida, Kitakatsuragi-gun; Seizou Kakimoto, Shiki-gun; Toshimasa Matsuoka, Yao, all of Japan

[73] Assignee: Sharp Kabushiki Kaisha, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/699,410

[22] Filed: Aug. 19, 1996

[30] Foreign Application Priority Data

Oct. 4, 1995 [JP] Japan ................................. 7-257699

[51] Int. Cl.[6] .................................................. H01L 21/44
[52] U.S. Cl. ........................ 438/664; 438/659; 438/649; 438/651; 438/683; 438/685
[58] Field of Search ............................ 437/200; 438/558, 438/602, 659, 632, 682, 692, 261, 264, 594, 649, 651, 664, 683, 685

[56] References Cited

U.S. PATENT DOCUMENTS

| | | | |
|---|---|---|---|
| 4,874,713 | 10/1989 | Gioia | 437/34 |
| 5,427,970 | 6/1995 | Hsue et al. | 438/594 |
| 5,610,088 | 3/1997 | Chang et al. | 437/34 |
| 5,733,818 | 3/1998 | Goto | 438/692 |

OTHER PUBLICATIONS

Self–Aligned Titanium Silicidation by Lamp Annealing, K. Tsukamoto et al., SSDM 1984 P47–50 J [Reference 1].

Impact of Surface Proximity Gettering and Nitrided Oxide Side–Wall Spacer by Nitrogen Implantation on Sub–Quarter Micron CMOS LDD FETs, S. Shimizu et al., IEDM95 P859–862 [Reference 2].

Novel Low Leakage and Low Resistance Titanium Salicide Technology with Recoil Nitrogen Achieved by Silicidation after Ion Implantation through Contamination–Restrained Oxygen Free LPCVD–Nitride Layer (SICRON), H. Kotaki et al., SSDM 1995 P85–87, including Contents [Reference 3].

Primary Examiner—Charles Bowers
Assistant Examiner—Reneé R. Berry

[57] ABSTRACT

A semiconductor device and a fabrication method thereof are disclosed. A silicon nitride film is formed over a silicon semiconductor substrate. Impurity ions are then implanted into desired areas of the silicon semiconductor substrate, so that nitrogen atoms and silicon atoms from the silicon nitride film are incorporated into the surface of the silicon semiconductor substrate together with introduction of impurity ions. The silicon semiconductor substrate has a minimized content of oxygen mixed thereinto and restored crystal defects filled by nitrogen atoms upon implanting of impurity ions. The fabricated semiconductor device is free from a trade-off relation between gate-electrode depletion and junction current leakage, and short-channel effects.

33 Claims, 28 Drawing Sheets

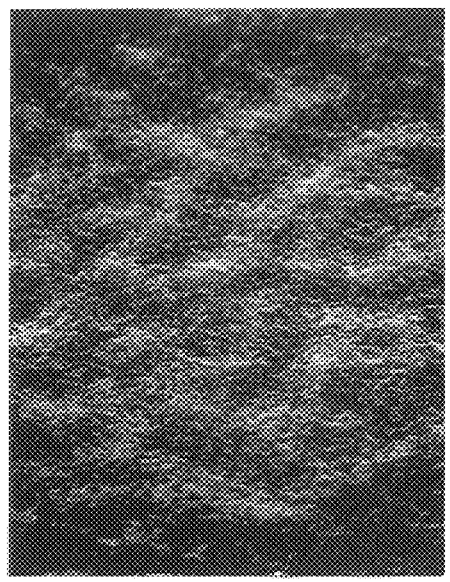 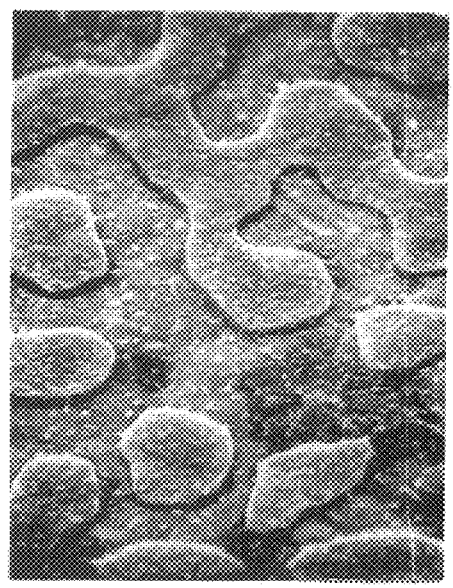
Present invention | Conventional example
Fig. 13(a) | Fig. 13(b)

Fig. 23 (d)
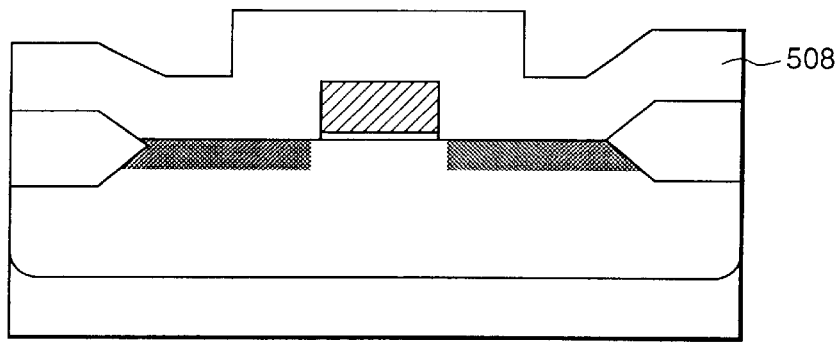
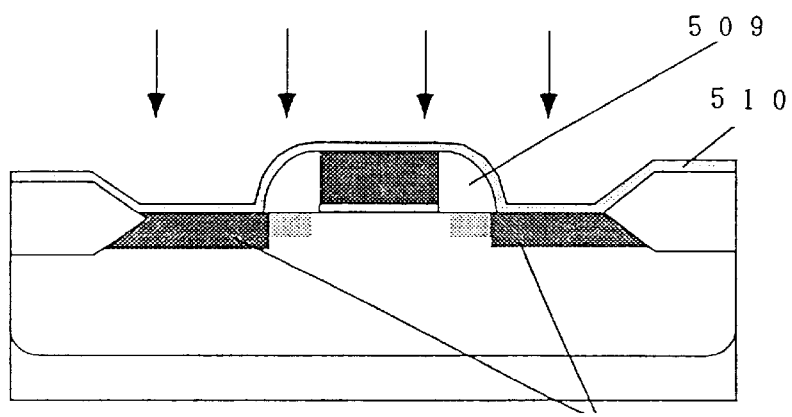
Fig. 23 (e)
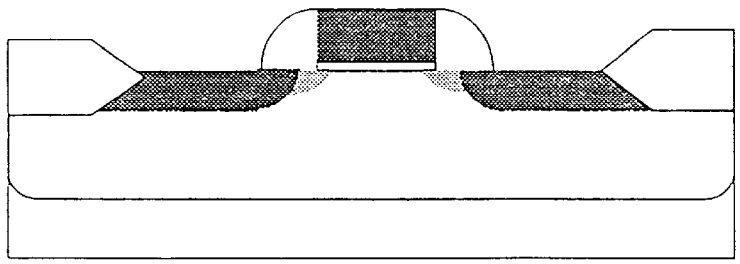
Fig. 23 (f)
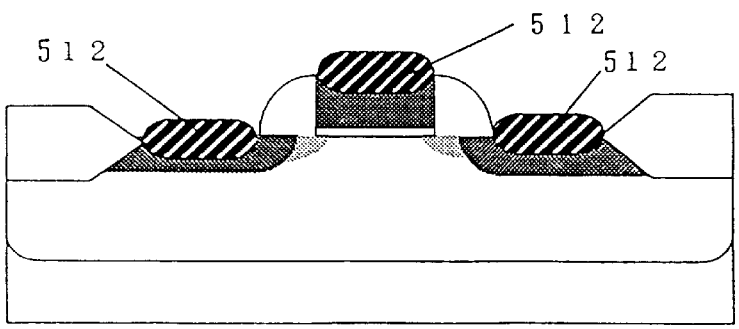
Fig. 23 (g)

FABRICATION METHOD FOR A SEMICONDUCTOR DEVICE

BACKGROUND OF THE INVENTION

1. Field of the Invention

This invention relates to a semiconductor device and a fabrication method thereof, and more particularly to a method for forming a titanium silicide film which is low in electric resist layerance and excellent in heat resist layerance, and a semiconductor device, such as a salicide CMOS transistor, which is reduced in junction leakage currents and suppressed in short-channel effect for raising drive power, and a method of fabricating the same.

2. Related Art

In insulated-gate field effect transistors employed in semiconductor integrated circuits currently available, there is reduction of depletion-layer electric charges carried by a gate electrode relative to the total amount of depletion-layer electric charges, as the device miniaturizes. As a result, the transistor is apt to cause short-channel effects involving lowering of threshold voltage, punch-through, and degradation in sub-threshold characteristics. One factor of such phenomenon is attributable to deep junctions of source and drain regions.

To suppress the short-channel effect, there arises a necessity of making junctions of source and drain regions shallower commensurate with miniaturization of the device. In PMOS semiconductor devices, there is a general tendency of adopting a surface-channel transistor provided with p-type doping, because the conventional buried-channel transistor with an n-doped gate electrode cannot cope with steping of fine linewidth. With such structure, the gate electrode is built in a dual-gate type. To simplify fabrication steps, the gate electrode is subjected to doping simultaneous with formation of source and drain regions respectively for NMOS and PMOS structures. A self-aligned silicide technique (a salicide technique) also comes to broad utilization for raising drive power of the transistor, accompanied by finer steping and shallower junctions.

A device fabrication method, e.g., shown in FIGS. 26(a)–26(e), is conventionally known as a self-aligned silicide technique (a salicide-transistor technique) (K. Tsukamoto, T. Okamoto, M. Shimizu, T. Matsukawa and H. Harada: Extended Abstracts 16th Int. Conf. Solid State Devices & Materials, Kobe 1984 (Business Center for Academics Societies Japan, Tokyo, 1984) see p. 47). The method of FIGS. 26(a)–26(e) will be explained hereinbelow.

Referring to FIG. 26(a), a silicon semiconductor substrate 601 is formed thereon a field oxide layer 602, a gate oxide film 603, and a gate electrode of polysilicon 604 having side walls thereof covered with an insulation film. The gate electrode contains phosphorus as impurity ions diffused into polysilicon prior to patterning thereof. Then, as shown in FIG. 26(b), an oxide film 606 is deposited and a high concentration of impurity ions are implanted into areas for source and drain through the oxide film 606 with using photo-resist layer as a mask, not shown. As for impurity ions, arsenic ions are employed for an n-channel, while boron is used for a p-channel. Thereafter, a heat treatment for activation is performed, e.g., in a nitrogen ambient at 900° C. for 30 minutes for formation of source and drain regions 607. The oxide film 606 is then removed from the surface of the source and rain regions 607 and the gate electrode 604, and thereafter a titanium film 608 is deposited by sputtering in an argon ambient, as shown in FIG. 26(c). Then, a first rapid thermal anneal is performed in a nitrogen ambient at 675° C. for approximately 20 seconds, as shown in FIG. 26(d) to react titanium with silicon in the surface layers of the source and drain regions 607 and the gate electrode 604, thereby forming a titanium silicide ($TiSi_2$) of a C49-crystal structure which is stoichiometrically metastable. On this occasion, the surface of the titanium film 608 alters to a titanium nitride film 609. Etching is then made with using a solution mixture of sulfuric acid and hydrogen peroxide to remove unreacted titanium 608 and a titanium nitride film 609 formed by the first rapid thermal anneal, as shown in FIG. 26(e). Thereafter, a second rapid thermal anneal is performed in an nitrogen ambient at 800° C. for approximately 20 seconds to transform the titanium silicide film 610 into a titanium silicide film ($TiSi_2$) of a C54-crystal structure which is stoichiometrically stable.

There is also illustrated in FIGS. 28(a)–28(c) and FIGS. 29(d)–29(g) a conventional fabrication step utilizing a salicide technique for a dual-gate CMOS device. The step is briefly explained with reference to the drawings.

Referring to FIG. 28(a), a silicon semiconductor substrate 801 is first formed with a p-well 802 and an isolation layer 803. Thereafter, a gate dielectric film 804 is formed on the substrate, and a gate electrode 805 is formed to a thickness of, i.e., 2500 angstroms. Then, a thin insulation film 806 is deposited to implant $^{31}p^+$ ions, thereby forming low-concentration (LDD) region 807, as shown in FIG. 28(b), followed by deposition of a thick insulation film 808 to a thickness of, e.g., 1000 angstroms, as shown in FIG. 28(c). The thick insulation film is then subjected to isotropic etching to form side wall spacers 809 on side walls of the gate electrode 805, as shown in FIG. 29 (d). Subsequently, a thin insulation film 810 is deposited and then $^{75}AS^+$ ions are implanted in a higher concentration, e.g., $3\times10^{15}/cm^2$, than the $^{31}p^+$ ions with an implant energy of 40 keV, for forming source and drain regions 811 and $n^+$-doping the gate electrode 805, as shown in FIG. 29(e). Then, annealing is done in a nitrogen ambient at 850° C. for 10 minutes and treated by furnace annealing or RTA (Rapid thermal anneal) at 1000° C. for 20 seconds, for activating $n^+$ ions and restoring crystal defects in the LDD regions 808, the source and drain regions 811, and the gate electrode 805, as shown in FIG. 29(g). A refractory metal is then deposited by a technique such as sputtering and forming salicide 812 in a self-aligned manner through a heat treatment such as two-step RTA, providing a semiconductor device.

However, the conventional titanium silicide film forming step as above involves problems as given below.

(1) In a reaction system of Ti and Si, impurity ions are implanted through an oxide film, so that oxygen atoms, i.e., oxygen atoms undergoing knock-on upon implant of impurity ions, are inevitably mixed into a silicon semiconductor substrate (See FIG. 27). The mixing of oxygen atoms is particularly prominent when implanting heavy ions, resulting in silicidation reaction in a ternary element system of Ti, Si, and O.

(2) Silicidation by the ternary element system does not proceed necessary silicidation. Further, $SiO_2$ is preferentially formed in grain boundaries of $TiSi_2$, raising the sheet resist layerance and worsening the heat resist layerance of the titanium silicide film.

(3) Particularly, where silicidation is made in a linewidth finer than the grain size of $TiSi_2$, the above problem (2) is prominent. That is, in silicidation in a linewidth finer than the grain size of $TiSi_2$, transformation C49 into a C54-crystal structure from C49 is inapt to occur by a rapid thermal annealing (an RTA treatment) at 900° C. or below, giving a high-resist layerance titanium silicide film. Conversely, where the RTA treatment is performed at a high temperature of 900° C. or higher, the transformation of from C49 into the C54-crystal structure is apt to occur. However, there arises worsening of heat resist layerance and causing aggregation of $TiSi_2$ as compared with a broader linewidth of titanium silicide films. Further, with a treatment at such temperature, aggregation begins to occur due to the effect of oxygen atoms even for titanium silicide films with a broader linewidth. There is therefore a problem that aggregation is certain to occur in a finer linewidth of titanium silicide films.

(4) In conventional silicidation, where a heat treatment is performed at such a temperature as to exceed 800° C. after formation of a titanium silicide film, aggregation takes place in the titanium silicide film by the effect of oxygen atoms, resulting in diffusion of titanium into the silicon semiconductor substrate. This increases junction current leakage through the source and drain regions and lowers the reliability of the gate oxide film. As for silicidation for a linewidth of finer than the grain size of $TiSi_2$, e.g., silicidation for a gate electrode, there is rise in the sheet resist layerance (resist layerivity of an interconnection) of a titanium silicide film to a level almost equivalent to that of an interconnection without being backed by a titanium silicide film.

(5) In the conventional CMOS forming method, a heat treatment (anneal) is simultaneously done for the n-channel and p-channel. However, the diffusion coefficient of boron in silicon for the p-channel is greater than that of arsenic for the n-channel. Consequently, source and drain regions on the p-channel side become deeper, prominently increasing the short-channel effect.

(6) Where conditions of a heat treatment (anneal) for activation of impurity ions are optimized to meet the p-channel side for suppressing the short-channel effect, crystal-defect restoration on the n-channel side is unsatisfactory, increasing junction current leakage in the n-channel side. Incidentally, an arsenic ion is heavier than an boron ion, effecting heavier damages in implanting.

(7) The junction depth of the source and drain regions is provided shallow by reducing implant energy for suppressing the transistor short-channel effect, lowering the temperature or briefing the time period of a heat treatment. However, a silicide formed is positioned closer to a silicide/silicon interface, the junction leakage current increases.

(8) The polysilicon gate electrode is thick and has low impurity concentration at the interface of the gate electrode and the gate dielectric film even if they are treated by low-energy implant with a low-temperature or brief-time heat treatment. As a result, the gate electrode when applied voltages causes depletion therein, leading to a short-channel effect or reduction of drive power.

SUMMARY OF THE INVENTION

In the conventional semiconductor device fabrication method, oxide films as a mask for impurity-ion implant are considered essential for prevention from contamination by other impurities. In a CMOS (complementary MOS) fabrication step, particularly, photo-resist layer masks are necessary for implanting donors and acceptors into respective desired areas. Meanwhile, the photo-resist layer mask includes high content of heavy metals. These heavy metals are contaminants for silicon semiconductor substrate, so that an oxide film is formed over the silicon semiconductor substrate in order not to contact directly the mask with the silicon semiconductor substrate. Under such situations, it has not been emphasized on introduction of oxygen atoms into a silicon semiconductor substrate from an oxide film upon implanting of impurity ions therethrough. This invention has been made by the present inventors based on their finding that the utilization of a silicon nitride film, instead of a silicon oxide film, enables minimization of oxygen atoms introduced from an oxide film upon implanting of impurity ions.

In accordance with a first aspect of the present invention, there is provided a method of fabricating a semiconductor device comprising the steps of:

(a) forming a silicon nitride film over a silicon semiconductor substrate;

(b) implanting impurity ions into a desired area in the surface layer of the substrate through the silicon nitride film, simultaneously incorporation therein of nitrogen atoms and silicon atoms derived from the silicon nitride film.

In accordance with a second aspect of the present invention, there is provided a method of fabricating a semiconductor device comprising the steps of:

(a)' forming a silicon nitride film over a silicon semiconductor substrate;

(b)' implanting impurity ions into desired areas of the silicon semiconductor substrate, whereby nitrogen atoms and silicon atoms from the silicon nitride film are incorporated into the surface of the silicon semiconductor substrate together with introduction of impurity ions;

(c)' removing the silicon nitride film;

(d)' forming a titanium film over the silicon semiconductor substrate; and (e)' subjecting the silicon semiconductor substrate having the titanium film to a heat treatment so as to transform the titanium film into a titanium silicide film containing nitrogen atoms.

In accordance with a third aspect of the present invention, there is provided a method of fabricating a semiconductor device comprising the steps of:

(a)" forming a silicon nitride film over a silicon semiconductor substrate, the silicon semiconductor substrate having well regions of a first conductivity type and a second conductivity type formed in a surface layer thereof, and a surface layer thereof having gate dielectric films, gate electrodes, and isolation layer formed thereon;

(b)" implanting impurity ions into desired areas of the silicon semiconductor substrate through the silicon nitride film, wherein (1) masking the first-conductivity well region with a photo-resist layer and implanting impurity ions of the first conductivity type to cause incorporation of nitrogen atoms and silicon atoms from the silicon nitride film into the second-conductivity well region of the surface layer together with introduction thereinto of impurity ions, (2) removing the photo-resist layer from the first-conductivity well region and masking the second-conductivity well region with a photo-resist layer to implant impurity ions of the second conductivity type so as to cause incorporation of nitrogen atoms and silicon atoms from the silicon nitride film into the surface layer of the second-conductivity well region together with introduction thereinto of impurity ions, (3) removing the photo-resist layer from the second-conductivity well region and forming side wall spacers on side walls of respective one of the gate electrodes through the silicon nitride film, and thereafter masking the first-conductivity type well region with a photo-resist layer to implant impurity ions of the second conductivity type so as to cause incorporation of nitrogen atoms and silicon atoms from the silicon nitride film into the surface layer of the second-conductivity well region together with introduction thereinto of impurity ions, and (4) removing the photo-resist layer from the first-conductivity well region and masking the second-conductivity well region with a photo-resist layer to implant impurity ions of the second conductivity type so as to cause incorporation of nitrogen atoms and silicon atoms from the silicon nitride film into the surface layer of the second-conductivity well region together with introduction thereinto of impurity ions, and then removing the photo-resist layer from the second-conductivity well region;

(c)" removing the silicon nitride film;

(d)" forming a titanium film over the silicon semiconductor substrate;

(e)" subjecting the silicon semiconductor substrate having the titanium film to a first heat treatment so as to transform the titanium film into a titanium silicide film containing nitrogen atoms;

(f) removing unreacted part of the titanium film to leave the titanium silicide film formed by the first heat treatment; and (g) subjecting the silicon semiconductor substrate having the titanium silicide film so as to transform the silicon nitride film into a TiSi$_2$ C54-crystal structure which is stoichiometrically stable.

In accordance with a fourth aspect of the present invention, there is provided a method of fabricating a semiconductor device comprising the steps of:

(a)''' forming a first silicon nitride film over a silicon semiconductor substrate, the silicon semiconductor substrate having a gate dielectric film and a gate electrode of polysilicon having a thickness of 100–200 nm formed thereon;

(b)''' (1) implanting impurity ions of a conductivity type opposite to that of a channel region present beneath the gate electrode into desired areas of the silicon semiconductor substrate so as to incorporate nitride atoms and silicon atoms from the first silicon nitride film into a surface layer of the silicon semiconductor substrate together with introducing of impurity ions thereinto, and (2) removing the first silicon nitride film and depositing an insulation film to a thickness of 200–300 nm over the silicon semiconductor substrate, subjecting the insulation film to isotropic etching to form side wall spacers on side walls of the gate electrode, and forming a second silicon nitride film over the silicon semiconductor substrate to implant impurity ions of the conductivity type opposite to that of the channel region so as to cause incorporation of nitrogen atoms and silicon atoms from the second silicon nitride film into the gate electrode as well as the surface layer to be formed into source and drain regions of the silicon semiconductor substrate together with introducing impurity ions thereinto;

(c)''' removing the second silicon nitride film to perform a heat treatment for restoration of crystal defects;

(d)''' forming a titanium film over the silicon semiconductor substrate; and (e)''' subjecting the silicon semiconductor substrate having the titanium film to further heat treatment so as to transform by self-aligning the titanium film into a titanium silicide film containing nitrogen atoms.

Also, in accordance with the present invention, there is provided a semiconductor device fabricated by the third aspect of the invention comprising:

wells of first and second conductivity types formed in a surface layer of a silicon semiconductor substrate;

isolation layers formed on the silicon semiconductor substrate;

gate dielectric films and gate electrodes formed respectively on the first and second conductivity type wells;

titanium silicide films respectively formed on the gate electrodes;

side wall spacers formed on side walls of each of the gate electrodes;

source and drain regions formed in the surface layer on respective sides of each of the gate electrodes;

regions having a junction shallower than that of the source and drain regions respectively formed in the surface layer beneath the side walls; and titanium silicide film respectively formed on the source and drain regions.

Further, in accordance with the present invention, there is provided a semiconductor device fabricated by the fourth aspect of the invention comprising:

a silicon semiconductor substrate having a gate electrode formed thereon through a gate dielectric film, the gate electrode containing at least polysilicon having a thickness of 100–200 nm;

a titanium silicide film formed on the gate electrode;

side wall spacers formed to a thickness of 150–200 nm on side walls of the gate electrode;

source and drain regions formed to a depth of 120–200 nm in the surface layer on respective sides of the gate electrode, the source and drain regions being of a conductivity type opposite to that of a channel region provided therebetween;

regions having a junction shallower than that of the source and drain regions respectively formed in the surface layer beneath the side walls; and titanium silicide films respectively formed on the source and drain regions.

BRIEF DESCRIPTION OF THE DRAWINGS

FIG. 12(b) is a graph showing results of dependency of variation in sheet resist layerance of titanium silicide films in a wafer surface on the second rapid thermal anneal, wherein the titanium silicide films are formed by the present invention and silicided after implanted with arsenic ions through the conventional silicon oxide film;

FIGS. 13(a) is a SEM photograph of a surface of a sample having a titanium silicide film formed by silicidation reaction after implanted with arsenic ions through the nitride film of the present invention;

FIGS. 13(b) is a SEM photograph of a surface of a sample having a titanium silicide film formed by silicidation reaction after implanted with arsenic ions through the conventional oxide film;

FIGS. 21(a) and 21(b) are essential-part schematic sectional views, wherein FIG. 21(a) is a CMOS semiconductor device according to the present invention and FIG. 21(b) is a conventional semiconductor device;

FIGS. 23(d)–23(g) are schematic sectional views showing fabrication steps for the semiconductor device according to the fifteenth embodiment of the present invention;

DESCRIPTION OF THE PREFERRED EMBODIMENTS

Figure 1:
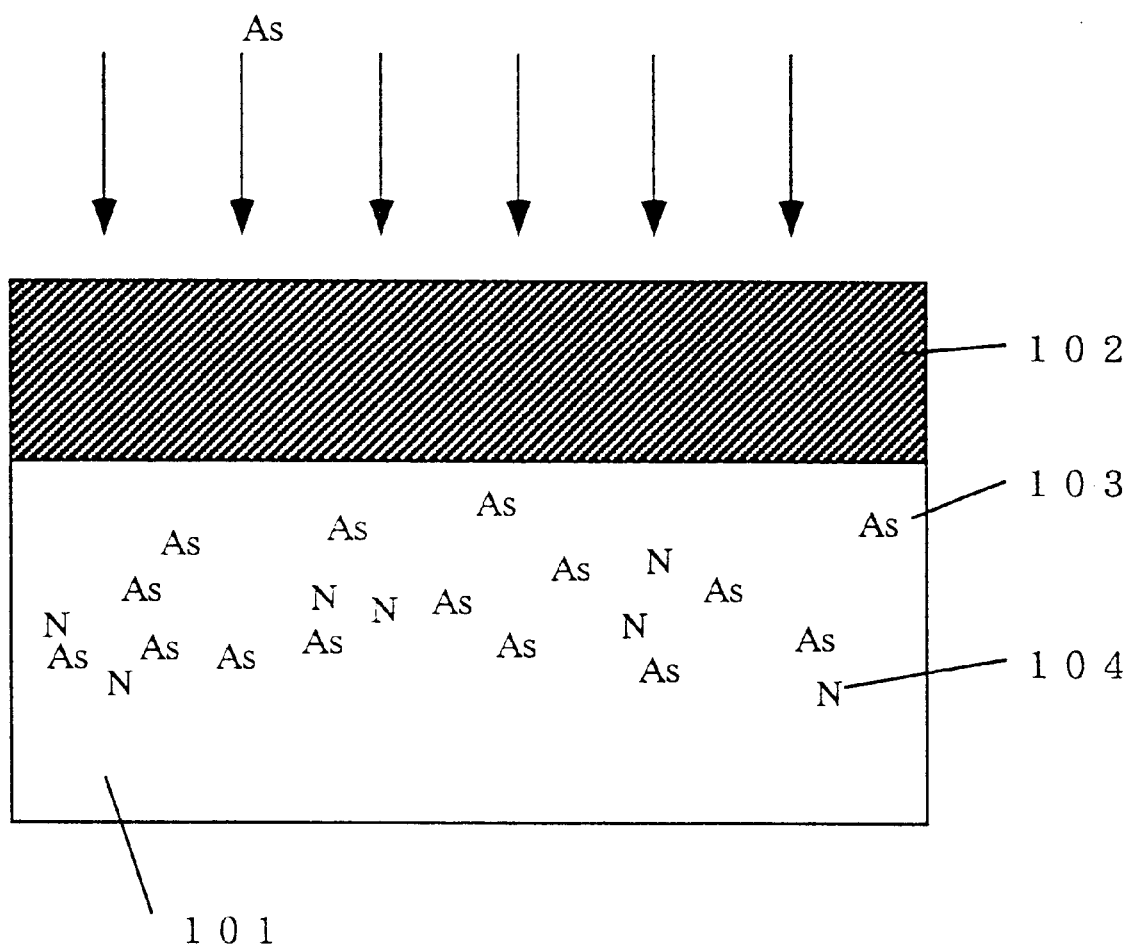
FIG. 1 is a schematic sectional view of a semiconductor device according to a first embodiment of the present invention.

A fabrication method for a semiconductor device according to the first aspect of the present invention is characterized by implanting of impurity ions through a silicon nitride film into desired areas of a silicon semiconductor substrate, as explained hereinbelow.

In the above-mentioned step (a), either a p-type or an n-type of a silicon semiconductor substrate may be applied to the invention. Impurity ions for p-type conductivity as acceptors involve boron, and impurity ions for n-type as donors phosphorus and arsenic.

A silicon nitride film is formed over the silicon semiconductor substrate. The thickness of the silicon nitride film is 5–50 nm, and preferably 10–30 nm. The thickness of thinner than 5 nm is not preferred because it is reduced by 2–3 nm per removal of resist layer applied upon implantation of impurity ions. On the other hand, if the thickness is thicker than 30 nm, there occurs increase in amount of over-etch prior to deposition of titanium, effecting damages to gate, source, and drain regions. In such cases, higher energy is required for implantation of ions, resulting in increased implantation damages. Further, it becomes difficult to form shallow junctions due to increase of dispersion ($\sigma$) in implantation profile.

The silicon nitride film is formed substantially in the absence of oxygen. In particular, the silicon semiconductor substrate is preferably kept beforehand in an inert gas, such as nitrogen gas and argon gas, in an ambient with a pressure higher than the atmospheric pressure or in an $N_2$-purged decompression ambient at a dew point lower than $-100°$ C. to thereby remove moisture from the surface thereof, prior to implementation of the step (a) for formation of a silicon nitride film. The silicon nitride film formed in this manner minimizes oxygen atoms at an interface thereof with the silicon semiconductor substrate. Thus, the content of oxygen atoms are well excluded from entering into the silicon semiconductor substrate during the subsequent step of implanting impurity ions.

An LP-CVD apparatus may be utilized for forming a silicon nitride film as above, which is provided with a preparatory evacuation chamber, a load-lock chamber, and a deposition furnace. To form a silicon nitride film, the silicon semiconductor substrate is placed in the preparatory evacuation chamber, and then oxygen is evacuated from the chamber to fill it with nitrogen. Thereafter, the silicon semiconductor substrate is transported from the preparatory chamber into a load-lock chamber. The load-lock chamber is being filled with nitrogen and kept at a desired dew point under a predetermined pressure. The silicon semiconductor substrate, after being removed of moisture adsorbed on the surface thereof in the preparatory evacuation chamber and the load-lock chamber, is transported into the deposition furnace for formation of a silicon nitride film thereon.

Then, impurity ions are implanted through the silicon nitride film thus formed into the silicon semiconductor substrate. It is preferred that the concentration of oxygen be lower than $1\times10^{18}/cm^3$ in regions to be implanted with impurity ions. If the oxygen concentration is higher than $1\times10^8/cm^3$, a titanium silicide film formed later will contain much oxide such as titanium oxide and silicon oxide, raising sheet resist layerance and worsening heat resist layerance for the titanium silicide film. Techniques for reducing the oxygen concentration less than $1\times10^{18}/cm^3$ involve intrinsic gettering, for instance. This known technique involves formation of a layer which is free of oxygen and defects, i.e., a DZ: a denuded zone, in the surface of the substrate.

The present method does not involve the step of implanting impurity ions through a silicon oxide film so that knock-on, i.e., scattering of oxygen atoms into the silicon semiconductor substrate due to bombardment with impurity ions, is prevented from occurring. Instead, in the step (b) of the present method, nitrogen atoms of the silicon nitride film experience knock-on due to implanting impurity ions and mixed into the silicon semiconductor substrate. The scattered nitrogen atoms possibly serve to occupy crystal defects of the silicon semiconductor substrate caused by implanting impurity ions. It is noted that the conductivity type for impurity ions is not limited, i.e., either of p-type or n-type may be used. P-type impurity ions involve boron and indium, while n-type ions include phosphorus, arsenic, and so on. Conditions for implantation differ by species of impurity, silicon nitride film thickness, etc.

A semiconductor device is fabricated through the steps as above. The fabrication method according to the first aspect may be applied for source and drain regions, LDD regions in the neighborhood of a channel region, or extended junctions toward a channel region for a transistor, or opposite electrodes for capacitance built in a substrate for semiconductor devices.

The fabrication method of a semiconductor device according to the second aspect of the invention will then be explained.

The steps of (a)' and (b)' for the present method are conducted similarly to the above stated method. Further, the silicon semiconductor substrate, the silicon nitride film, and impurity ions for the present method are similar to those of the above method. The concentration of oxygen less than $1\times10^{18}/cm^3$ for regions implanted with impurity ions is preferred by the reason stated in the above.

In the subsequent steps (c)', the silicon nitride film is removed. The removal of the silicon nitride film is preferably performed substantially in the absence of oxygen, in order to prevent formation of a native oxide film over the surface of the silicon semiconductor substrate. The removal of the silicon nitride film may be carried out by sputtering. It is further preferred that the substrate be heat treated, prior to removal of the silicon nitride film, at a temperature of 850–950° C. to activate implanted impurity ions for forming impurity diffusion layers.

In the step (d)', a titanium film is formed over the silicon semiconductor substrate. The thickness of the titanium film may properly be adjusted depending on the purpose of a device fabricated, but generally determined to be 10–100 nm.

The methods of forming a titanium film involve sputtering. The titanium film may contain nitrogen. The nitrogen-contained titanium film is to be formed by a reactive sputter technique with using titanium as a target in a nitrogen gas ambient. It is preferred to form a titanium film substantially in the absence of oxygen in order to prevent occurrence of a native oxide film.

To form a titanium film without occurrence of a native oxide film, a silicon semiconductor substrate, after being pre-treated for sputter such as by argon sputter, is transported into a titanium sputtering chamber under a vacuum pressure of $1\times10^{-8}$–$3\times10^{-8}$ torr in a manner of not being exposed to the air. After formation of the titanium film, silicon ions are preferably implanted at a dose of approximately $1\times10^{15}$–$1\times10^{16}/cm^2$ to cause mixing of titanium with silicon for formation of a titanium silicide film with a reduced electric resist layerance. It is preferred that silicon ions be implanted into the silicon semiconductor substrate such that the concentration of silicon ions attains its peak (Rp) at an interface of the titanium film and the silicon semiconductor substrate. Further, it is preferred that a vacuum transportation system with a pressure of $1\times10^{-8}$–$3\times10^{-8}$ torr is applied for transportation from the step of (c)' to the step (d)'. This is because no native oxide film is allowed to grow at the interface of a silicon semiconductor substrate and a titanium film.

In the step (e)', heat treatment is made on the silicon semiconductor substrate having the titanium film to transform the titanium film into a titanium silicide film containing nitrogen atoms. The heat treatment is preferably performed rapidly at two stages, i.e., a C49-crystalline type titanium silicide film is formed at a first stage so that a second eat treatment provides a stable C54-crystalline type titanium silicide film.

The first heat treatment is performed at a temperature of 550–750° C. for 5–60 seconds, and preferably 650–700° C. for 10–30 seconds. If the temperature is lower than 650° C. or the time period is shorter than 10 seconds, the titanium silicide film will be insufficient in growth. On the other hand, if the temperature is higher than 700° C. or the time period is longer than 60 seconds, there arises tendency of short-circuiting between the gate, the source, and the drain due to growth of the silicide film sideways. Further, the silicide film is undesirable apt to react with an isolation oxide layer or a spacer oxide film.

The second heat treatment is performed at a temperature of higher than 800° C. for 10–60 seconds, and preferably 900–1000° C. for 10–20 seconds. If the temperature is lower than 900° C. or the time period is shorter than 10 seconds, the stable C54-crystal will be insufficient in formation. On the other hand, if the time period is longer than 30 seconds, there arises undesirable tendency of occurring aggregation. It is preferred that the first and second heat treatments are in an ambient containing nitrogen or ammonia to preclude affects. There may include a step of removing an unreacted titanium nitride film together with a titanium nitride film formed in the nitrogen/ammonia ambient by the first heat treatment after the first heat treatment. The method of removal is not limited, involving utilization of an etchant which selectively dissolves the titanium nitride film against titanium silicide film. A solution mixture of sulfuric acid and hydrogen peroxide is applicable as an etchant for selective dissolution.

The fabrication method of a semiconductor device according to the third aspect of the invention will then be explained. In the first step (a)", a silicon nitride film is formed over a silicon semiconductor substrate, which substrate has well regions of a first conductivity type and a second conductivity type formed in a surface layer thereof, and a surface layer having gate dielectric films, gate electrodes, and isolation layer formed thereon. It is possible in the present method to employ the same silicon semiconductor substrate, gate electrode, and silicon nitride film as those of the method according to the first and second aspect. The gate dielectric film may involve a silicon oxide film, an oxide nitride film containing low concentration of nitrogen using $N_2O$, and so on. The gate electrode is not limited, involving a polysilicon film, etc. On the other hand, the isolation region is not limited, involving a LOCOS layer. When one of the first- and second-conductivity type wells is of an n-type (donor), the other is of a p-type (acceptor). The impurity concentration for the well is usually determined approximately $1\times10^{17}$–$5\times10^{17}$/cm$^2$, though it differs depending on the application of a device to be fabricated.

In the subsequent step (1) of (b)", the first-conductivity well region is masked with a photo-resist layer and then impurity ions of the first conductivity type are implanted to cause introducing of nitrogen atoms and silicon atoms from the silicon nitride film into the second-conductivity well region of the surface layer together with introduction thereinto of impurity ions. The implanted impurity ions are to be subjected to heat treatment performed later for formation of diffusion regions of the first-conductivity type having a shallow junction on the opposite sides of the gate electrode in the surface layer of the silicon semiconductor substrate. The depth of the diffusion regions is approximately 20–70 nm. The implantation is under conditions of a dose of $1\times10^{14}$–$5\times10^{14}$/cm$^2$ with an implant energy of 20–60 keV, and preferably a dose of $1\times10^{14}$–$3\times10^{14}$/cm$^2$, though the conditions may be appropriately controlled depending on the type of impurity ions, the thickness of the silicon nitride film and so on.

In the step of (2) of (b)", the mask is removed from the first-conductivity well region and the second-conductivity well region is newly masked with a photo-resist layer to implant impurity ions of the second conductivity type so as to cause introducing of nitrogen atoms and silicon atoms from the silicon nitride film into the surface layer of the second-conductivity well region together with introduction thereinto of impurity ions. The implanted impurity ions are to be subjected to heat treatment performed later for formation of diffusion regions of the second-conductivity type having a shallow junction on the opposite sides of the gate electrode in the surface layer of the silicon semiconductor substrate. The depth of the diffusion regions is approximately 20–70 nm. The implantation is under conditions similar to the above step (1) of (b)".

In the step (3) of (b)", the mask is removed from the second-conductivity well region and side wall spacers are formed on side walls of respective one of the gate electrodes through the silicon nitride film. The side wall spacers are, for instance, of a silicon oxide film. The method of forming the side wall spacers is not limited. That is, the side wall spacers may be formed by a known method, e.g., a silicon oxide film is formed by the CVD method to a thickness of 100–300 nm and thereafter the silicon oxide film is etched back until the silicon nitride film is exposed over the well. It is preferred for the etch-back to employ an etchant, such as a $C_4F_8$+CO-based one, having a selective ratio of approximately 50–100 against the silicon nitride film. However, when using an etchant which has no selective ratio for the silicon oxide film and the silicon nitride film, etch-back may be continued till the active region (well) is exposed. In such a case, it is necessary to form again a silicon nitride film.

The side wall spacer has a thickness with respect to a direction parallel to the surface of the silicon semiconductor substrate which is 0.7 times, preferably 0.7–1.2 times, the depth of source and drain regions to be formed later, and/or thicker than the gate electrode. More preferably, the thickness is approximately $\frac{4}{3}$ of that of the gate electrode, and specifically, it is greater than 170–200 nm for a 150-nm gate electrode. The utilization of such side wall spacer prevents spreading of source and drain regions toward the depth thereof in the vicinity of a channel region, with a short-channel effect suppressed. Further, doping to a gate electrode simultaneous with source and drain regions contributes to prevent against depletion within the gate electrode.

Thereafter, the first-conductivity type well region is masked with photo-resist layer to implant impurity ions of the first conductivity type so as to cause introducing of nitrogen atoms and silicon atoms from the silicon nitride film into the surface layer of the second-conductivity well region together with introduction thereinto of impurity ions.

The implanted impurity ions are to be subjected to heat treatment performed later for formation of diffusion regions of the first-conductivity type on the opposite sides of the gate electrode in the surface layer of the silicon semiconductor substrate. It is noted that if the implant energy is too high there occurs undesirable spreading of the implanted ions sideways to make impossible suppression against a short-channel effect, though it depends on the existence of the side wall spacers. If the implant energy is too low, implant ions cannot reach the lower portion of the gate electrode, causing depletion therewithin. Further, a junction to be formed is too shallow, unfavorably increasing junction leakage currents. It is possible to use known photo-resist layer without especial limitations.

In the step (4) of (b)", the mask is removed from the first-conductivity well region and the second-conductivity well region is masked with new photo-resist layer to implant impurity ions of the second conductivity type so as to cause introducing of nitrogen atoms and silicon atoms from the silicon nitride film into the surface layer of the second-conductivity well region together with introduction thereinto of impurity ions, and then removing the photo-resist layer from the second-conductivity well region. The implanted impurity ions are to be subjected later to heat treatment for formation of diffusion regions of the second-conductivity type on the opposite sides of the gate electrode in the surface layer of the silicon semiconductor substrate. The mask is removed from the surface of the second-conductivity type well. The removal of the mask may be performed by a known organic solvent or ashing using oxygen plasma, though it differs by the type of a mask.

Subsequently, in the step (c)", the silicon nitride film is removed away. The removal of the silicon nitride film may be performed similarly to the step (c)' of the above-stated method according to the second aspect.

In the step (d)", a titanium film is formed over the silicon semiconductor substrate. The formation of the titanium film may be carried out in a manner similar to the step (d)' of the above second aspect method. Subsequent to the step (d)", silicon ions may be implanted into the surface layer of the silicon semiconductor substrate. The implantation of silicon ions causes introducing of silicon atoms with titanium atoms before practicing silicidation in the subsequent step (e)", realizing uniform reaction at an initial stage of silicidation in the step (e)". The uniform reaction at the initial stage of silicidation serves to lower electric resist layerance even where the present invention is applied to interconnections with fine linewidth. Such reaction also contributes to suppress variations in electric resist layerance, i.e., variations in thickness between titanium silicide films. As a result, the titanium silicide film will show improved thermal resist layerance. The implantation of silicon ions is preferably performed such that the concentration of silicon ions attains its peak at an interface of the titanium film and the silicon semiconductor substrate. The implantation may be under condition a dose of $1\times10^{15}$–$1\times10^{16}$/cm$^2$ with an implant energy of 20–60 keV.

In the step (e)", the first heat treatment causes the titanium film to transform into the titanium silicide film containing nitrogen by reacting the titanium film with silicon atoms present in the well surface layer having mixed nitrogen atoms. The conditions of the first heat treatment may be similar to those of the first heat treatment of the step (e)' according to the second aspect.

In the step (f)", the titanium film and the titanium nitride film over the isolation layer are removed. The method of the removal is not limited, involving a method of employing an etchant for selectively dissolving titanium nitride film against the titanium silicide film, e.g., a solution mixture of sulfuric acid and hydrogen peroxide.

Thereafter, in the step (g)", the titanium silicide film is transformed by the second heat treatment into the C54-crystalline TiSi$_2$ which is stoichiometrically stable. The semiconductor device is fabricated through the well-known steps. The conditions for the second heat treatment may be similar to those of the second heat treatment of the step (e)' according to the second aspect.

The impurity-ion implant in the step (b)"-(4) may be performed after the step (e)" in the present method. A heat treatment is required for restoring crystal defects suffered by the implant of impurity ions in the steps (3) and (4) of (b)". This heat treatment provides impurity diffusion layers, having restored crystal defects in the well surface layer, i.e., source and drain regions as well as impurity diffusion layers with a shallow junction. The heat treatment may be performed after the steps (3) and (4) of (b)", or otherwise after the step (3) of (b)" and simultaneous with the second treatment in the step (g)". The conditions for the heat treatment performed after the step (3) of (b)" is 850–950° C. for 10–30 minutes, e.g., for activating Arsenic. On the other hand, the conditions for the heat treatment after the step (4) of (b)" is 800–850° C. for 10–30 minutes plus 950–1050° C. for 10 seconds, e.g., for activating boron.

Where impurity ions are implanted after formation of the titanium silicide film, heat treatment is limited to the second heat treatment in the annealing step (g)" for activating impurity ions implanted by the step (4) of (b)", offering trade-off for the suppression against the short-channel effect after deposition of inter-layer insulation film after the step (g)". Consequently, it is preferred to carry out a heat treatment at a temperature of 800–850° C. in order to reduce junction leakage current through the source and drain regions on the p-channel side, for instance. This heat treatment reduces the junction leakage current to 1 nA/cm$^2$ (0.9–0.6 nA/cm$^2$) or less, as compared with the value of several nA/cm$^2$ for the case of no heat treatment.

Then, the semiconductor device fabricated by the method according to the third aspect of the present invention will then be explained.

The semiconductor device is of a CMOS type, which has a reduced junction leakage current of 0.9–0.6 nA/cm$^2$, or less than 1 nA/cm$^2$, through a source/drain region on the both n-well and p-well sides. The semiconductor device has a junction depth of p-conductivity type source and drain regions which is equivalent to or shallower than the junction depth of n-conductivity type source and drain regions, providing a CMOS transistor structure with improved characteristics against the short-channel effect. When a first conductivity is an n-type and a second conductivity is p-type, the thickness of a titanium silicide film present on the p-well is substantially equal to the thickness of a titanium silicide on the n-well, thereby making equal the sheet resist layerance for the respective titanium silicide films on the p-channel and n-channel sides.

The semiconductor device has side wall spacers, which has a thickness, with respect to a direction parallel with the surface of the silicon semiconductor substrate, of greater than 0.7 times the depth of the source and drain regions, with a thickness thicker than a gate electrode. Consequently, the source and drain regions are prevented from spreading toward the depth thereof, suppressing the short-channel effect.

Further, the semiconductor device has impurity diffusion layers which are formed by performing a heat treatment before removal of a titanium nitride film and activating impurity ions before formation of a titanium silicide film. The steps of the titanium nitride film removal and the titanium film formation are characterized by removing the titanium nitride film by a cluster-type apparatus and then a titanium film is formed in the absence of exposure to the air.

Then, the method of fabricating a semiconductor device according to the fourth aspect of the present invention will be explained hereinbelow.

First in the step (a)''', a first silicon nitride film is formed over a silicon semiconductor substrate. This fabrication method may employ a semiconductor substrate, a gate dielectric film, a gate electrode, and a first silicon nitride film which are respectively similar to those of the above methods of the first to third aspects. The gate electrode is preferably formed of polysilicon having a thickness of 100–200 nm. The thickness of within such range is capable of suppressing depletion for the gate electrode, even if the energy to be performed for forming source and drain regions is relatively low.

In the step (1) of (b)''', impurity ions of a conductivity type opposite to that of a channel region present beneath the gate electrode are implanted into desired areas of the silicon semiconductor substrate so as to introduce nitride atoms from the first silicon nitride film with silicon atoms in a surface layer of the silicon semiconductor substrate together with introducing of impurity ions thereinto. This impurity-ion implant serves to form LDD regions in the surface layer of the silicon semiconductor substrate. The LDD region has a junction depth of 50–70 nm. It is preferred to employ $^{75}As^+$ as an impurity. The impurity-ion implant is preferably under conditions of a dose of $5 \times 10^{13}$–$5 \times 10^4/cm^2$ with an implant energy of 20–30 keV. It is especially preferred to control the implant conditions such that the impurity concentration falls onto a range of $5 \times 10^{18}$–$5 \times 10^{19}/cm^3$ in view of suppression against increase of parasitic resist layerance due to spreading sideways of the LDD region.

In the step (2) of (b)''', the first silicon nitride film is removed away and an insulation film is deposited to a thickness of 200–300 nm entirely over the silicon semiconductor substrate. The insulation film is then subjected to isotropic etching to form side wall spacers left on side walls of the gate electrode. Impurity ions of the conductivity type opposite to that of the channel region are implanted so as to cause introducing of nitrogen atoms and silicon atoms from the silicon nitride film into the gate electrode as well as source and drain regions to be formed in the silicon semiconductor substrate. The removal of the silicon nitride film may be performed similarly to the step (c)' of the second aspect. The deposition of the insulation film, e.g., of a silicon oxide film, with the above thickness provides side wall spacers with a sufficient thickness of 150–200 nm. Therefore, spreading sideways of LDD regions is secured with a shallow junction depth. The impurity-ion implant is preferably under conditions of a dose of $1 \times 10^{15}$–$5 \times 10^{15}/cm^2$ with an implant energy of 40–60 keV. This implant conditions provides source and drain regions with a junction depth of 120–200 nm.

In the step (c)''', the silicon nitride film is removed to perform a heat treatment for restoration of crystal defects. The removal of the silicon nitride film may be performed similar to the step (c)' of the second aspect. The heat treatment is preferably performed for a relatively long period of time and/or at a high temperature in order to increase the distance of the source and drain junctions from a silicide layer to be formed later and hence decrease junction leakage currents. More specifically, it is preferred to carry out the heat treatment under conditions of 900–950° C. for 5–30 minutes, especially 10–20 minutes.

In the step (d)''' a titanium film is formed over the silicon semiconductor substrate. The formation of the titanium film may be similar to the step (d)' of the second aspect.

In the step (e)''', the silicon semiconductor substrate having the titanium film is subjected to further heat treatment so as to transform by self-aligning the titanium film into a titanium silicide film containing nitrogen atoms. This heat treatment causes reaction of the titanium films with silicon atoms present in the nitrogen-atom mixed surface layer of the silicon semiconductor substrate, thereby transforming the titanium film into the titanium silicide film having nitrogen. The heat treatment may be implemented by employing a known condition, but may be performed at two stages similarly to the steps (e)'' and (g)'' of the third aspect. It is preferred to remove unchanged portions of the titanium film to a titanium silicide film by selective etching with using, e.g., a solution mixture of sulfuric acid an hydrogen peroxide. After the above steps, a semiconductor device is completed through well-known steps.

In accordance with the preset invention, a semiconductor device is also provided which is fabricated by the method of the fourth aspect. The semiconductor device includes an insulated-gate field effect transistor which eliminates a trade-off between gate-electrode depletion, junction current leakage, and a short-channel effect.

The operation of the present invention will then be explained hereinbelow.

It has conventionally been considered that an oxide film 606 be essential as a mask for preventing contamination in an ion-implant step for fabrication of a CMOS semiconductor device, as shown in FIGS. 26(a)–26(e). In fabrication step for a COS device, a poto-reset mask is necessary for introducing donors and acceptors into selective portions of a semiconductor substrate. However, a high concentration of heavy metals are contained in photo-resist layer, and there is necessity of not directly applying photo-resist layer onto a semiconductor substrate. Consequently, photo-resist layer is applied onto a semiconductor substrate through a oxide film 606.

However, implanting of impurity ions through an oxide film causes oxygen atoms present in an oxide film to be knocked on by the implanted impurity ions. To this end, the oxygen atoms experienced knock-on are introduced into a semiconductor substrate. This becomes drastically particularly when an impurity to be implanted involves atoms having a large molecular weight.

In the conventional method, oxygen atoms unavoidably act to intervene in reactions of titanium and silicon during silicidation, from the above reasons. However, no emphasis has conventionally been placed on the intervention of oxygen atoms, which are introduced into a titanium silicide reaction system during implant of impurity ions.

It has been conventionally considered that the silicidation for an n-type semiconductor, (silicon implanted with boron ions) is difficult as compared with the silicidation for a p-type semiconductor (silicon implanted with arsenic) (D. Moy, S. Basavaian, H. Protschka, L. K. Wang, F, d' Heurle, J, Wetzel, S. Brodsky and R. Volant* Proc. 1st Int. Symp. ULSI Science and Technology, Philadelphia, 1987, see p. 381 (Electrochemical society, Pennington, 1987)). Specifically, in the silicidation for a n-type semiconductor, silicidation reactions are prevented to increase the sheet resist layerance of a titanium silicide film and worsen the heat resist layerance, i.e., aggregation occurs in titanium silicide films during a high-temperature heat treatment, as compared with the silicidation for a p-type semiconductor. There has been a theory that the cause for the phenomenon would be based on difference by species of an impurity implanted, giving no solution for the cause.

The present inventors has studied on the cause of the difficulty of silicidation for an n-type semiconductor (silicon implanted with arsenic ions) as compared with that of a p-type semiconductor (silicon implanted with boron ions), and found that oxygen atoms, instead of impurity ions per se, are attributable which are introduced into a silicon semiconductor substrate during implant of impurity ions. That is, there is increase in the number of oxygen atoms experiencing knock-on with increase in mass number of impurity-ion atoms implanted through a silicon oxide film. This means that the silicidation reaction takes place in a ternary system involving Ti, Si, and O, with a result that the silicidation reaction is prevented by oxygen atoms. Table 1 shows enthalpy created for TiN, $TiO_2$, $SiO_2$, and $TiSi_2$.

TABLE 1

| | CREATED ENTHALPY (kJ/mol) |
|---|---|
| $TiO_2$ | −992 |
| $SiO_2$ | −909 |
| TiN | −339 |
| $TiSi_2$ | −134 |

It will be understood from Table 1 that oxides with low enthalpy, i.e., $TiO_2$ and $SiO_2$, are most preferentially formed in reaction of an quaternary system. Therefore, the conventional technique thus creates a titanium silicide film containing oxides. It has been known that a titanium silicide film containing oxides has high sheet resist layerance and worse heat resist layerance. In particular, where the conventional technique is applied for silicidation with a linewidth finer than the grain size of $TiSi_2$, e.g., silicidation for gate electrodes, the resulting titanium silicide film will contain oxides as above and hence drastically increase in sheet resist layerance.

In the meanwhile, the melting point (Tm) for $TiSi_2$ is 1540° C. It is known that recrystallization in a metal becomes remarkable at a temperature of 0.6 times the melting point (Tm) represented by absolute temperature. Consequently, $TiSi_2$ has a value 0.6 m corresponding to 815° C. To this end, when a $TiSi_2$ film containing $SiO_2$ in grain boundaries is subjected to a heat treatment at a temperature higher than 800° C. required for reflow of an inter-layer insulation film, there begins aggregation of $TiSi_2$ films based on surface free energy from $SiO_2$ present in grain boundaries. The titanium silicide films thus aggregated are, in electrical, partially fragmentary which no longer serve as a silicide-backed interconnection with low resist layerance. In particular, when silicidation of $TiSi_2$ is performed in a linewidth finer than the grain size thereof, e.g., silicidation for gate electrodes, the sheet resist layerance of a titanium silicide film increases to a level substantially equivalent to that of an interconnection without being backed by a titanium silicide film. Further, titanium atoms are diffused into a silicon semiconductor substrate during aggregation so that junction leakage currents increase through source and drain regions due to junction reakage.

On the contrary, the fabrication method according to the first aspect of the present invention is characterized by comprising the steps of: (a) forming a silicon nitride film over a silicon semiconductor substrate; and (b) implanting impurity ions into desired areas of the silicon semiconductor substrate, whereby nitrogen atoms from the silicon nitride film are mixed with silicon atoms together with introduction of impurity ions into the surface of the silicon semiconductor substrate.

Therefore, nitrogen atoms (N), instead of oxygen atoms (O), is incorporated into the silicon semiconductor substrate, as compared with conventional implant of impurity ions through an oxide film. Thus, the fabrication method according to the first aspect of the invention suppresses introduction of oxygen atoms to a minimum, decreasing deep-level traps caused by oxygen. Further, crystal defects caused by impurity-ion implant are filled by nitrogen atoms so that heavy metal as a contaminant is prevented from diffusing into the silicon semiconductor substrate and being trapped to act as current-leakage centers, reducing junction leakage currents.

The fabrication method according to a second aspect of the invention is characterized by comprising the steps of: (a)' forming a silicon nitride film over a silicon semiconductor substrate; (b)' implanting impurity ions into desired areas of the silicon semiconductor substrate, whereby nitrogen atoms and silicon atoms from the silicon nitride film are incorporated into the surface of the silicon semiconductor substrate together with introduction of impurity ions; (c)' removing the silicon nitride film; (d)' forming a titanium film over the silicon semiconductor substrate; and (e)' subjecting the silicon semiconductor substrate having the titanium film to a heat treatment so as to transform the titanium film into a titanium silicide film containing nitrogen atoms.

Therefore, the implantation of impurity ions through the silicon nitride film causes nitrogen atoms, instead of oxygen atoms, to be introduced into the gate polysilicon film as well as the silicon semiconductor substrate, as compared with conventional impurity-ion implantation through a silicon oxide layer. Thus, nitrogen atoms are introduced into the silicide film with introduction of oxygen atoms suppressed. As a result, a titanium nitride film is easily formed in grain boundaries present in a titanium silicide film formed, even if a slight amount of oxygen exists. It is practically difficult to completely remove oxygen.

Where TiN, instead of $SiO_2$, is present in grain boundaries of a titanium silicide film, TiN and $TiSi_2$ are low in surface free energy in a grain boundary as compared with $SiO_2$ and $TiSi_2$. In such a case, there is suppression against migration upon being heated, to reduce aggregation, thus providing a heat-resist layerive titanium silicide film.

The fabrication method of the invention does not have disadvantage that an n-type semiconductor, as compared with a p-type, is prevented from siliciding to increase the sheet resist layerance thereof, worsening the heat resist layerance. It is therefore possible to form a uniform thickness of a silicide film for a semiconductor both of the p-type and the n-type.

It is also possible to reduce junction leakage current due to crystal defects, because nitrogen atoms act to fill crystal defects caused by implantation of impurity ions. In the conventional method, titanium atoms are diffused upon performing silicidation, which atoms are trapped by crystal defects to acts as current leakage centers. In the present invention, titanium atoms are not trapped by crystal defects, because nitrogen atoms previously fill the crystal defects. Therefore, junction leakage currents are effectively reduced through junctions after silicidation.

The oxygen concentration is easily controlled by an intrinsic gettering treatment to $1\times10^{18}/cm^3$ or lower. Further, a heat treatment is done before removing the silicon nitride film, and activation is made on impurity ions introduced into the surface layer of the silicon semiconductor substrate before forming a titanium silicide film, thereby forming impurity diffusion layers. This makes possible sufficient activation as well as restoration from crystal defects caused by ion implant, without consideration to heat resist layerance of a titanium silicide film. In particular, nitrogen atoms fill crystal defects so that titanium atoms are free of being trapped by crystal defects, reducing junction leakage currents.

The steps (c)' and (d)' are carried out substantially in the absence of oxygen, so that a titanium film can be formed over the silicon semiconductor substrate and the gate electrode (polysilicon film) without substantial formation of a native oxide film on the silicon semiconductor substrate and the gate electrode. It is therefore possible to eliminate the effect of oxygen from silicidation of a titanium-silicon system.

The silicon semiconductor substrate, before subjected to the step (a)', is kept beforehand in an inert gas ambient with a dew point of below −100° C. and a pressure higher than the atmospheric pressure, thereby removing moisture on the surface thereof. As a result, oxygen atoms are minimally excluded from the interface of the silicon nitride film formed and the silicon semiconductor substrate or the gate electrode (polysilicon film). It is therefore possible to reduce oxygen atoms to a minimum which atoms experiences knock-on upon implanting of impurity ions through the silicon nitride film.

The fabrication method according to the third aspect of the invention is characterized by comprising the steps of: (a)" forming a silicon nitride film over a silicon semiconductor substrate, the silicon semiconductor substrate having well regions of a first conductivity type and a second conductivity type formed in a surface layer thereof, and a surface layer thereof having gate dielectric films, gate electrodes, and isolation layer formed thereon; (b)" implanting impurity ions into desired areas of the silicon semiconductor substrate through the silicon nitride film, wherein (1) masking the first-conductivity well region with a photo-resist layer and implanting impurity ions of the first conductivity type to cause introducing of nitrogen atoms and silicon atoms from the silicon nitride film into the second-conductivity well region of the surface layer together with introduction thereinto of impurity ions; (2) removing the photo-resist layer from the first-conductivity well region and masking the second-conductivity well region with a photo-resist layer to implant impurity ions of the second conductivity type so as to cause introducing of nitrogen atoms and silicon atoms from the silicon nitride film into the surface layer of the second-conductivity well region together with introduction thereinto of impurity ions; (3) removing the photo-resist layer from the second-conductivity well region and forming side wall spacers on side walls of respective one of the gate electrodes through the silicon nitride film, and thereafter masking the first-conductivity type well region with photo-resist layer to implant impurity ions of the second conductivity type so as to cause introducing of nitrogen atoms and silicon atoms from the silicon nitride film into the surface layer of the second-conductivity well region together with introduction thereinto of impurity ions; (4) removing the photo-resist layer from the first-conductivity well region and masking the second-conductivity well region with photo-resist layer to implant impurity ions of the second conductivity type so as to cause introducing of nitrogen atoms and silicon atoms from the silicon nitride film into the surface layer of the second-conductivity well region together with introduction thereinto of impurity ions, and then removing the photo-resist layer from the second-conductivity well region; (c)" removing the mask from the surface of the second-conductivity well, and carrying out activating anneal in a nitrogen ambient at 800–850° C. and rapid thermal anneal at 1000° C. for approximately 10 seconds thereby removing the silicon nitride film; (d)" forming a titanium film over the silicon semiconductor substrate; (e)" subjecting the silicon semiconductor substrate having the titanium film to a first heat treatment so as to transform the titanium film into a titanium silicide film containing nitrogen atoms; (f) removing unreacted part of the titanium film to leave the titanium silicide film formed by the first heat treatment; and (g) subjecting the silicon semiconductor substrate having the titanium silicide film so as to transform the silicon nitride film into a $TiSi_2$ C54-crystal structure which is stoichiometrically stable. In this case, implanting of silicon ions may be done for mixing silicon atoms with titanium atoms prior to the step (e)".

It is therefore possible to set conditions of annealing separately for activation of the n-channel side and the p-channel side, providing a CMOS semiconductor device having a saliside n-channel with reduced junction leakage currents and salicide p-channel with reduced short-channel effects.

There is a necessity of lowering the threshold voltage for a channel in order to provide a semiconductor device with a low consumption power. Attentions are drawn to a semiconductor device having a surface-channel type of both the n-channel side and the p-channel side (same conductivity type for source and drain regions and a gate electrode), for reducing the threshold voltage.

To fabricate such semiconductor device, introducing of impurity ions simultaneously for source and drain regions and a gate electrode is effective in view of simplification of steps. In the method, however, arsenic ions generally employed as impurity ions for n-channels have greater mass number with a smaller diffusion coefficient as compared with boron ions usually used as impurity ions for p-channels. Consequently, if arsenic is implanted into the gate electrode simultaneously with implanting of arsenic into the source and drain regions, when activating annealing (heat treatment not to cause a short-channel effect) is performed under conditions matched for the p-channel side, there occurs depletion in the gate electrode on the n-channel side (when implant energy is low) or introduction of arsenic ions into the channel region by passing through the gate oxide film (when implant energy is high). Thus, control is difficult. On the contrary, if activating annealing is carried out matching for the n-channel side to an sufficient extent that crystal defects are fully restored to suppress junction current leakage or impurity ions are sufficiently diffused to suppress depletion for the gate electrode, there occurs a short-channel effect on the p-channel side, resulting in difficulty of fine steping.

To cope with this, a counter-dope technique is generally employed, wherein polysilicon for a gate electrode is deposited, phosphorus ions are implanted into the entire surface of the polysilicon so as to suppress depletion in a gate electrode on the n-channel side, implant boron ions as n-type impurity ions into p-channel side.

On the contrary, it is possible in the fabrication method of the invention to separately set conditions of activating annealing for the n-channel side and the p-channel side. Therefore, impurity ions can be simultaneously implanted into the source and drain regions and the gate electrode to meet conditions of impurity-ion diffusion for the n-channel and the p-channel of a surface-channel transistors.

The implant of impurity ions in the step (4) of (b)" may be carried out after the step (e)". The conventionally known titanium-silicided p-channel MOSFET has a disadvantage in characteristics, such as transconductance and drain current, which are not improved and rather worsened as compared with a p-channel transistor without being salicided. This disadvantage is thought due to the factors given below. That is, boron introduced by ion-implant as acceptors act to react with titanium atoms to form $TiB_2$ during titanium-silicidation so that there is decrease in concentration of acceptors as p-type carriers. To this end, low-resist layerance ohmic contact is not provided between $TiSi_2$ and a silicon substrate. As one of factors, it is thought that there is increase in transistor parasitic series resist layerance drastically increases in spite of decrease in resist layerance of the source and drain regions by silicide films. This disadvantage is solved by performing impurity implant for the p-channel side after silicidation, i.e., after completion of titanium-silicidation. With such method, it is possible to suppress minimally reaction of titanium and impurity ions such as boron, so that acceptors are suppressed from decrease in concentration and transistor parasitic series resist layerance is reduced, thereby improving the characteristics for transistors.

Further, the step of implanting silicon ions is included between the step of forming titanium film with or without nitrogen atoms and the step of the first heat treatment performed in a nitrogen or ammonia ambient. Consequently, titanium and silicon atoms can be mixed prior to the silicidation step, providing uniform reaction at an initial stage of silicidation. In particular, reduction in electric resist layerance is provided for fine-linewidth interconnections with variations in resist layerance (variations in film thickness of suicides) suppressed. Further, heat resist layerance is improved for fine linewidth interconnections.

The second heat treatment is carried out at a temperature of higher than 900° C. In the conventional fabrication method, transformation of crystal of from C49 to C54 is inapt to occur during titanium-silicidation for interconnections with a linewidth of 1 $\mu$m or finer, making difficult reduction of electrical resist layerance. In contrast, it is possible in the present invention to transform C49 into 54 crystal even for fine interconnections by carrying out the second heat treatment at a temperature of higher than 900° C., thus realizing reduction of electric resist layerance. In the conventional silicidation technique, there occurs aggregation in a heat treatment at a temperature of exceeding 800° C. due to poor heat resist layerance, and it is impossible to transform from C49 crystal with high resist layerance into C54 crystal with low resist layerance for fine linewidth interconnections. In the present invention, however, reduction of resist layerance is realized by performing the second heat treatment at a high temperature on the titanium silicide film with improved heat resist layerance.

The semiconductor device according to the present invention comprises: wells of first and second conductivity types formed in a surface layer of a silicon semiconductor substrate; isolation layers formed on the silicon semiconductor substrate; gate dielectric films and gate electrodes formed on respective the first and second conductivity type wells; titanium silicide films respectively formed on the gate electrodes; side wall spacers formed on side walls of each of the gate electrodes; source and drain regions formed in the surface layer on respective sides of each of the gate electrodes; regions having a junction shallower than those of the source and drain regions respectively formed in the surface layer beneath the side walls; and titanium silicide film respectively formed on the source and drain regions. This device is fabricated by the third aspect of the present invention.

Figure 21:
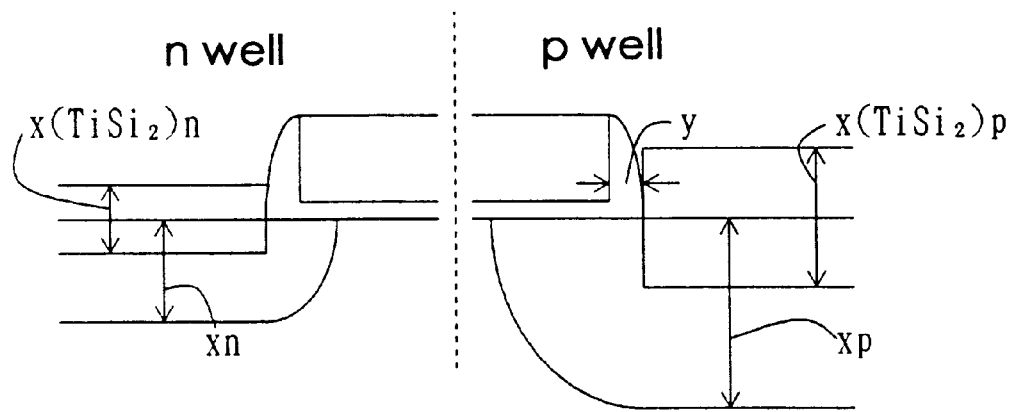
Figure 21:
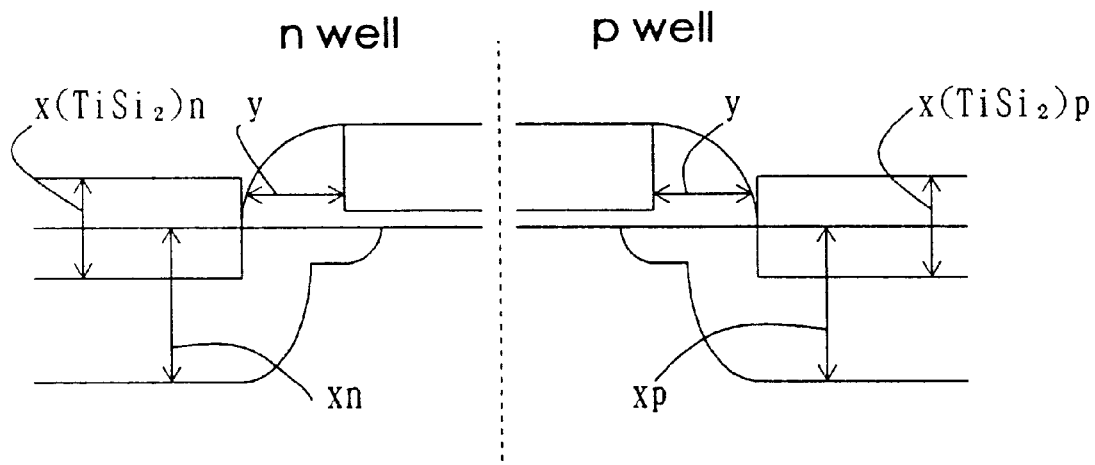

There is illustrated in FIG. 21(b) an enlarged schematic view of a semiconductor device according to the present invention, showing a essential part thereof. FIG. 21(a) shows a conventional semiconductor device. In FIGS. 21(a) and 21(b), an n-well and a p-well are each depicted in half thereof for simplifying explanation. In the figures, xp and xn are represent the respective source/drain junction depths of a p-type and an n-type, y is a thickness of side wall spacers with respect to a direction parallel with the silicon semiconductor substrate, $x(TiSi_2)n$ and $x(TiSi_2)p$ are thickness of titanium silicide films of the p-type and the n-type.

As shown in FIG. 21(b), A CMOS transistor structure which is highly resist layerive to the short-channel effect is provided where it is met that the source/drain junction depth (xp) for the p-conductivity type is substantially equivalent to or shallower than the source/drain junction depth (xn) for the n-conductivity type. On the contrary, the semiconductor device conventionally reported is in a relation of xp>xn because of a simultaneous heat treatment.

As will be understood from the figure, it is possible to make equivalent the sheet resist layerance of titanium silicide films for the p-channel side and the n-channel side by structuring the first conductivity type well as an n-type and the second conductivity type well as a p-type, and making substantially equal the thickness of the titanium silicide films on the p-type well and the n-type well. The conventionally reported semiconductor device has a thickness of a titanium silicide film on the p-channel side which is thicker than that of the n-channel side, i.e., $(x(TiSi_2)n<x(TiSi_2)p)$, when sheet resist layerance is given as designed to the n-channel side. Where there is such unevenness in thickness of the titanium silicide films, the interface of the titanium silicide film and the silicon semiconductor device is closed to the junction, increasing junction current leakage. However, the present invention can prevent junction current leakage from increasing.

Further, the source and drain regions are prevented from spreading toward the depth thereof to suppress the short-channel effect by determining the thickness of the side wall spacer (y) with respect to the direction parallel with the silicon semiconductor substrate 0.7 times the depth of the source/drain region (xp and xn) and/or it is thicker than the gate electrode. In contrast, the conventionally reported semiconductor device has thin side wall spacers and hence in a relation of y<xp and y <xn.

EXAMPLE

The semiconductor device and the fabrication method of the invention will be explained in detail hereinbelow.

Example 1

There is illustrated in FIG. 1 a sectional view of a structure according to Example 1 of the present invention.

In Example 1, the surface of a silicon semiconductor substrate 101, before ion implantation, has an oxygen concentration of $1\times10^{18}/cm^3$ or less in at least an area where impurity ions are to be implanted.

To realize n oxygen concentration of $1 \times 10^{18}/cm^3$ or less in Example 1, a DZ which is a layer of oxygen-free and defect-free was formed by an IG treatment. The surface of the silicon semiconductor substrate has a structure having a silicon nitride film 102 deposited thereon without a native oxide film (a silicon oxide film) formed therebetween. There existed solely arsenic impurity ions 103 implanted without introducing oxygen atoms and nitride atoms 104 knocked on by the arsenic impurity ions 103 in regions with an oxygen concentration of less than $1 \times 10^{18}/cm^3$ of the silicon semiconductor substrate 101, after implantation of the arsenic impurity ions into the silicon semiconductor substrate. After implantation of the impurity ions, the DZ was not a layer of defect-free.

With the above structure, the silicon semiconductor substrate had crystal defects which was further restored, as compared with a case in the absence of nitrogen atoms, by the nitride atoms 104 introduced thereinto, when a heat treatment was performed for activating the impurity ions in a later step. That is, there is decrease of traps present in deep levels due to oxygen atoms, because of lessened oxygen atoms in addition to the presence of nitrogen atoms in the silicon semiconductor substrate. Further, crystal defects caused by implantation of impurity ions are first occupied by nitrogen atoms so that heavy metals as contaminants are prevented from diffuse and being trapped by crystal defects to act as leakage centers. To this end, a junction leakage current was held reduced.

Incidentally, the junction leakage current was decreased to approximately ½ as compared with the case where impurity ion implantation is made through an oxide film. Also, the junction leakage current was decreased to approximately ⅔ as compared with the case where impurity ion implantation is through a native oxide film and a nitride film.

Example 2

In Example 2, explanation is made on a method for bringing the oxygen concentration to $1 \times 10^{18}/cm^3$ or below in a polysilicon film such as for a gate electrode, though in Example 1 the DZ was formed oxygen-free and defect-free by the IG treatment.

To realize a polysilicon film with an oxygen concentration of $1 \times 10^{18}/cm^3$ or less, a film was formed by using an LP-CVD apparatus having a preparatory evacuation chamber, a load lock chamber, and a deposition furnace connected with carrier system nitrogen-purged. The method of using the LP-CVD (liquid-phase chemical vapor deposition) apparatus is described below.

A semiconductor wafer immediately after being formed with a gate oxide film was accommodated in the preparatory evacuation chamber, and then the preparatory evacuation chamber was evacuated to a pressure of approximately $10^{-1}$ Pa. Thereafter, nitrogen was introduced into the preparatory evacuation chamber, and the semiconductor wafer was transported under a nitrogen ambient to the load lock chamber which had been purged with nitrogen kept at a dew point of $-100°$ C. or below. The semiconductor wafer was removed of $H_2O$ molecules absorbed over the surface thereof, and then transported to the deposition furnace. Then, a polysilicon film was formed over the surface of the semiconductor wafer in an $SiH_4$ ambient with a purity of above 99.9999% at a temperature of approximately $620°$ C. and under a pressure of 30 Pa by the LP-CVD method.

Figure 2:
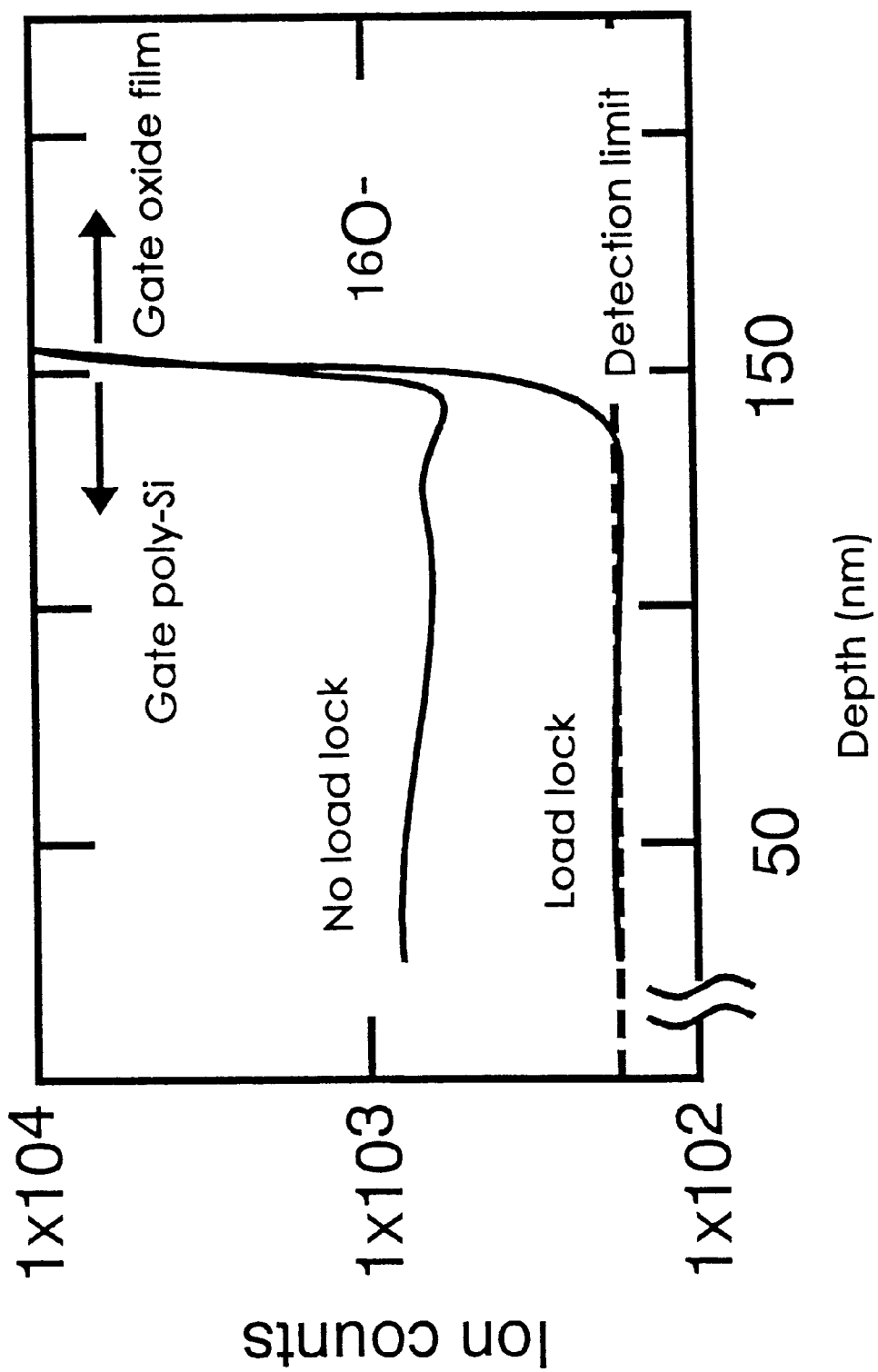
FIG. 2 is a graph showing results of SIMS (secondary-ion mass spectroscopy) analysis on concentration of oxygen contained in a polysilicon film deposited in a second embodiment of the present invention and a polysilicon film deposited by a conventional LP-CVD (low-pressure chemical vapor deposition) apparatus having no load-lock chamber.

The polysilicon film thus formed had an oxygen concentration of below a detection limit, i.e., $1 \times 10^{18}/cm^3$ of SIMS (secondary ion mass spectroscopy), as shown in FIG. 2. The polysilicon film was very low in oxygen concentration. Incidentally, in FIG. 2, the oxygen concentration contained in the polysilicon film according to this example is shown in comparison with that of a polysilicon film deposited by the conventional LP-CVD device having no load-lock chamber.

Example 3

FIGS. 3(a)–3(d) and FIGS. 4(e) and 4(f) are sectional views showing steps for fabricating the semiconductor device according to the invention.

Figure 3:
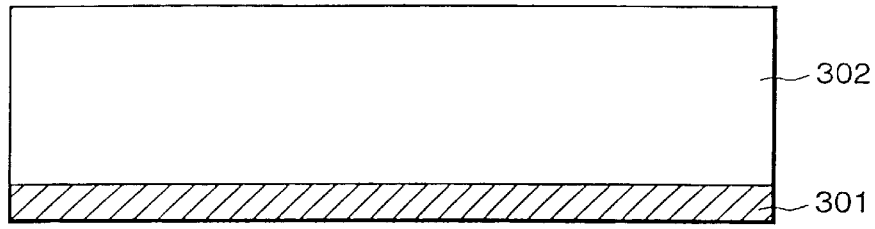
FIGS. 3(a)–(d) are schematic sectional views showing steps according to a third embodiment of the present invention.
Figure 3:
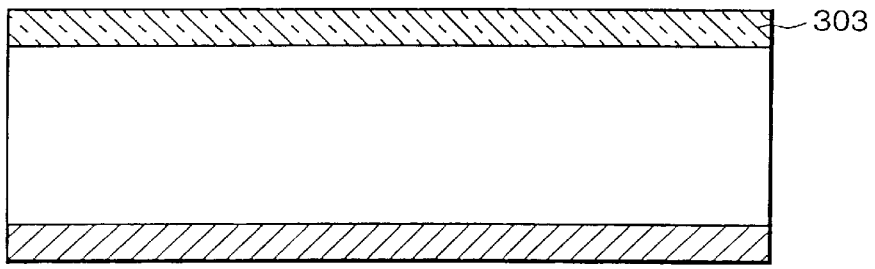
Figure 3:
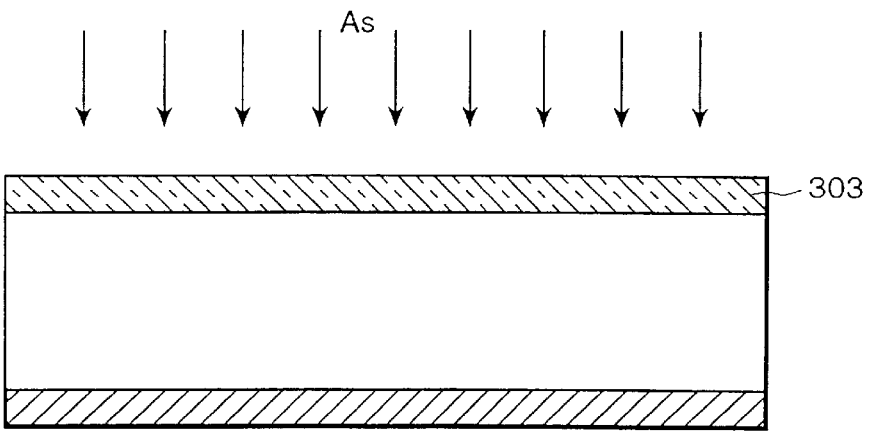
Figure 3:
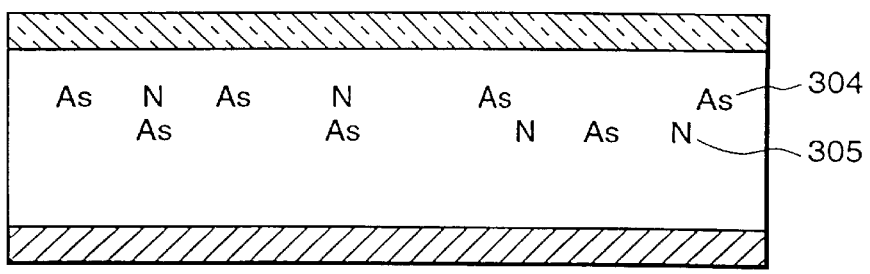

First, silicon semiconductor substrate 30 of a p-type was subjected to an IG treatment form a DZ 302 which has a surface free of oxygen and defects, as shown in FIG. 3 (a). Then, a silicon nitride film 303 was formed to a thickness of approximately 5–30 nm over the surface of the silicon semiconductor substrate by the use of an LP-CVD apparatus. The LP-CVD apparatus is provided with a cassette chamber, a load-lock chamber, and a deposition furnace, as shown in FIG. 3(b). Arsenic ions as an impurity were implanted through the silicon nitride film 303 into the silicon semiconductor substrate, as shown in FIG. 3(c), under conditions of a dose of approximately $5 \times 10^{14} 5 \times 10^{15}/cm^2$ with an implant energy of 40 keV–60 keV. On this occasion, nitride atoms 305 besides arsenic ions 304 were introduced through knocking-on into the silicon semiconductor substrate upon implanting arsenic ions through the silicon nitride film. Subsequently, the silicon semiconductor substrate was subjected to an activation treatment at a temperature of $900°$ C. for 10 minutes, providing a diffusion layer 307. The diffusion layer 307 was of an n-type which is opposite in conductivity to the semiconductor substrate or a wall region thereof. Thereafter, the silicon nitride film 303 was removed from the semiconductor substrate to deposit thereon a titanium film 306. In this case, an apparatus for removing a silicon nitride film and an apparatus for depositing a titanium film were connected therebetween via a vacuum transport system, in order to prevent a native oxide film to grow at an interface of the titanium film 306 and the n-type diffusion layer 307 of the semiconductor substrate. In this example, a cluster type apparatus was used, which has an argon sputter cleaning chamber as a silicon nitride film removing device and a titanium sputter chamber as a titanium film depositing device. The cluster-type apparatus had a base pressure of $1-3 \times 10^8$ torr. With the cluster-type apparatus, the silicon nitride film was completely removed by argon sputter, and subsequently transported into the titanium sputter chamber to deposit a titanium film. Then, silicon ions were implanted at a dose of $5 \times 10^{15}/cm^2$ with an implant energy of 40 keV such that the concentration hits its peak at an interface of the titanium film 306 and the semiconductor substrate. The titanium atoms were reacted with silicon atoms by this implantation.

Figure 4:
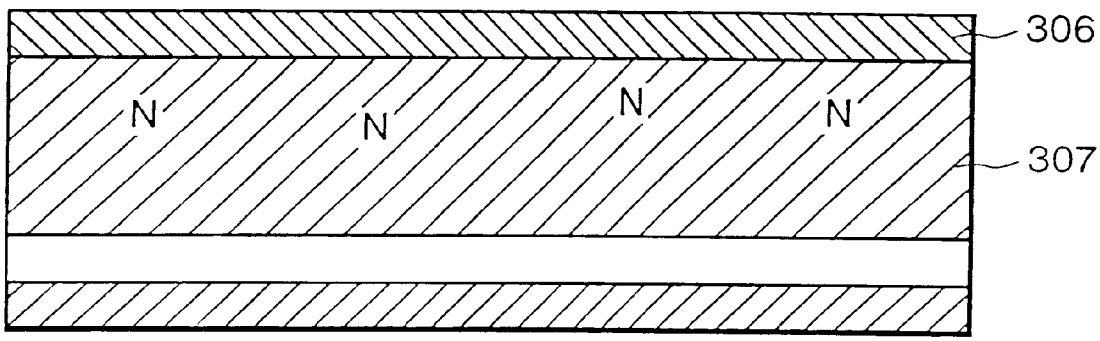
FIGS. 4(e)–(f) are schematic sectional views showing the steps according to the third embodiment of the present invention.
Figure 4:
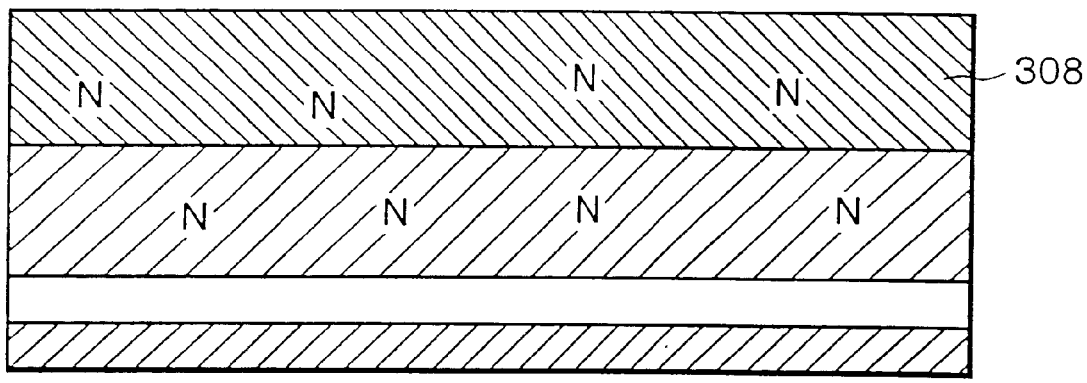

The semiconductor substrate was then subjected to a heat treatment to form a titanium silicide film 308, as shown in FIG. 4(f). In Example 3, the heat treatment was performed by two-stage rapid thermal anneal. That is, the first heat treatment was made in an argon ambient at a relatively low temperature, i.e., $650-700°$ C. for 10–30 seconds, forming $TiSi_2$ of a C49 crystal type. Removal was made on the titanium nitride film which was unreacted or formed during the heat treatment in the nitrogen ambient. Subsequently, a second heat treatment was made at a temperature of $900°$ C. for 10–30 seconds, to form stable $TiSi_2$ of a C54-crystal type.

In this Example, reaction was in a quadruple system involving Si, N, Ti, and O. Although it is impossible to completely remove O, it was excluded to an minimum degree, with nitrogen mixed. The titanium silicide film therefore is less liable to form oxide therein, and hence excellent in heat resist layerance. On the contrary, where a silicon oxide film is employed instead of a silicon nitride film, there will occur aggregation of titanium silicide caused by heat treatment which is high in temperature and long in period of time. There is therefore a necessity of a second heat treatment in a nitrogen ambient at a temperature of approximately 800° C. In a heat treatment at such temperature, it is impossible to transform the crystal type C49 into C54 during a silicidation step for a line width of as fine as 1 μm or less. To this end, the resulting titanium silicide will to high in electrical resist layerance.

Figure 5:
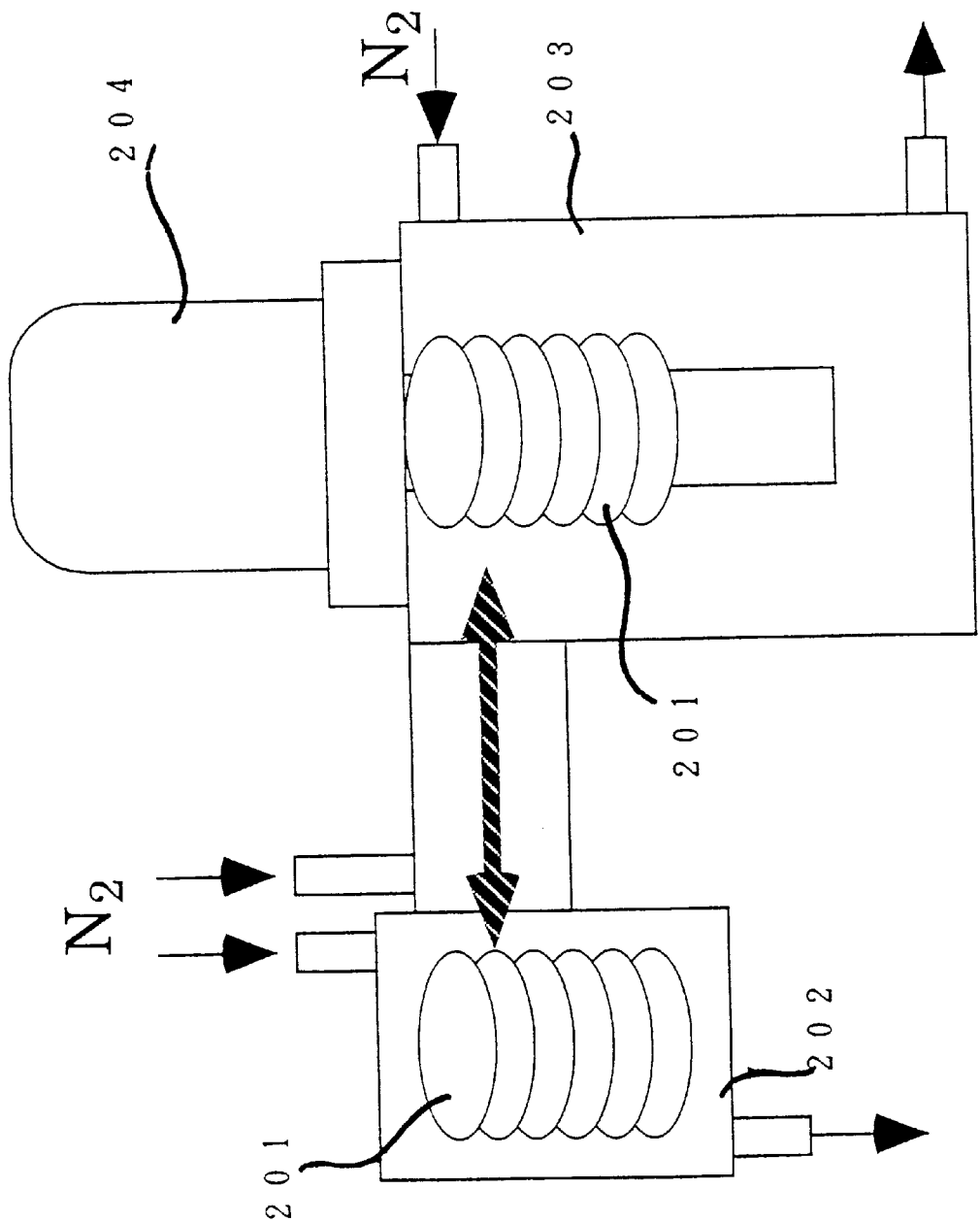
FIG. 5 is a schematic diagram of an LP-CVD apparatus provided with a load-lock chamber applied to the present invention.

FIG. 5 is a schematic diagram of an LP-CVD apparatus having a load-lock chamber for forming a silicon nitride film of this example. The method of forming a silicon nitride film by using this LP-CVD apparatus will then be explained hereinbelow.

First, a wafer 201 which had been removed of a native oxide film from the surface thereof was transported to a preparatory evacuation chamber 202, and then the evacuation chamber was evacuated. Thereafter, the preparatory evacuation chamber 202 was charged with nitrogen, and the wafer 201 was transported to a load-lock chamber 203. The load-lock chamber 203 contained oxygen having a concentration of 0.01 ppm or below with an $H_2O$ dew point of $-100°$ C. Incidentally, this oxygen concentration of 0.01 ppm is a limit value of detection by an oxygen concentration counter.

After molecules of moisture were removed from the surface of the wafer by the preparatory evacuation chamber 202 and the load-lock chamber 203, the wafer was transported into a silicon nitride film deposition furnace 204 with a nitriding ambient held at a temperature of 400° C. In the deposition furnace 204, a silicon nitride film was deposited over the wafer by raising the temperature to 700° C. in an ambient containing $SiH_2Cl_2$ supplied at a flow rate of 10 sccm and $NH_3$ at a flow rate of 100 sccm. Incidentally, the pressure of reaction was 15 Pa.

Example 4

Figure 6:
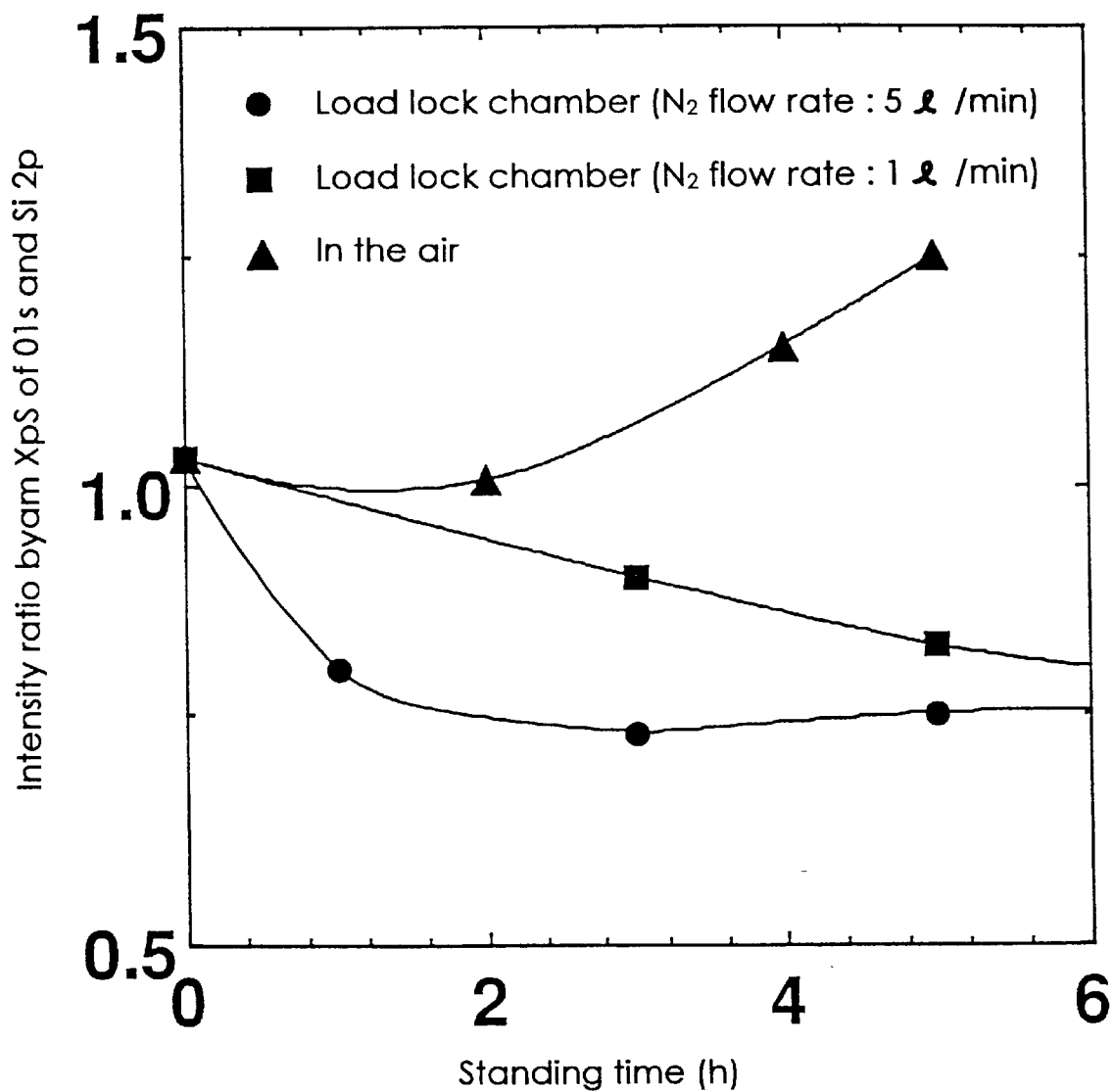
FIG. 6 is a graph showing results of analysis by an XPS (X-ray photo-electron spectroscopy) technique on amount of oxygen (moisture molecules) adsorbed on a surface of a wafer allowed to stood in the load-lock chamber of the LP-CVD apparatus applied to the present invention and a wafer allowed to stood in the air.

FIG. 6 shows results of analysis by an XPS (an X-ray photo-electron spectroscopy) on the amount of oxygen (moisture molecules) absorbed in a surface of a wafer after removing of a native oxide film therefrom. The analysis involves a case, where a wafer was allowed to stand within the load-lock chamber of the L-CVD apparatus, with a case, where a wafer was allowed to stand merely in the air. In the figure, ● represents a case where the nitrogen ambient was supplied through the load-lock chamber at a flow rate of 5 litters per minute, □ a case where the nitrogen ambient was supplied at a flow rate of 1 litter pr minute, and Δ a case where a wafer was allowed to stand in the air as in the conventional method.

As understood from FIG. 6, the wafer which had stood in the air showed increase in concentration of oxygen in the surface thereof with increase of the time period during which it is allowed to stand immediately after removal of a native oxide film. On the contrary, a wafer which had stood in the load-lock chamber showed less concentration of oxygen in the surface thereof than the concentration of immediately after removal of a native oxide film. This means that the provision of a load-lock chamber in a silicon nitride film deposition apparatus enables removal of oxygen (moisture molecules) absorbed in the surface of a wafer. The LP-CVD apparatus provided with a cassette chamber and a load-lock chamber could provide a interface of a silicon semiconductor substrate and a silicon nitride film without interposition of a silicon oxide film therebetween.

On the contrary, in the conventional LP-CVD apparatus, the oxygen (moisture molecules) present in the surface of a silicon substrate acts to oxidize the surface thereof so that a silicon oxide film is allowed to grow at the interface of the silicon nitride film and the silicon semiconductor substrate.

Example 5

Figure 7:
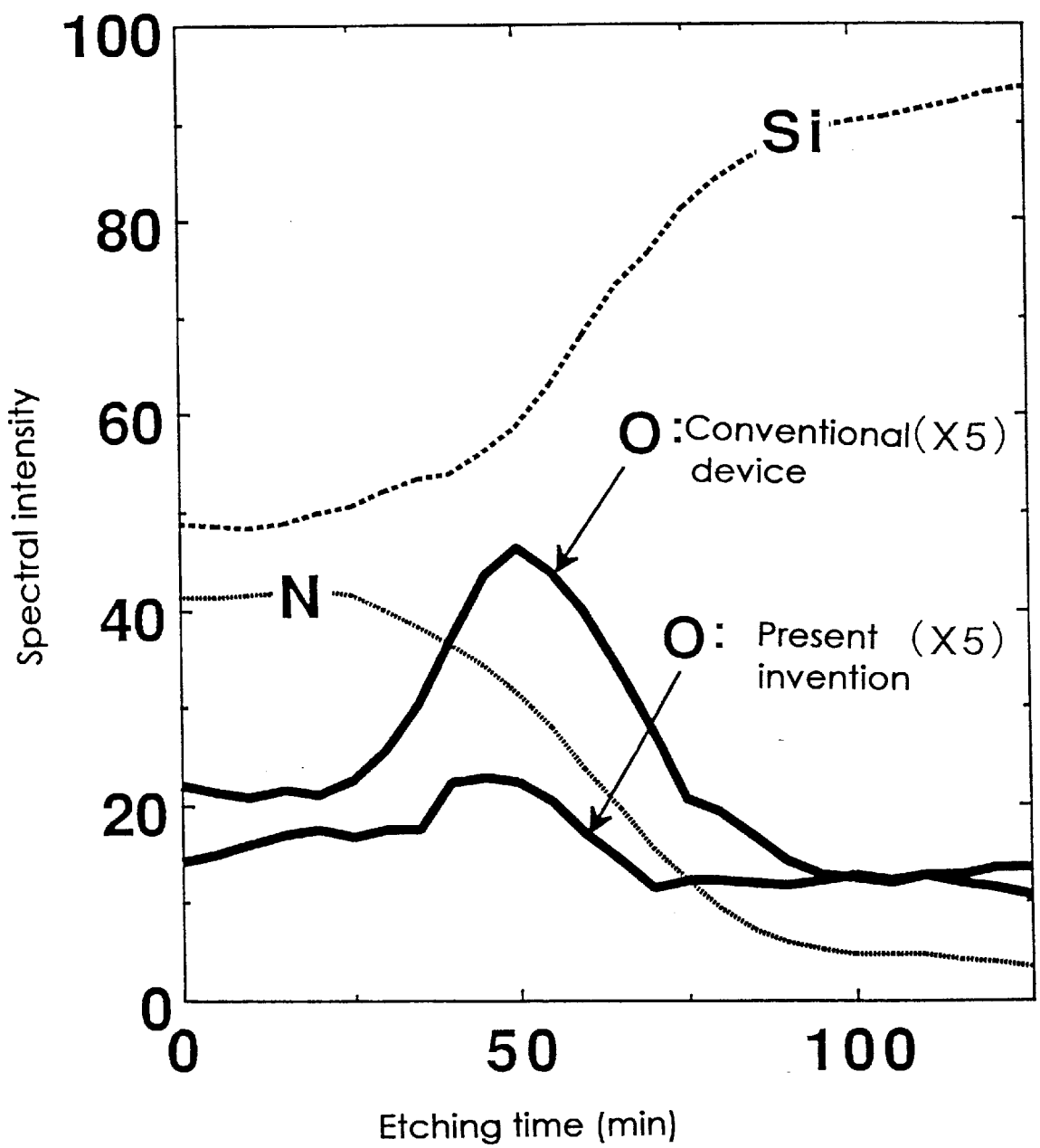
FIG. 7 is a graph showing results of analysis by an Auger electron spectroscopy technique on amount of oxygen at the interface of a silicon semiconductor substrate and a silicon nitride film, wherein a silicon nitride film is formed over the silicon semiconductor substrate by the LP-CVD apparatus with the load-lock chamber applied to the present invention, and the silicon nitride film is formed over a silicon semiconductor substrate by the conventional apparatus having no load-lock chamber.

FIG. 7 shows results of analysis by using an Auger electron spectroscopy on the concentration of oxygen at an interface of a silicon semiconductor substrate and a silicon nitride film. The analysis involves a case where a silicon nitride film was deposited over a silicon semiconductor substrate by using an LP-CVD apparatus provided with the load-lock chamber of FIG. 5, and a case where a silicon nitride film was deposited by means of a conventional LP-CVD apparatus with no load-lock chamber. According to FIG. 7, it was demonstrated that the apparatus shown in FIG. 5 can create an interface which is substantially free of a silicon oxide film, whereas the conventional apparatus allows a silicon oxide film to grow at the interface. That is, with the apparatus of FIG. 5 almost nitrogen atoms only experience knock-on due to coming impurity ions implanted, thereby providing a structure as given in Example 1.

On the other hand, when depositing a silicon nitride film over the silicon semiconductor substrate with using a conventional LP-CVD apparatus having no load-lock chamber, a native oxide film grows at an interface of a silicon semiconductor substrate 701 and a silicon nitride film 702. As a result, impurity ions implanted have to pass through two of layers, i.e., the silicon nitride film 702 and the silicon oxide film 703, resulting in knock-on of oxygen atoms 705 toward the silicon semiconductor substrate. The oxygen atoms due to knock-on serve preferentially to form oxide during the subsequent heat treatment of an oxygen-involved reaction system of silicon and titanium, preventing silicidation with inhomogeneous reaction occurred. Further, it was confirmed that if there present an oxide film formed at the interface upon recrystallization of a titanium silicide film during heat treatment at a temperature of exceeding 800° C., the crystalline system acts to reduce free energy at an interface thereby causing aggregation. Incidentally, recrystallization generally takes place at a temperature of 0.6 times the melting point in absolute temperature.

Example 6

Figure 8:
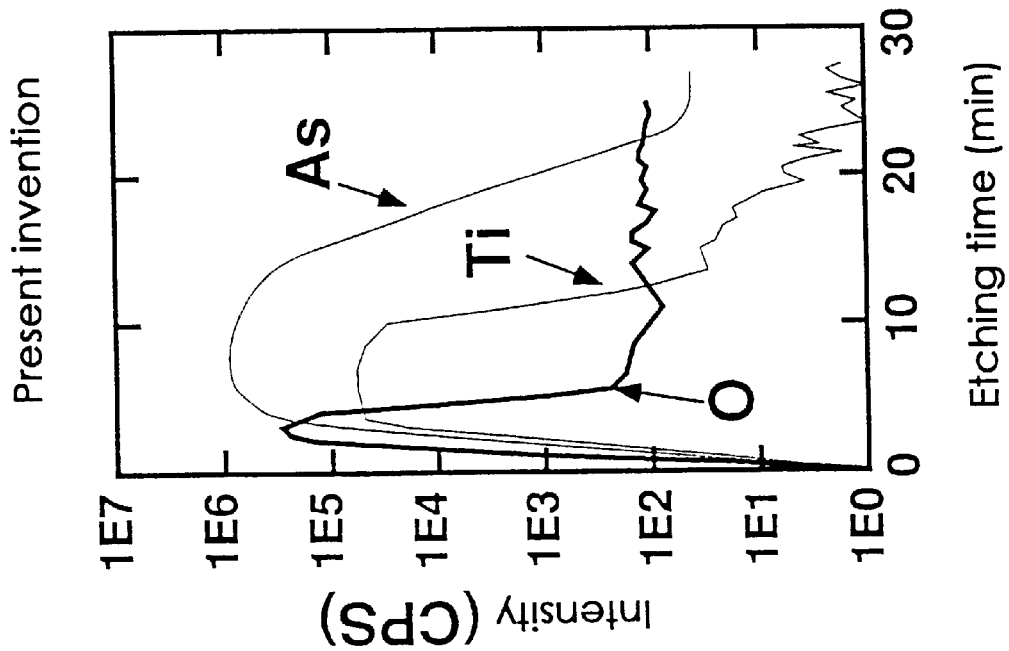
FIG. 8(a) is a graph showing a result of SIMS analysis on concentration of oxygen contained in a titanium silicide film which is silicided after being implanted with arsenic ions through a conventional silicon oxide film.
FIG. 8(b) is a graph showing a result of SIMS analysis on concentration of oxygen contained in a titanium silicide film which is silicided after being implanted with arsenic ions through a silicon nitride film by the present invention.
Figure 8:
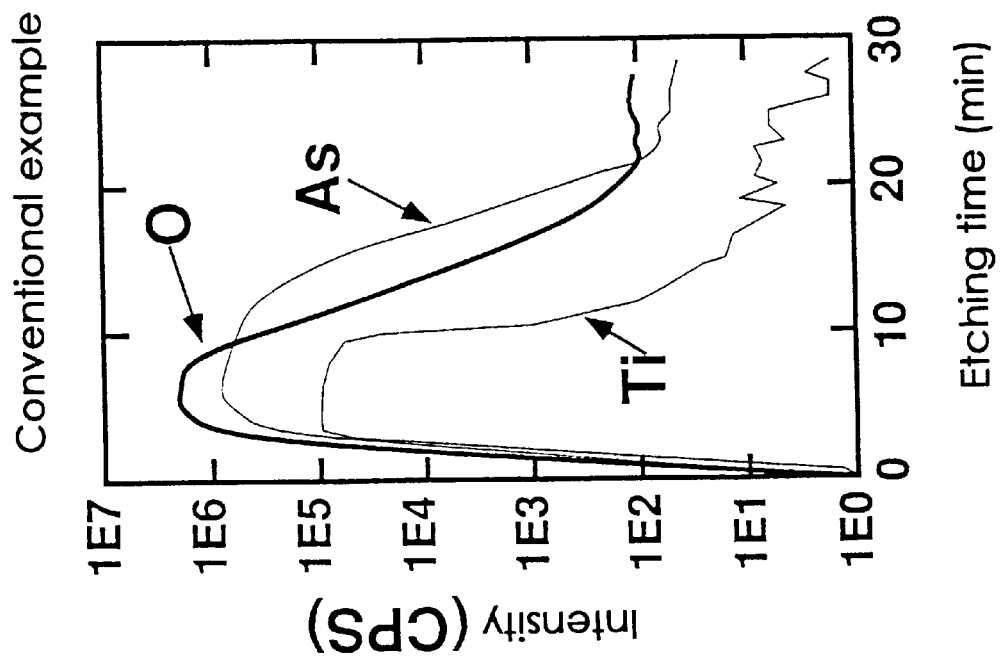

FIG. 8(b) shows results of analysis by using a SIMS on concentration of oxygen contained in a titanium silicide film, which film was formed by the method of the invention. FIG. 8(a) on the other hand shows results of analysis by the SIMS on concentration of oxygen in a titanium silicide film, which film was formed by the conventional method, i.e., in the conventional method arsenic ions were implanted through a silicon oxide film interposed and then subjected to silicidation. As apparent from FIGS. 8(a) and 8(b), it was recognized that the titanium silicide film according to the method of the invention is low in oxygen concentration as compared with the titanium silicide film formed by the conventional method.

Example 7

Figure 9:
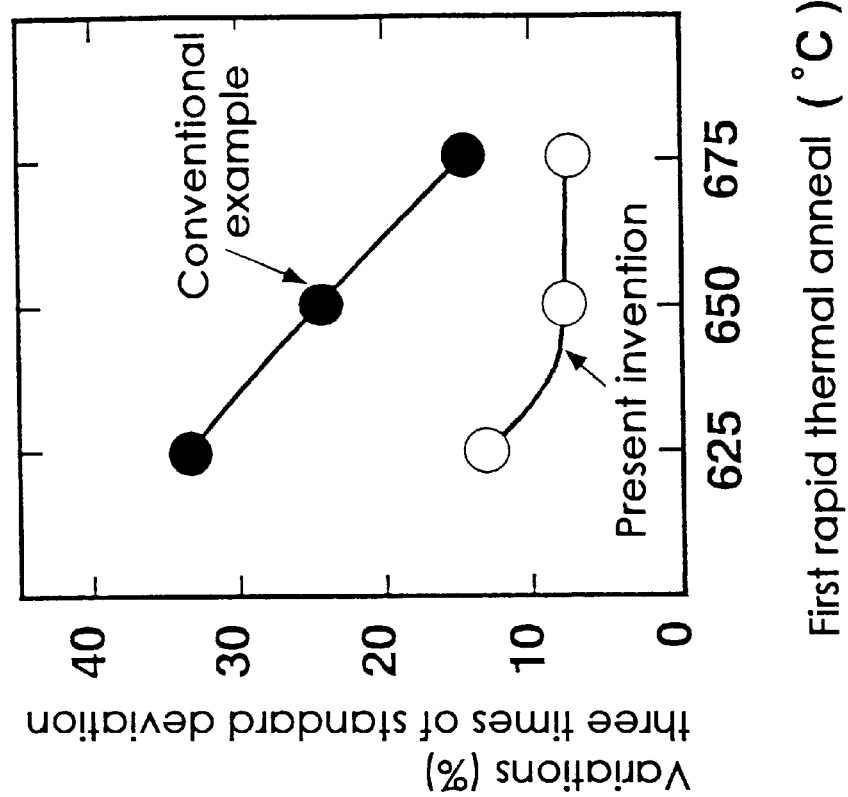
FIG. 9(a) is a graph showing results of dependency of sheet resist layerance of titanium silicide films on a first rapid thermal anneal, wherein the titanium silicide films are formed by the present invention and silicided after being implanted with arsenic ions through a conventional silicon oxide film.
FIG. 9(b) is a graph showing results of dependency of variations in sheet resist layerance of titanium silicide films in a wafer surface on a first rapid thermal anneal, wherein the titanium silicide films are formed by the present invention and silicided after being implanted with arsenic ions through a conventional silicon oxide film.
Figure 9:
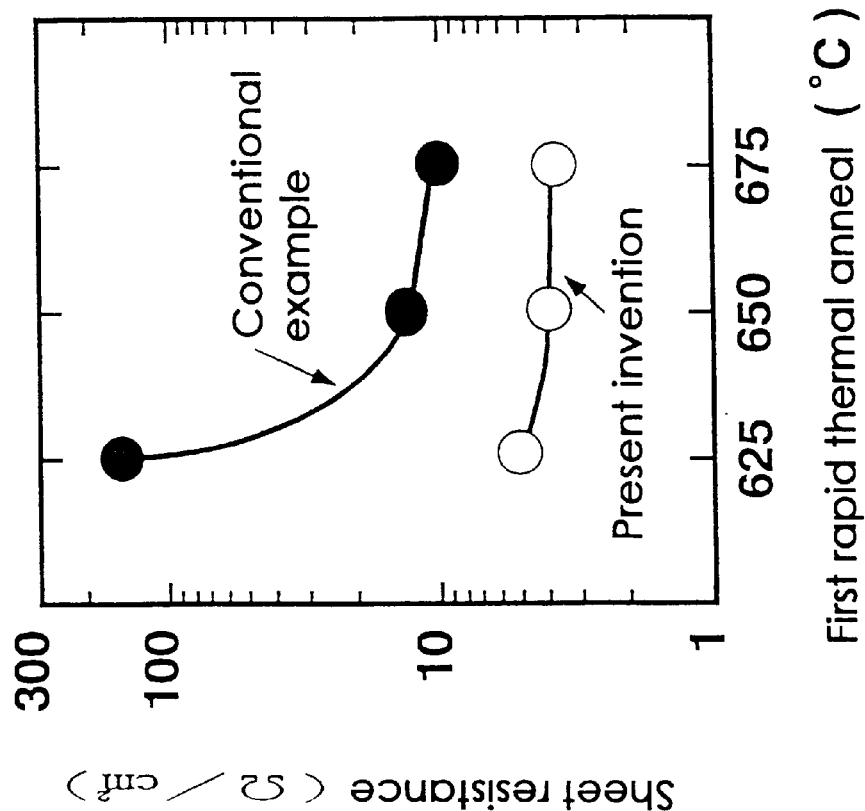

FIGS. 9(a) and 9(b) show temperature dependency of sheet resist layerance and variation thereof on titanium silicide films after a first rapid thermal treatment, which silicide films are respectively formed by the method of the invention and the conventional method. In the conventional method, the titanium silicide films were subjected to silicidation after being implanted with arsenic ions through a silicon oxide film. Incidentally, the thickness of the titanium films was 30 nm and a second rapid thermal anneal was made at temperature of 850° C. for 20 seconds.

It have been learned from FIGS. 9(a) and 9(b) that the method of the invention caused silicidation reactions at lower temperatures, as compared with the conventional method. That is, in the method of the invention, the temperature at which the value of sheet resist layerance comes to saturate in accordance with supply rate of titanium is shifted to a lower side of temperature, as compared with the conventional method. Further, the value of sheet resist layerance in saturation was lower than that of the conventional method, with reduced variations. The results show in the method of the invention that silicidation reaction proceeds from an initial stage thereof between silicon and titanium substantially in the absence of oxygen atoms, with lessened variations.

On the contrary, the conventional method involves oxygen atoms in reaction between silicon and titanium so that silicidation reaction is prevented by oxygen atoms, raising the value of sheet resist layerance in saturation thereof. The reason of high sheet resist layerance is that the first rapid thermal anneal directly contributable to silicidation is carried out in a nitrogen ambient, and accordingly nitriding proceeds from the surface of a titanium film to advance formation of a titanium nitride film. It is noted that the second rapid thermal anneal just serves to reorganize the crystalline structure. Further, the amount of titanium supply is deficient for silicidation on the silicon semiconductor substrate side, because of retarded silicidation reaction du to the presence of oxygen atoms. Further, in the conventional method, as the mass number of an impurity to be implanted increases, the amount of oxygen knocked-on increases, retarding silicidation reaction. To this end, the thickness of titanium silicide provided by the titanium supply rate is reduced.

Example 8

Figure 10:
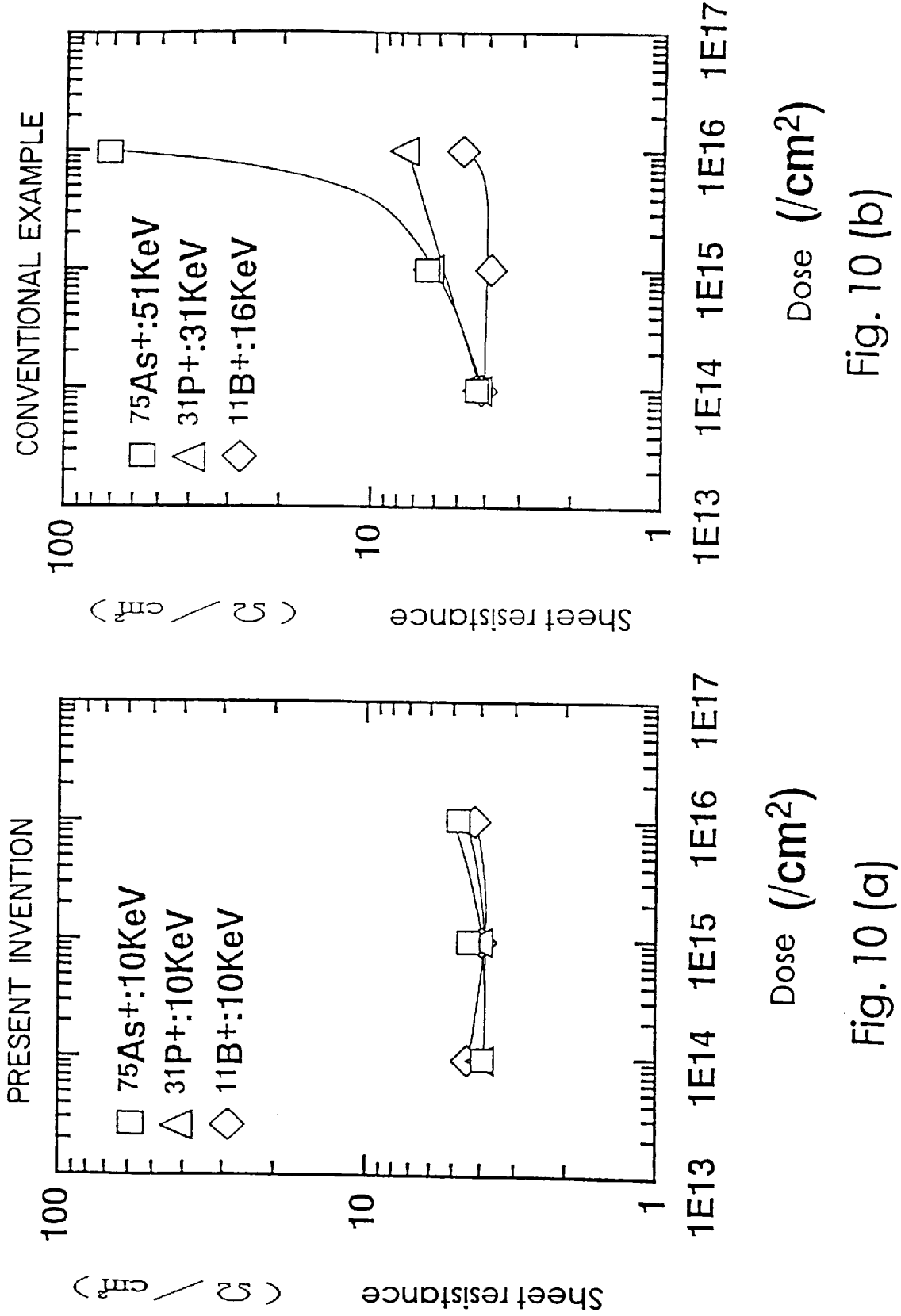
FIG. 10(a) is a graph showing dependency of sheet resist layerance of a titanium silicide film on dose of an impurity, which titanium silicide film is silicided after being implanted with impurity ions through the silicon nitride film formed by the present invention.
FIG. 10(b) is a graph showing dependency of sheet resist layerance of a titanium silicide film on dose of an impurity, which titanium silicide film is silicided after being implanted with impurity ions through the conventional oxide film.
Figure 11:
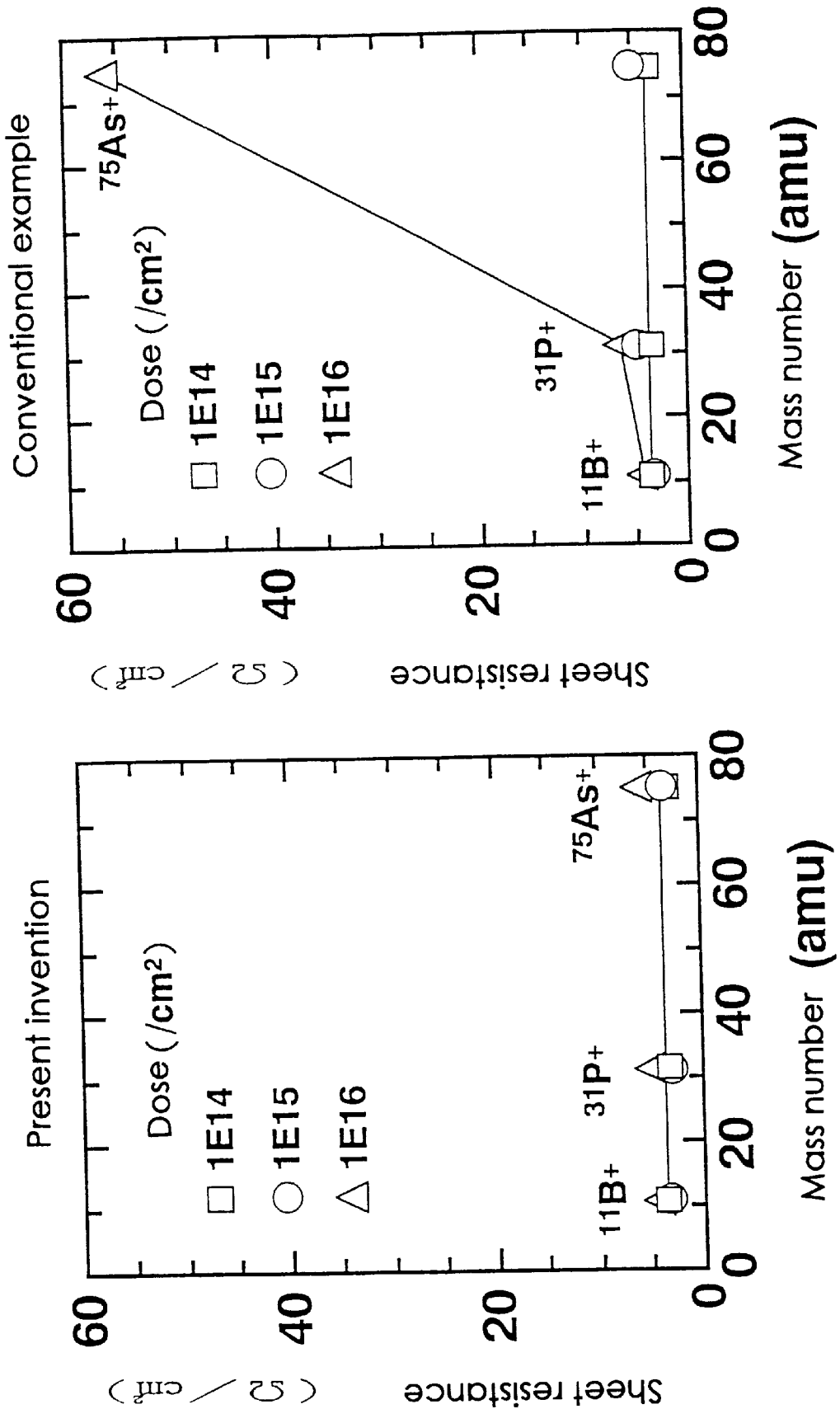
FIG. 11(a) is a graph showing dependency of sheet resist layerance of a titanium silicide film on mass number, wherein the titanium silicide film is silicided after being implanted with impurity ions through the silicon nitride film formed by the present invention.
FIG. 11(b) is a graph showing dependency of sheet resist layerance of a titanium silicide film on mass number, wherein the titanium silicide film is silicided after being implanted with impurity ions through the conventional silicon oxide film.

It is generally thought that the thickness of titanium silicide film formed by silicidation in an n-channel diffusion region be thinner than that of silicidation in a p-channel diffusion region. This is because the mass number of boron, i.e., 11, for a p-channel is small as compared with the mass number of arsenic, i.e., 75, for an n-channel. FIGS. 10(a) and 10(b) as well as FIGS. 11(a) and 11(b) show data giving ground for the above.

FIGS. 10(a) and 10(b) are graphs showing dependencies of sheet resist layerance on the dose of an impurity for titanium silicide films formed by the method of the invention and the conventional method. In the conventional method, impurity ions were implanted through an oxidation film and then subjected to silicidation. On the other hand, FIGS. 11(a) and 11(b) are graphs showing dependencies of sheet resist layerance on the mass number of an impurity for titanium silicide films formed by the method of the invention and the conventional method as above. In this Example, the first rapid thermal anneal was made at a temperature of 700° C. for 20 seconds, while the rapid second heat treatment was 850° C. for 20 seconds. The first and second raid heat treatments were performed under the same conditions. That is, the first rapid thermal anneal was met to such a temperature that sheet resist layerance comes to saturate in the conventional method, and the second rapid thermal anneal to such a temperature that no aggregation occurs in the conventional method.

In the conventional method, as the mass number of an impurity implanted increases and also the dose of an impurity rises, the thickness of a titanium silicide film becomes thinner and hence sheet resist layerance increases. Consequently, the silicide film according to the conventional method is apt to cause aggregation therein, and the aggregation will furthered as the film thickness becomes thinner. There is therefore a necessity of determine the film thickness to that for the n-channel side.

In the method of the invention, the value of sheet resist layerance is almost constant regardless of the mass number and the dose of an impurity being implanted. Thus, the present invention can provide a same thickness of films for both p- and n-channels. It was learned that it is possible to overcome a phenomenon as a conventional problem of increase in junction leakage currents caused by thickening of a titanium silicide film on the p-channel side when the film thickness is determined to meet the film thickness for the n-channel side in formation of a CMOS semiconductor device. The thickening of the titanium silicide film possibly extends to a neighborhood of a depletion layer in a diffusion layer.

Example 9

Figure 12:
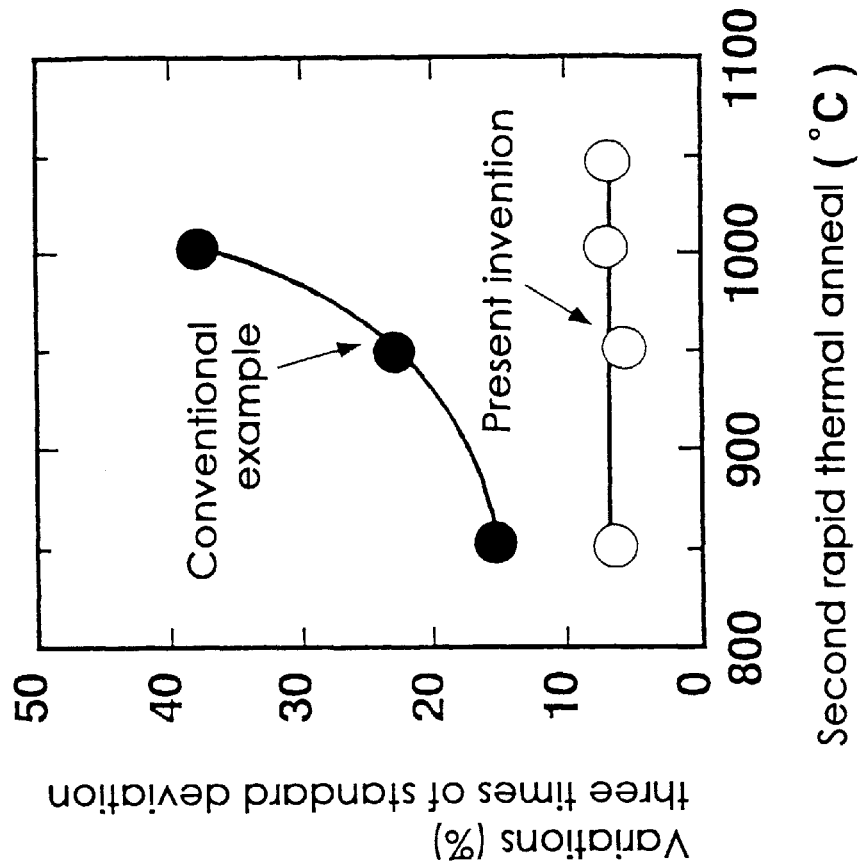
FIG. 12 (a) is a graph showing results of dependency of sheet resist layerance of titanium silicide films on a second rapid thermal anneal, wherein the titanium silicide films are formed by the present invention and silicided after implanted with arsenic ions through the conventional silicon oxide film.
Figure 12:
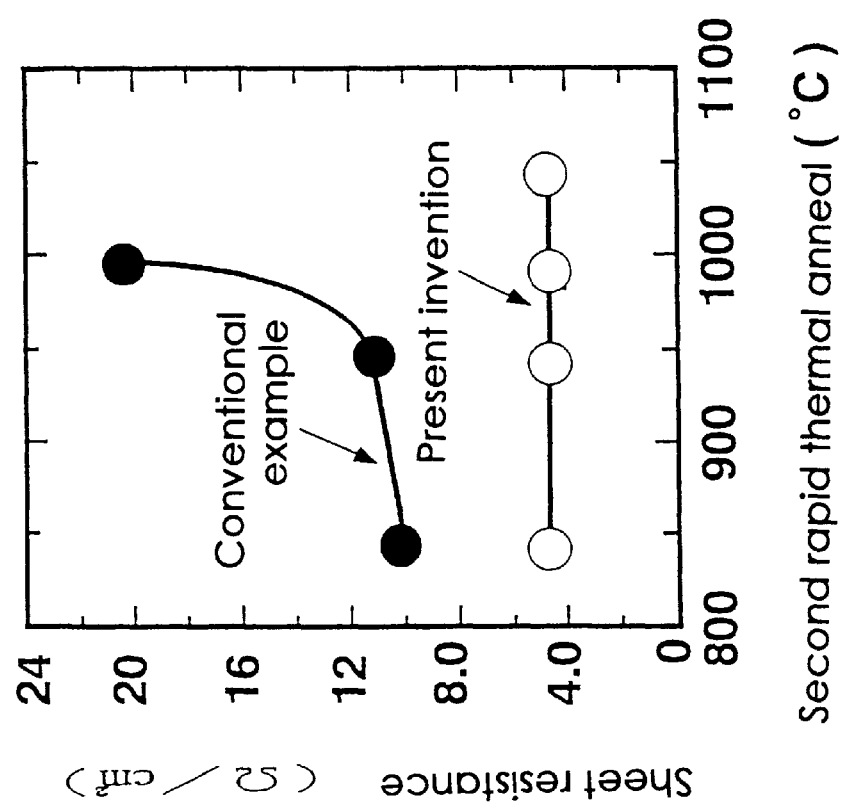
Figure 14:
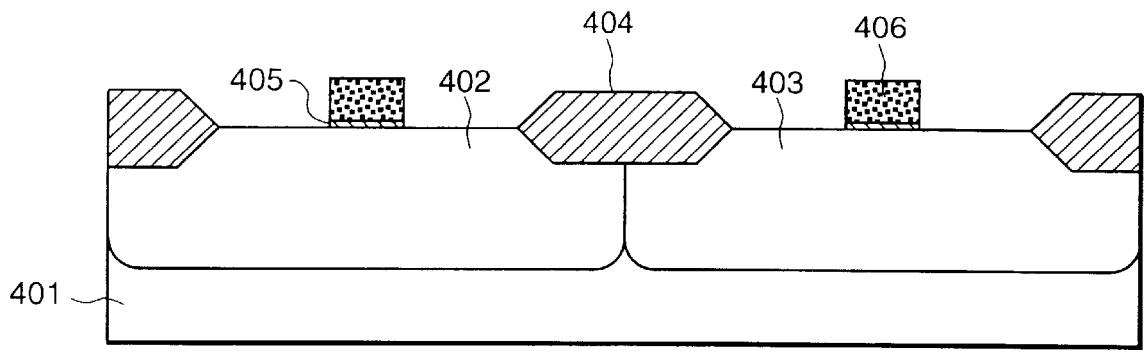
FIGS. 14(a)–14(c) are schematic sectional view showing fabrication steps for a CMOS semiconductor device according to an eleventh embodiment of the present invention.
Figure 14:
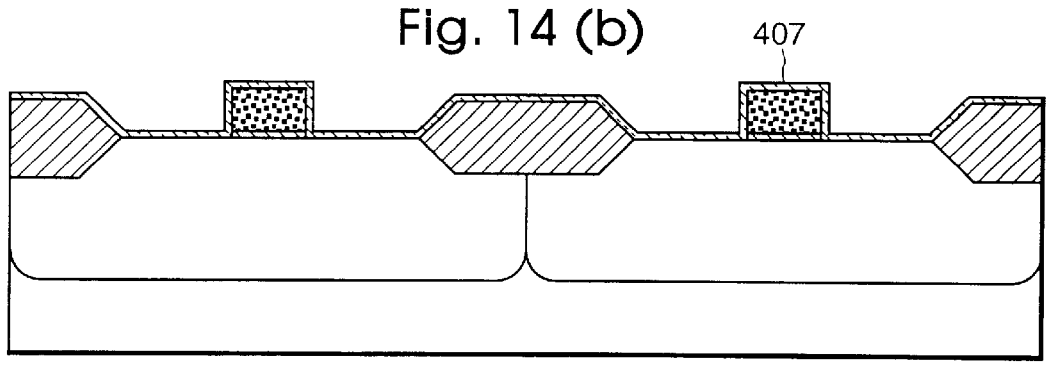
Figure 14:
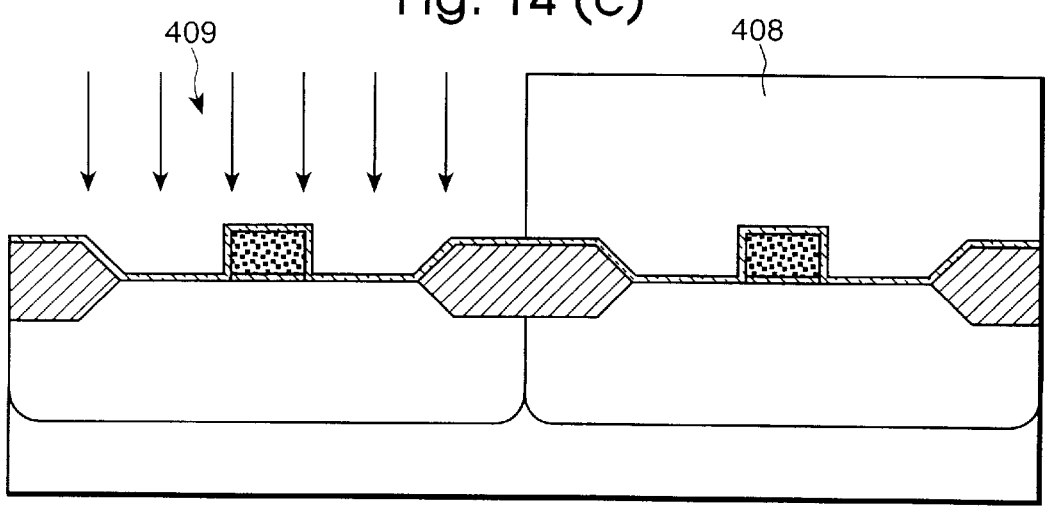
Figure 15D:
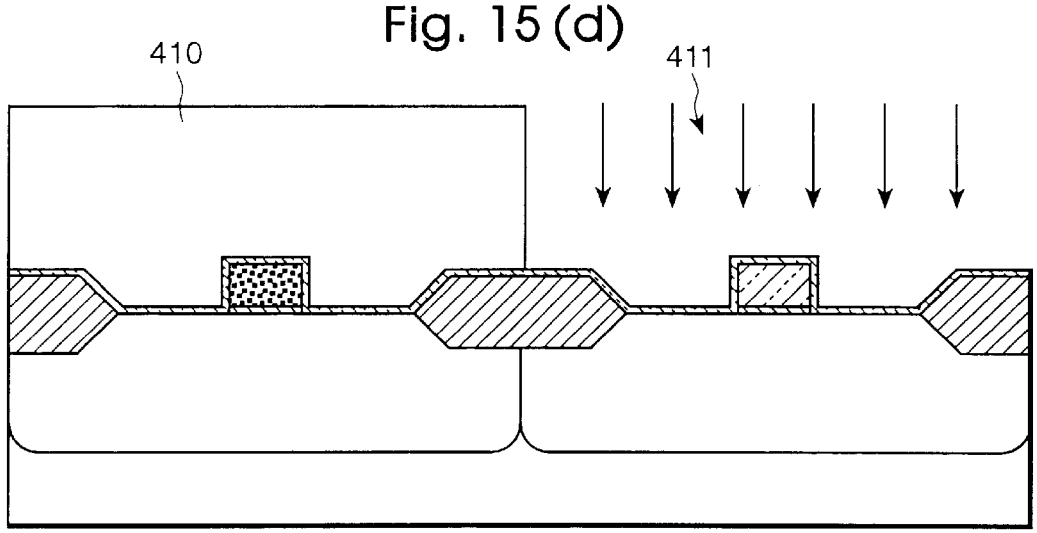
FIGS. 15(d)–15(f) are schematic sectional view showing the fabrication steps for the CMOS semiconductor device according to the eleventh embodiment of the present invention.
Figure 15E:
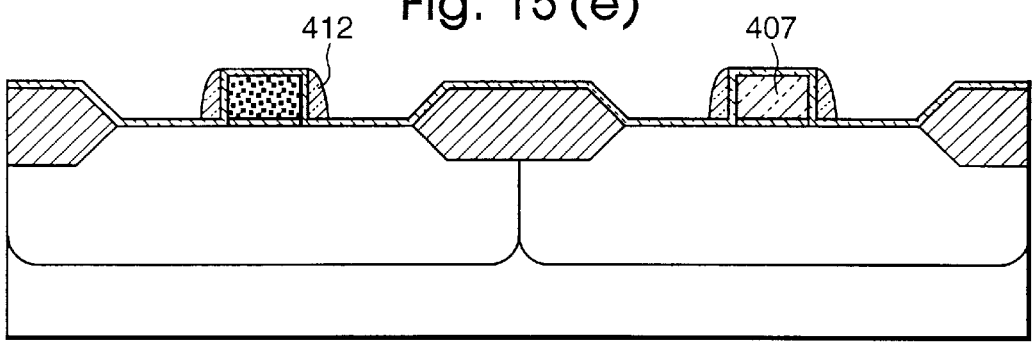
Figure 15F:
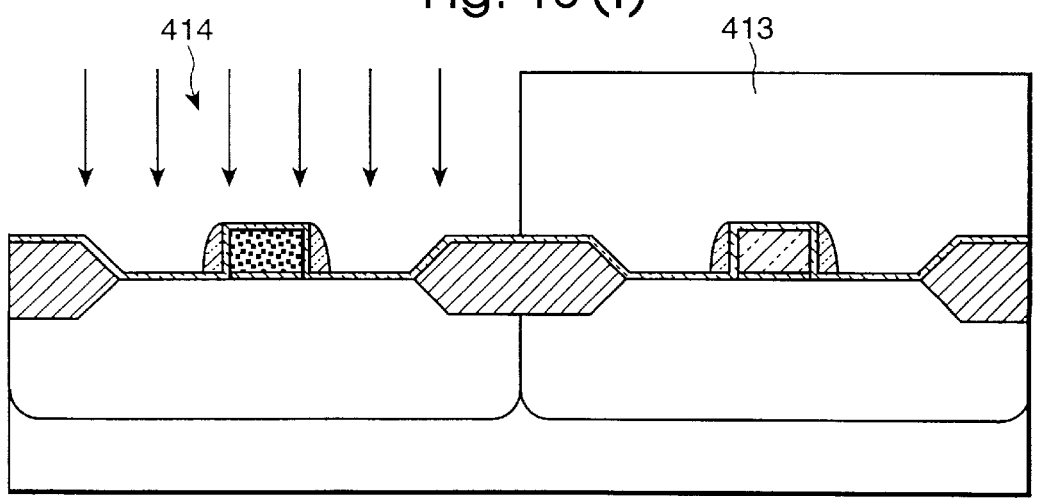

FIGS. 12(a) and 12(b) are graphs showing dependencies of sheet resist layerance and variation thereof on the second rapid thermal anneal for titanium silicide films formed by the method of the invention and the conventional method. In the conventional method, arsenic ions were implanted through an oxidation film and then subjected to silicidation. In this case, the first rapid thermal anneals were made fixingly at a temperature of 675° C. Titanium films were formed by sputter fixingly to a thickness of 30 nm.

It was learned from FIGS. 12(a) and 12(b) that in the conventional method aggregation begins to occur to thereby increase the value of sheet resist layerance upon exceeding of temperature for a heat treatment above 850° C. On the contrary, it was demonstrated in the present invention that there is no occurrence of aggregation even at a temperature as high as 1050° C.

Example 10

FIG. 13(a) is a photograph of a surface of a titanium silicide film as a sample taken by a scanning electron microscope (SEM), wherein a silicide film was formed by the method of the invention. FIG. 13(b) is a photograph of a surface of a titanium silicide film as a sample taken by a scanning electron microscope, wherein a silicide film was formed by the conventional method. These silicide films were treated at a temperature of 900° C. for 30 minutes-into the respective titanium silicide films. As understood from FIGS. 13(a) and 13(b) it was demonstrated that in the method of the invention there is no occurrence of aggregation even after a high-temperature long-period annealing, i.e., approximately at 900° C. for 30 minutes.

Example 11

The step of making a CMOS semiconductor device is shown by sectional views in FIGS. 14(a)–14(c), FIGS. 15(d)–15(f), FIGS. 16(g)–16(i), and FIGS. 17(j)–17(k). The step of making a CMOS semiconductor device will be explained hereinbelow.

First, a semiconductor substrate 401 of silicon was subjected to an IG treatment to form a DZ, which treatment is well known and accordingly not shown. Thereafter, a p-well and an n-well were formed in the semiconductor substrate and then field oxide layers 404 were formed thereon. Impurity ions were implanted into respective a p-channel and an n-channel, not shown, for control of threshold voltages and prevention of short-channel effect, followed by formation of a gate oxide film 405 to a thickness of 5 nm. Then, a polysilicon film 406, which is to be formed into gate electrodes, was deposited to a thickness of 100–200 nm, in a manner similar to the method of depositing polysilicon film in Example 4. The polysilicon film was patterned into a desired pattern (See FIG. 14(a)).

A silicon nitride film 407 was then deposited to a thickness of 5–30 nm in such a manner that no oxygen is introduced to an interface thereof with the silicon semiconductor substrate 401, as shown in FIG. 14(b), in a manner similar to the method of deposition for a silicon nitride film in Example 4. Then, the p-channel region, or the n-well, was masked by a photolithography step with photo-resist layer 408. Thereafter, impurity ions, e.g., arsenic, 409 as a donor for the silicon semiconductor substrate, was implanted into the p-channel region, or the n-well, to form a shallow junction in the vicinity of the channel region. The ion implantation was at a dose of approximately $1-3\times10^{14}/cm^2$ with an energy of 20–40 keV (See FIG. 14(c)). Thereafter, the photo-resist layer 408 was removed away.

Then, the p-channel region, or the p-well, was masked with photo-resist layer 410. Thereafter, impurity ions, e.g., indium, 409 as an acceptor for the silicon semiconductor substrate, was implanted into the n-channel region, or the n-well at a dose of approximately $1-5\times10^{14}/cm^2$ with an energy of 40–80 keV (See FIG. 14 (d)). Thereafter, the photo-resist layer 410 was removed. Where $BF_2$ or the like is used, ion implantation may be at a dose of approximately $1-5\times10^{14}/cm^2$ with an energy of 20–40 keV.

Then, side wall spacers 412 were formed on side walls of gate electrodes, as shown in FIG. 15 (e). In this example, these side wall spacers were provided by first depositing a silicon oxide film to a thickness of 100–300 nm and then etching back the oxide film until the surface of the silicon nitride film is exposed. In the etching, gases based on $C_4F_8+CO$ having an etch ratio of approximately 50–100 for the silicon nitride film 407 was used.

Then, the p-channel region, or the n-well, was masked with photo-resist layer 413. Thereafter, impurity ions, e.g., arsenic, 414 as a donor for the silicon semiconductor substrate, is implanted into the n-channel region, or the p-well for forming source and drain regions at a dose of approximately $1-5\times10^{15}/cm^2$ with an energy of 30–60 keV (See FIG. 15(f)). It was recognized that the preventability for short-channel effect be worsened when the thickness of the side wall spacers is 200 nm and impurity ions are implanted at an energy of 80 keV.

Figure 16:
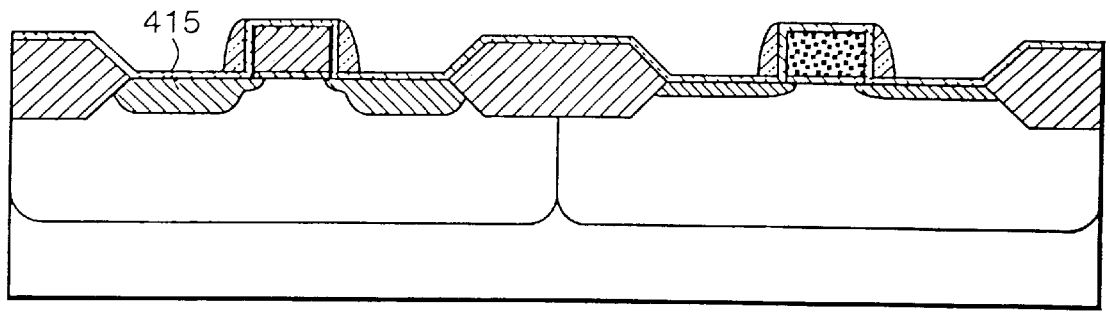
FIGS. 16(g)–16(i) are partial schematic sectional view showing the fabrication steps for the CMOS semiconductor device according to the eleventh embodiment of the present invention.
Figure 16:
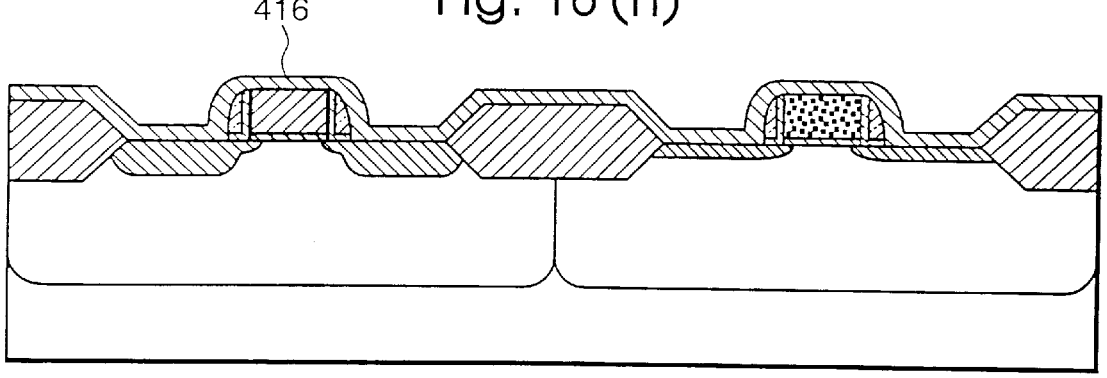
Figure 16:
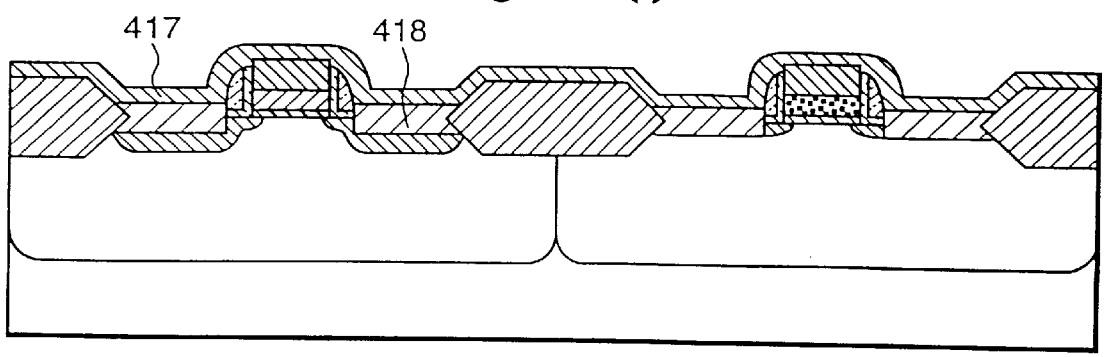

Annealing was made in a nitrogen ambient at a temperature of 900° C. for 10 minutes for purposes of activation and crystal defect restoration, as shown in FIG. 16(g). This heat treatment served to activate impurity ions for control of a threshold voltage and prevention of a short-channel effect, impurity ions implanted for formation of shallow junctions in the vicinity of channels, and impurity ions implanted for formation of the source and drain regions on the n-channel side. Incidentally, numeral 415 in the figure represents n-type source and drain regions.

After removing the silicon nitride film 407, a titanium film 416 was deposited to a thickness of approximately 30 nm, as shown in FIG. 16(h). For this step, a cluster-type apparatus was used, which is provided with a load-lock chamber, argon-sputter cleaning chamber, and titanium sputter chamber. With this apparatus, the silicon nitride film was etched by argon-sputter and then the semiconductor substrate was vacuum-transported to a titanium deposition furnace where deposition is made for forming a titanium film over the semiconductor substrate. The utilization of this apparatus made possible deposition of a titanium film in a manner free of a native oxide film at an interface of an active region of the silicon semiconductor substrate and the deposited titanium film.

The method of forming a titanium film by the use of the cluster-type apparatus will be detailed hereinbelow. First, a native oxide film over the silicon nitride film 407 was removed by using a solution based on a fluoride acid. Immediately thereafter, the wafer was contained in the load-lock chamber and then transported to an etching chamber where the surface of the wafer is cleaned by removing the silicon nitride film 407. An argon-sputter cleaning etching technique was employed for cleaning the surface. Then, the wafer was vacuum transported into the sputter chamber where a titanium film 416 is deposited thereover in an argon ambient. In this example, deposition of pure metallic titanium was made by using a titanium target with a purity of 99.9999 percent.

Silicon was then ion implanted such that the concentration thereof hits a peak (Rp) at an interface of the titanium nitride film and the active region, i.e., the source and drain regions, and an interface of the titanium nitride film and the gate-electrode polysilicon layer. The silicon implantation caused mixing of silicon and titanium in the vicinity of the interface, thus smoothening the initial stage of silicidation reaction.

A first rapid thermal anneal was performed in a nitrogen ambient at a temperature of 675° C. for approximately 10 seconds, as shown in FIG. 16(i). This caused reaction of titanium with silicon to form a titanium silicide film 418 of C49-crystal type $TiSi_2$ in the silicon, i.e., the gate-electrode polysilicon films and the source and drain regions of the silicon semiconductor substrate. Simultaneously, a titanium silicide film 417 was also formed in the surface of the titanium film. It is noted that the titanium silicide film was not formed in regions of the silicon, i.e. the silicon semiconductor substrate, covered by the side wall spacers 412 and the field oxide layers 404 and so on because of absence of oxygen supply. Thus, the titanium silicide film 418 was formed in a self-aligned manner solely in exposed regions, i.e., the source and drain regions as well as the gate electrode, of the silicon, i.e., the silicon semiconductor substrate. The titanium silicide film according to the present invention possessed excellent property in heat resist layerance, as demonstrated in Example 3.

Then, the n-channel side was masked by photo-resist layer 419 by the photolithography technique. Thereafter, boron as impurity ions as acceptor for the silicon semiconductor substrate was ion implanted into the p-channel side at a dose of $1\times10^{15}-5\times10^{15}/cm^2$ with an implant energy of 10–20 keV for forming source and drain regions (See FIG. 17(j)), followed by removing the photo-resist layer 419 away.

The titanium nitride film 417 and unreacted titanium were then removed by using a solution mixture of sulfuric acid and hydrogen peroxide. Thereafter, the second rapid thermal anneal was performed at a temperature of 1000° C. for 10 seconds to transform the titanium silicide film 418 into a stoichiometrically stable $TiSi_2$ of the C54-crystal type.

Figure 17:
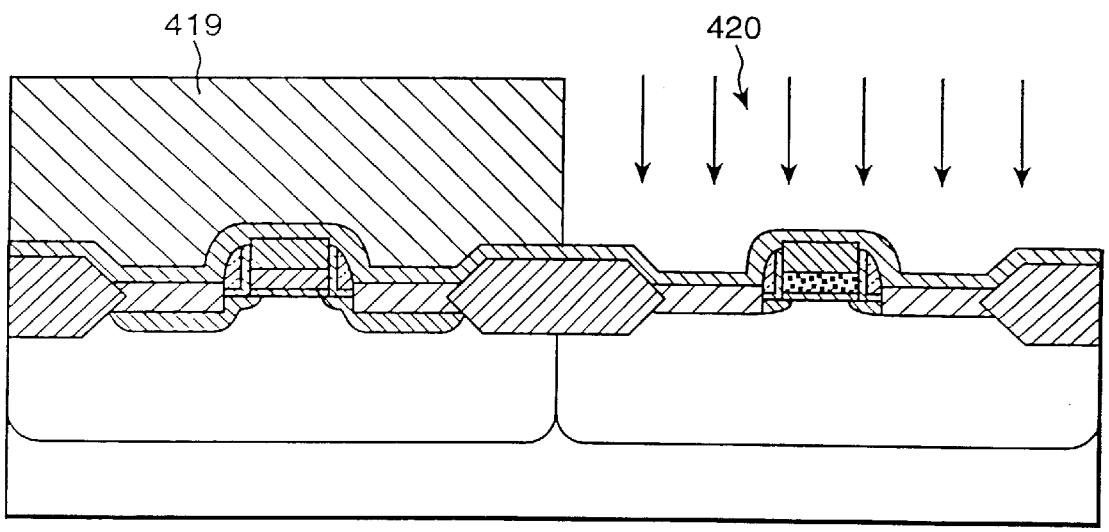
FIGS. 17(j)–17(k) are schematic sectional view showing the fabrication steps for the CMOS semiconductor device according to the eleventh embodiment of the present invention.
Figure 17:
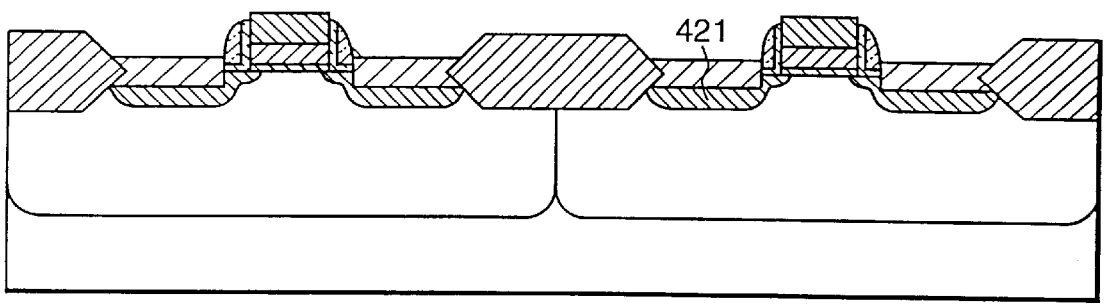

Simultaneously, the impurity ions implanted in the p-channel side were activated for formation of source and drain regions 421 (See FIG. 17(k)). Subsequently, well known steps were implemented, thus fabricating a CMOS semiconductor device.

Figure 18:
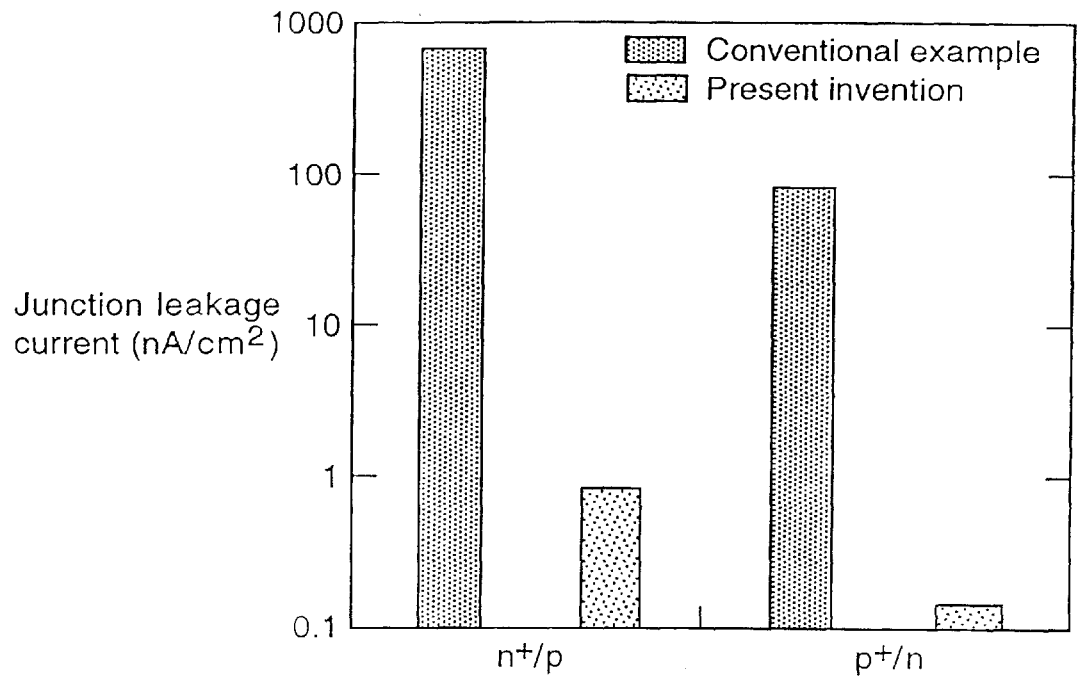
FIG. 18 is a graph showing a planar component of a junction leakage current for CMOS semiconductor devices according to the eleventh embodiment of the present invention and that of the conventional device.
Figure 19:
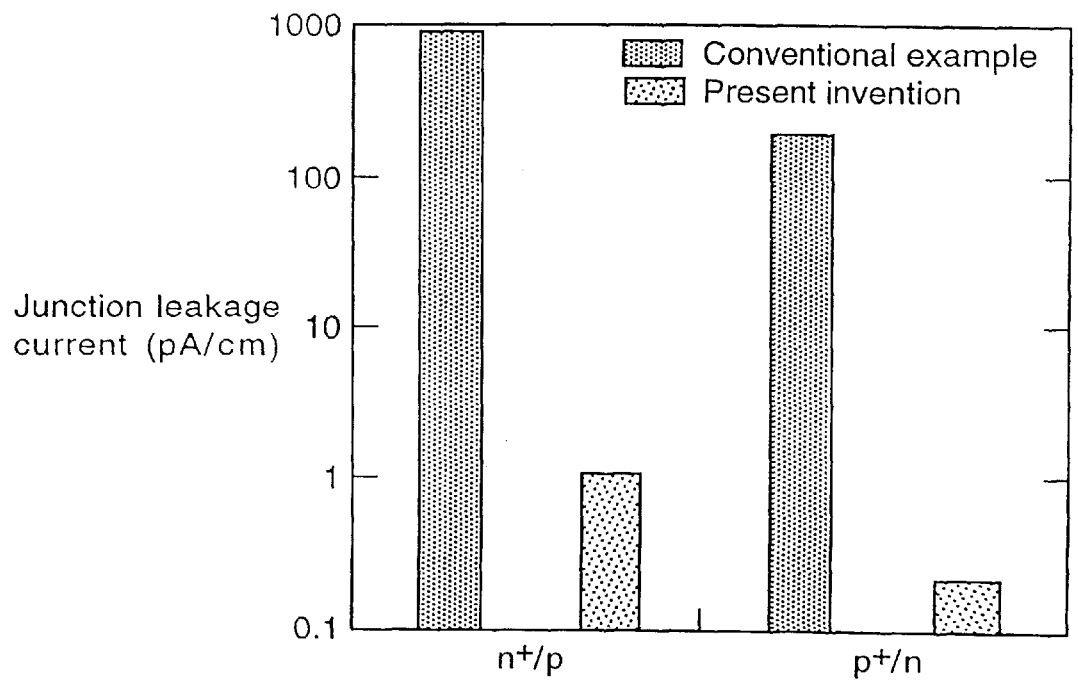
FIG. 19 is a graph showing a peripheral length component of a junction leakage current for CMOS semiconductor devices according to the eleventh embodiment of the present invention and that of the conventional device.

In order to reduce a junction leakage current through a diffusion layer on the p-channel side, heat treatment was carried out in an $N_2$ ambient at a temperature of approximately 850° C. for 30 minutes, though it comes to a trade-off for the short-channel effect. The CMOS semiconductor device fabricated in Example 11 had a junction leakage current of 0.9–0.6 nA/cm$^2$ in amount of a planer component thereof, as shown in FIG. 18, which is less than 1 nA/cm$^2$, on both the n-channel and p-channel sides. The peripheral-length component of the same current was 1–0.5 pA/cm$^2$, which is less than 1 pA/cm$^2$, as shown in FIG. 19. Thus, the junction leakage current was less by 2–3 orders providing excellent characteristics for semiconductor devices, as compared with that of the conventional method involving silicidation after ion implantation through an oxide film. Incidentally, n$^+$/p denotes n$^+$-type source and drain regions in a p-well, and p$^+$/n represents p$^+$-type source and drain regions in a n-well.

Example 12

Figure 20:
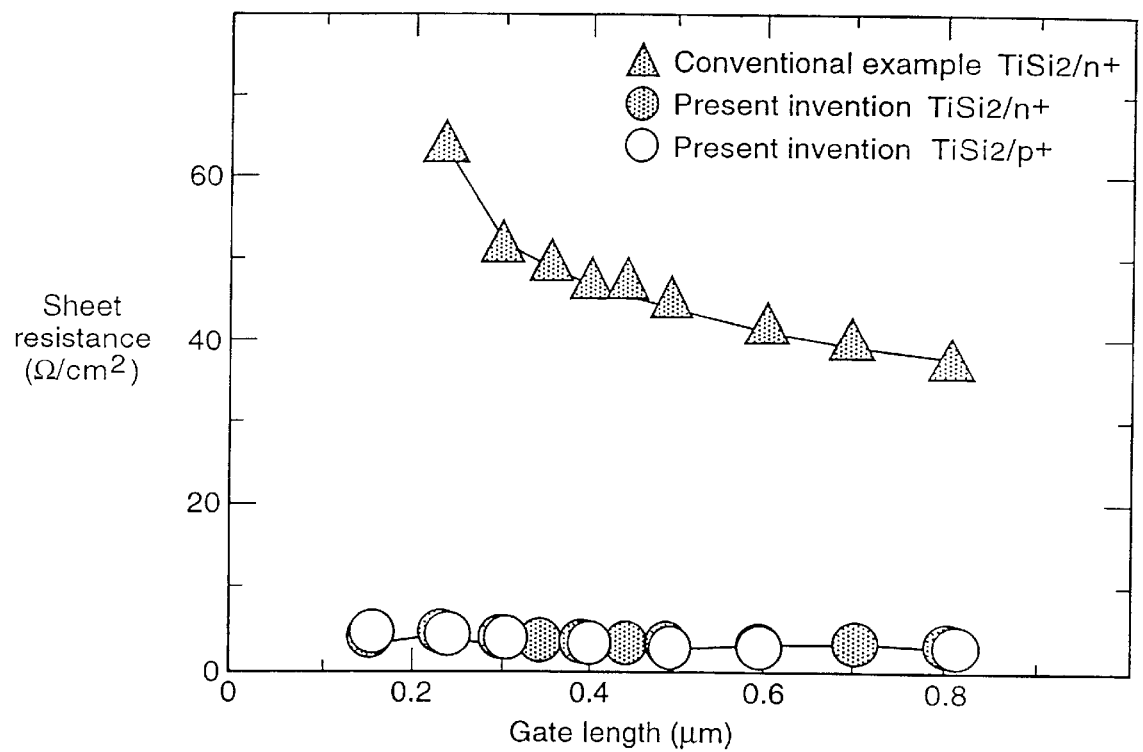
FIG. 20 is a graph showing dependency of sheet resist layerance on gate length for a CMOS semiconductor device according to the eleventh embodiment of the present invention.

FIG. 20 is a graph showing dependency of sheet resist layerance on the width of the gate electrode, or the gate length (the width of the gate electrode) for the CMOS semiconductor device according to the present invention. The gate electrode formed by the method of the invention, even if the width thereof is less than 0.2 μm, is free of increase in value of sheet resist layerance, providing an excellent property. In the conventional device, impurity doping for gate electrodes are by diffusion of phosphorous, and accordingly the gate electrode on the p-channel side is formed in n$^+$-conductivity type. In FIG. 20, ● denotes n$^+$ TiSi$_2$ formed by the method of the invention, ○ is p$^+$ TiSi$_2$ formed by the method of the invention, and Δ is n$^+$ TiSi$_2$ formed by the conventional method.

Example 13

Although in Example 12 the implantation of boron ions were after the silicidation step, such implantation may be prior to silicidation.

That is, after the step of FIG. 16(g), the n-channel side was masked by photo-resist layer by the photolithography method. Thereafter, boron impurity ions as acceptors for the silicon semiconductor substrate were implanted into the p-channel side, or the n-well, at a dose of 1×10$^{15}$–5×10$^{15}$/cm$^2$ with an implant energy of 10–20 keV for forming source and drain regions. On this occasion, Si implantation was implemented at a dose of 1×10$^{15}$–5×10$^{15}$/cm$^2$ with an implant energy of 10–20 keV for the purpose of preventing channeling effects, prior to boron implantation.

Thereafter, a heat treatment was performed in an $N_2$ ambient at a temperature of 850° C. for 30 minutes for reduction of the junction leakage current through a diffusion layer in the p-channel side, or the n-well, though it goes to a trade-off for the short-channel effect. After steps of FIGS. 16(h) and 16(i), the titanium nitride film and the unreacted titanium film were removed by using a solution mixture of sulfuric acid and hydrogen peroxide, similarly to FIG. 17(k). Then, a second rapid eat treatment was made at a temperature of 1000° C. for 10 seconds to transform the titanium silicide film into stoichiometrically stable C54-crystal type TiSi$_2$ and activate boron. After these steps, a CMOS semiconductor device was fabricated through well-known steps.

Example 14

FIGS. 22(a)–22(c) and FIG. 23(d)–23(g) are sectional views in steps for fabrication of a semiconductor device according to the invention.

Figure 22:
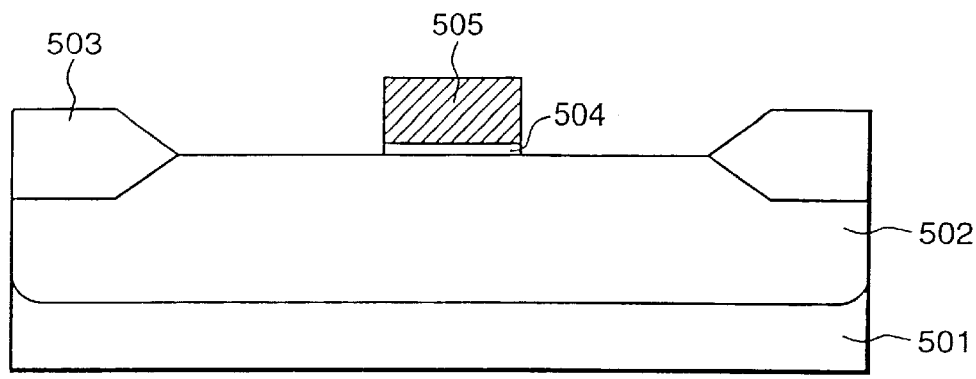
FIGS. 22(a)–22(c) are schematic sectional views showing fabrication steps for a semiconductor device according to a fifteenth embodiment of the present invention.
Figure 22:
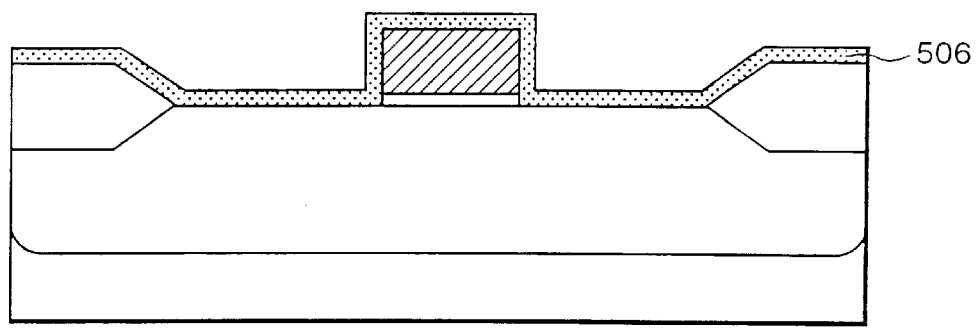
Figure 22:
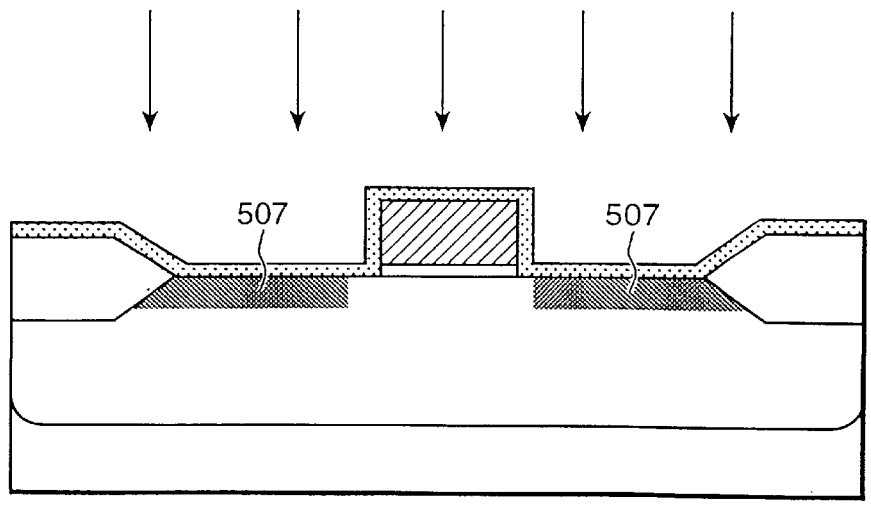

Referring first to FIG. 22(a), a silicon semiconductor substrate 501 was formed with a p-well 502, a field oxide layer 503, and a gate oxide film 504 by a well-known technique. An intrinsic polysilicon 505 for a gate electrode was deposited to a thickness of approximately 200 nm and then patterned through steps of photolithography and etching. Subsequently, a silicon nitride film 506 was deposited to a thickness of 5–20 nm, as shown in FIG. 22(b).

Then, $^{75}$As$^+$ was ion-implanted under conditions of 20–30 keV and 1–5×10$^{14}$/cm$^2$, thereby forming LDD regions 507 as extending junctions with a concentration of 5>10$^{18}$–5×10$^{19}$/cm$^3$, as shown in FIG. 22(c). Thereafter, an oxide film 508 was deposited to a thickness of approximately 200—300 nm as shown in FIG. 23(d), followed by etching the oxide layer 508 back by performing isotropic dry etching to thereby forming side wall spacers 509 on side walls of a gate electrode. On this occasion, the side wall spacers 509 were each formed leaving a width of approximately at least 150–200 nm.

A silicon nitride film 510 with a thickness of 5–20 nm was deposited as shown in FIG. 23 (e), and $^{75}$As$^+$ was ion-implanted under conditions of 40–60 keV and 1–3×10$^{15}$/cm$^2$, thereby forming source and drain regions 511. Subsequently, heat treatment was performed at 900–950° C. for 10 minutes in order for activation of the source and drain regions 511 as well as removal of damages due to implantation, as shown in FIG. 23(f).

Thereafter, the silicon nitride film 510 was removed by back-sputter to sputter-deposit refractory metal Ti to a thickness of 35 nm. The deposited Ti was heat treated to be formed into TiSi$_2$. Subsequently, unreacted Ti on side wall spacers 509 was removed by wet etching to form a titanium silicide film 512 through heat treatment for stabilization. An insulated-gate field effect transistor was formed through well-known steps implemented after the above steps.

Figure 24:
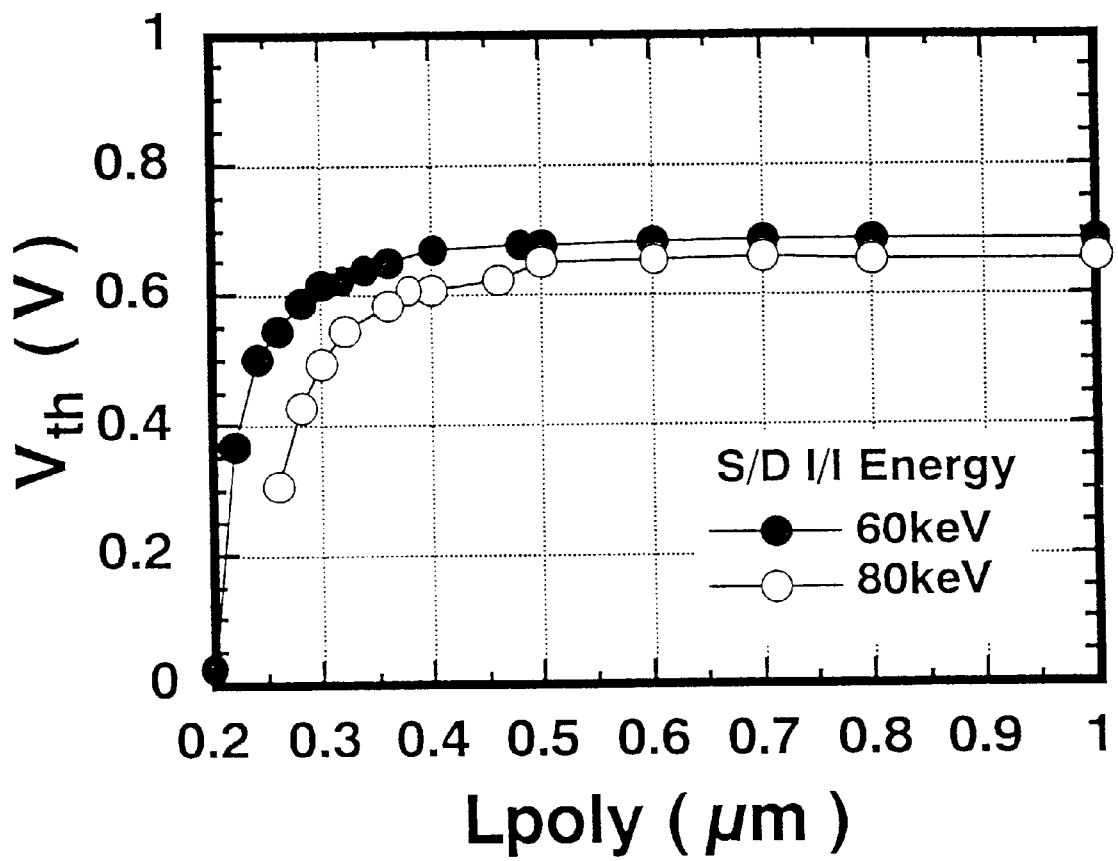
FIG. 24 is a graph showing dependency of a threshold voltage (Vth) on gate length for the semiconductor device according to the fifteenth embodiment of the present invention.

The transistors thus obtained was measured for the dependency of threshold voltage (Vth) on the gate length, the results of which are shown in FIG. 24. The measurement in FIG. 24 was made on transistors having side wall spacers with a thickness of 180 nm. These transistors were fabricated by forming LDD regions by $^{75}$As$^+$ implant under conditions of 30 keV and 3×10$^{14}$/cm$^2$, forming source and drain regions by $^{75}$As$^+$ implant under a condition of 3×10$^{15}$/cm$^2$, and then heat treating at 900° C. for 10 minutes for activation.

Figure 25:
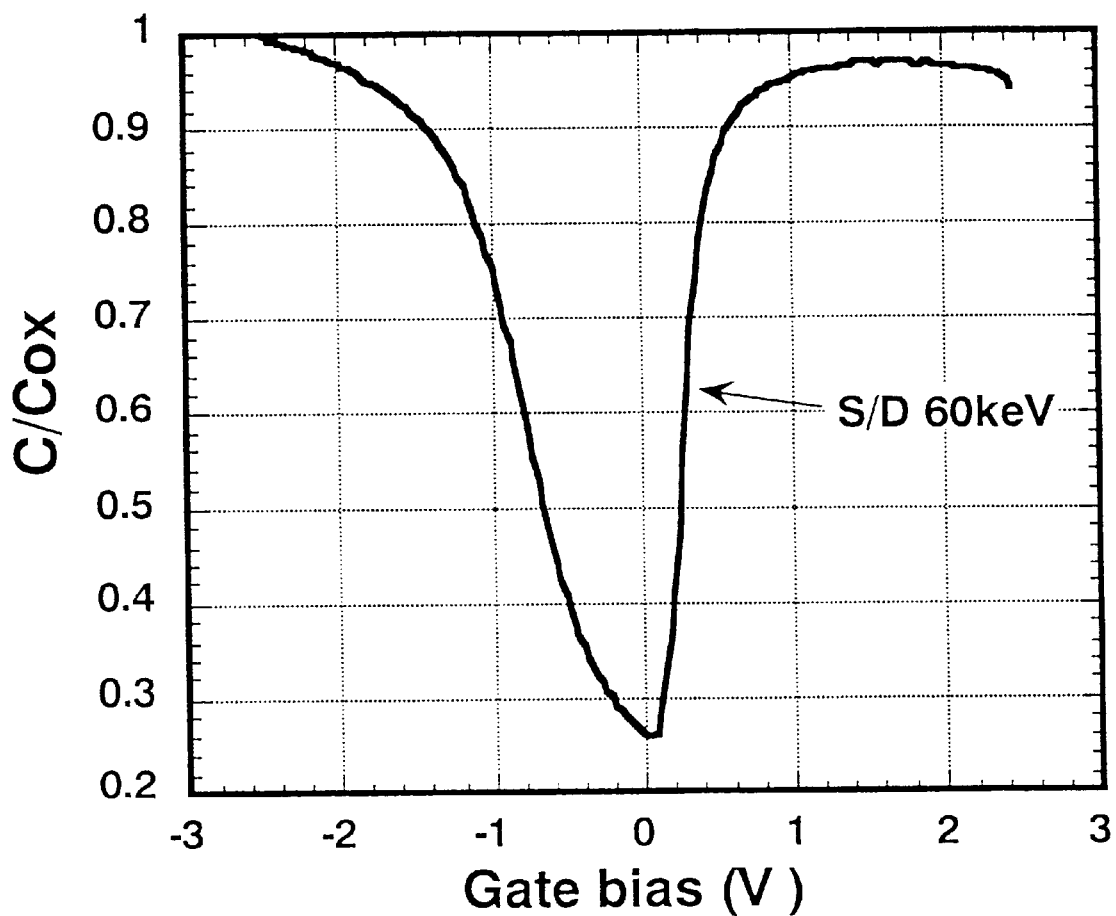
FIG. 25 is a graph showing Quasi-static C-V for the semiconductor device according to the fifteenth embodiment of the present invention.
Figure 26:
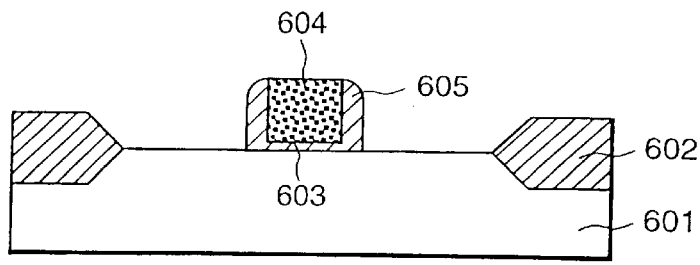
FIG. 26(a)–26(e) are schematic sectional views showing steps of a conventional self-aligning silicidation technique.
Figure 26:
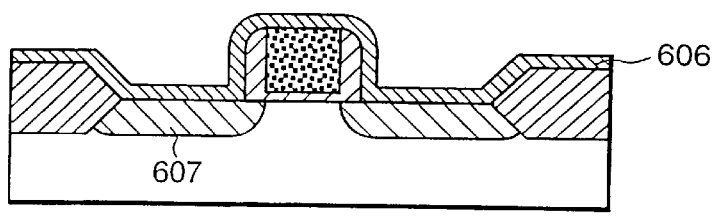
Figure 26:
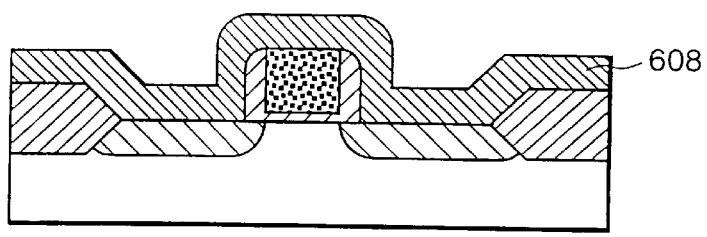
Figure 26:
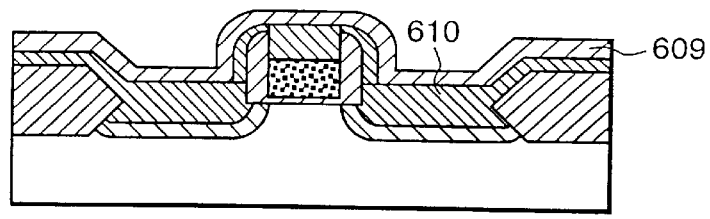
Figure 26:
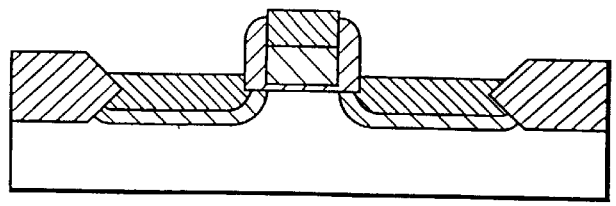
Figure 27:
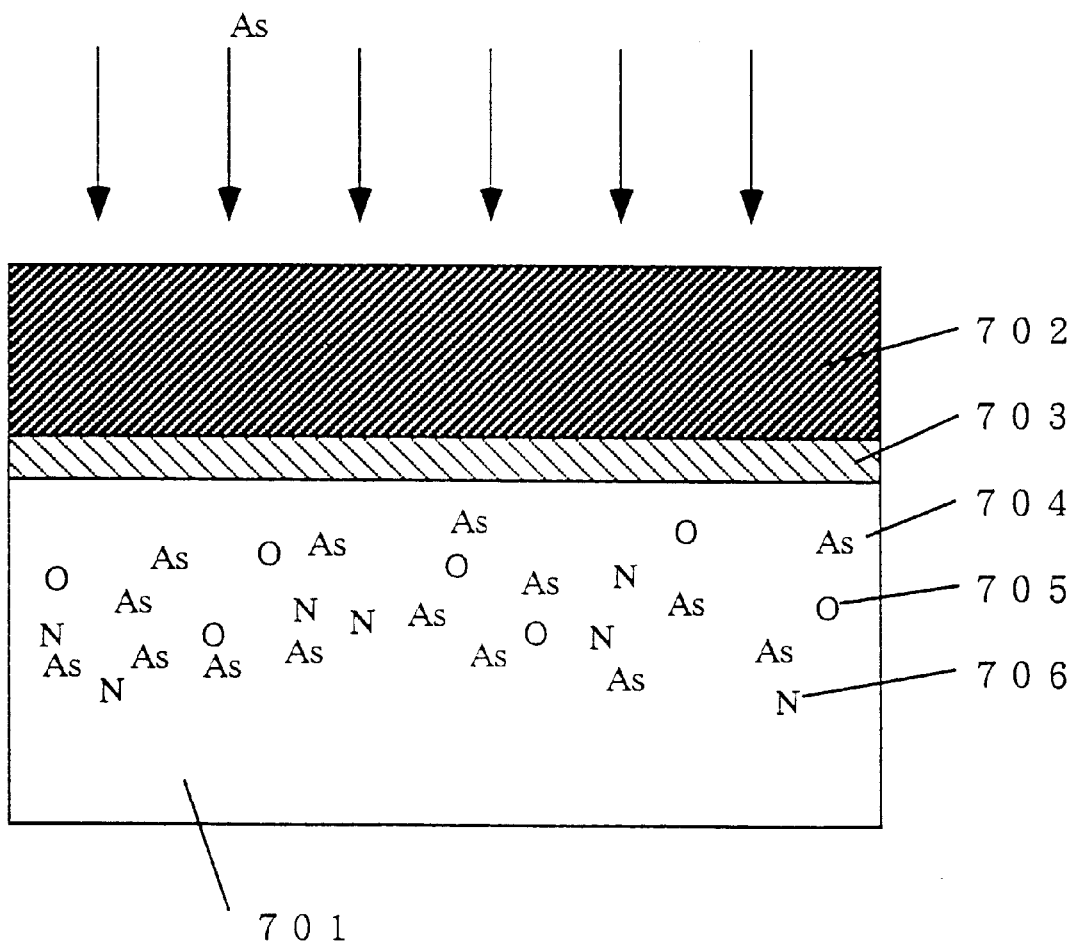
FIG. 27 is a schematic sectional view of a conventional semiconductor device.
Figure 28:
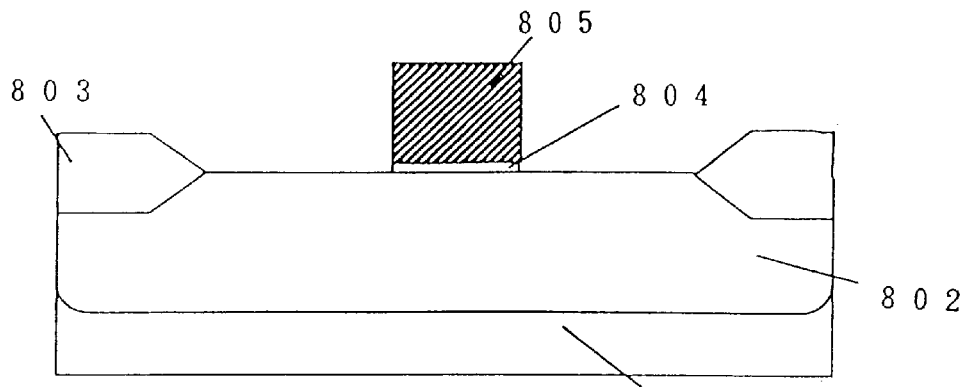
FIGS. 28(a)–28(c) are schematic sectional views showing fabrication steps for the conventional semiconductor device.
Figure 28:
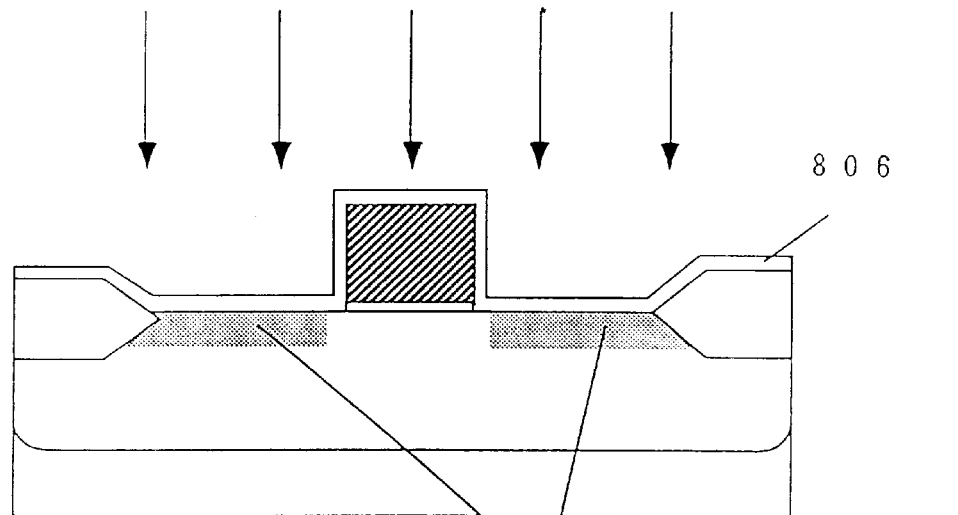
Figure 28:
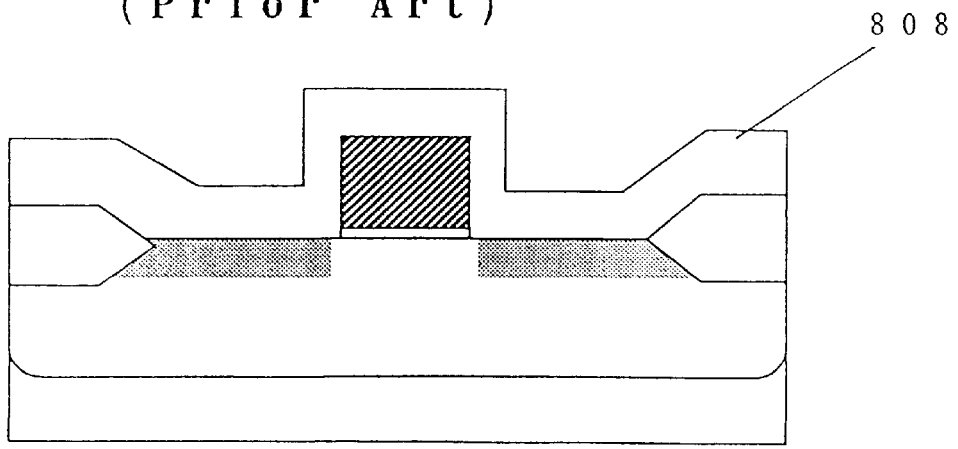
Figure 29:
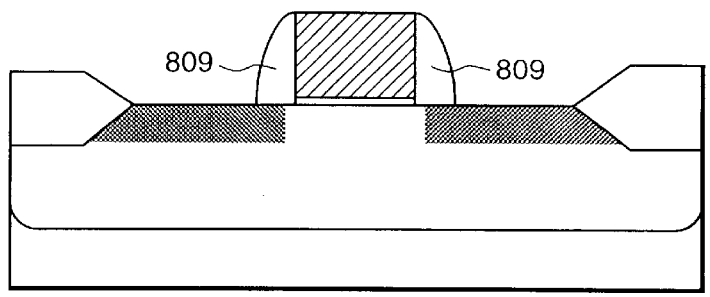
FIGS. 29(d)–29(g) are schematic sectional views showing fabrication steps for the conventional semiconductor device.
Figure 29:
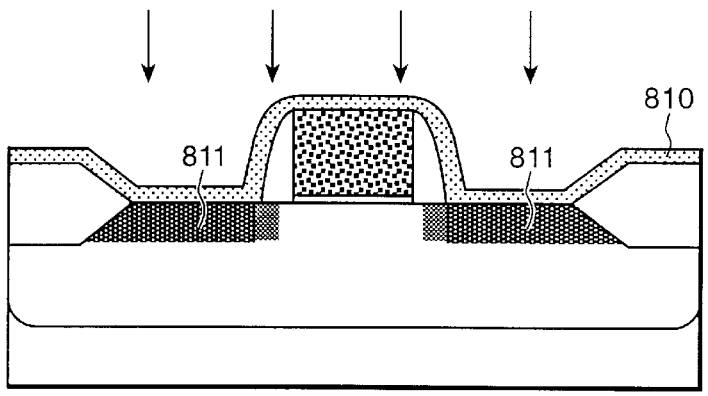
Figure 29:
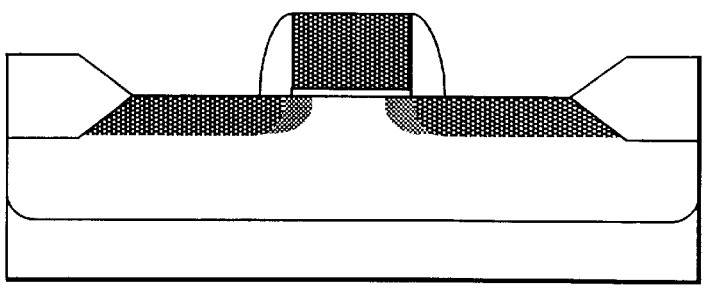
Figure 29:
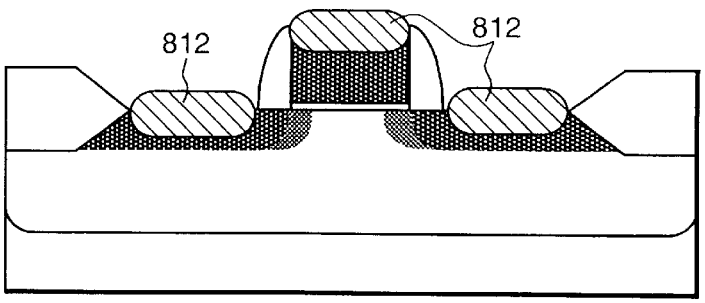

From FIG. 24, it was learned that the source and drain regions are suppressed from spreading sideways. It was also recognized that the thickened side wall spacers of 150–200 nm makes possible the transistor short-channel effect even where the junction is deepened by a heat treatment to 120–200 nm for suppression of current leakage. Further, the obtained transistor was measured for the C-V characteristic in Quasi-static, the results of which was shown in FIG. 25. Incidentally, the conditions of formation of the transistor measured was the same as that of the transistor employed in FIG. 24. It was recognized from FIG. 25 that the gate electrode of the transistor is thin, i.e., 100–200 nm, so that the gate electrode can be suppressed from depleting when implant energy for the source and drain region is relatively low. Further, the relatively high concentration of the LDD regions, i.e., 5×10$^{18}$–5×10$^{19}$/cm$^3$, made possible suppression of parasitic resist layerance from increasing due to spreading of the LDD regions sideways. Silicon nitride films are used for ion-implanting the LDD regions as well as the source and drain regions therethrough so that oxygen atoms are suppressed from undergoing knock-on and aggregation is also suppressed during formation of the titanium silicide film.

The fabrication method of a semiconductor device of the invention comprises the steps of: (a) forming a silicon nitride film over a silicon semiconductor substrate; and (b) implanting impurity ions into a desired area in the surface layer of the substrate through the silicon nitride film, simultaneously incorporation therein of nitrogen atoms and silicon atoms derived from the silicon nitride film.

Therefore, nitrogen atoms (N), instead of oxygen atoms (O), is introduced into the silicon semiconductor substrate, as compared with conventional implant of impurity ions through an oxide film. Thus, the fabrication method according to the first aspect of the invention suppresses introduction of oxygen atoms to a minimum, decreasing deep-level traps caused by oxygen. Further, crystal defects caused by impurity-ion implant are filled by nitrogen atoms so that heavy metal as a contaminant is prevented from diffusing into the silicon semiconductor substrate and being trapped to act as current-leakage centers, reducing junction leakage currents.

The fabrication method of a semiconductor device of the invention also comprises the steps of: (a)' forming a silicon nitride film over a silicon semiconductor substrate; (b)' implanting impurity ions into desired areas of the silicon semiconductor substrate, whereby nitrogen atoms from the silicon nitride film are mixed with silicon atoms together with introduction of impurity ions into the surface of the silicon semiconductor substrate; (c)' removing the silicon nitride film; (d)' forming a titanium film over the silicon semiconductor substrate; and (e)' subjecting the silicon semiconductor substrate having the titanium film to a heat treatment so as to transform the titanium film into a titanium silicide film containing nitrogen atoms.

Therefore, the following steps can be performed without exposure to the atmosphere within a cluster-type apparatus: the step of implanting impurity ions through a silicon nitride film and then removing the silicon nitride film, and the step of forming a titanium film. This makes possible formation of a titanium film over a silicon film (a silicon semiconductor substrate and a gate-electrode polysilicon film) with a native oxide film suppressed from growing. It is hence possible to well exclude the affect of oxygen during silicidation in a titanium-silicon reaction system. Therefore, a titanium silicide film can be formed which is low in electric resist layerance and excellent in heat resist layerance. There is almost no possibility of aggregation of titanium silicide film even where a heat treatment is made for reflowing after an inter-layer insulation film is formed, thereby reducing junction leakage currents.

A silicon semiconductor substrate with an oxygen concentration of $1\times10^{18}/cm^3$ or less can be formed by an intrinsic gettering treatment with easy control. Further, the heat treatment prior to the above step (c)' activates impurity ions contained in the surface layer of a silicon semiconductor substrate to form a impurity diffusion layers. This makes possible sufficient activation and restoration from crystal defect by ion implant, almost regardless of heat resist layerance of a titanium silicide film. In particular, nitrogen atoms fill crystal defects so that titanium is free from trapping by crystal defects, reducing junction leakage currents.

The steps (c)' and (d)' are carried out substantially in the absence of oxygen, so that a titanium film can be formed over the silicon semiconductor substrate and the gate electrode (polysilicon film) without substantial formation of a native oxide film on the silicon semiconductor substrate and the gate electrode. It is therefore possible to eliminate the effect of oxygen from silicidation of a titanium-silicon system.

The silicon semiconductor substrate, before subjected to the step (a)', is kept beforehand in an inert gas ambient with a dew point of below −100° C. and a pressure higher than the atmospheric pressure, thereby removing moisture on the surface thereof. As a result, oxygen atoms are minimally excluded from the interface of the silicon nitride film formed and the silicon semiconductor substrate or the gate electrode (polysilicon film). It is therefore possible to reduce oxygen atoms to a minimum which atoms may experience knock-on upon implanting of impurity ions.

The fabrication method of a semiconductor device of the invention comprises the steps of: (a)" forming a silicon nitride film over a silicon semiconductor substrate, the silicon semiconductor substrate having well regions of a first conductivity type and a second conductivity type formed in a surface layer thereof, and a surface layer thereof having gate dielectric films, gate electrodes, and isolation layer formed thereon; (b)" implanting impurity ions into desired areas of the silicon semiconductor substrate through the silicon nitride film, wherein (1) masking the first-conductivity well region with a photo-resist layer and implanting impurity ions of the first conductivity type to cause incorporation of nitrogen atoms and silicon atoms from the silicon nitride film into the second-conductivity well region of the surface layer together with introduction thereinto of impurity ions; (2) removing the photo-resist layer from the first-conductivity well region and masking the second-conductivity well region with photo-resist layer to implant impurity ions of the second conductivity type so as to cause mixing of nitrogen atoms from the silicon nitride film with silicon atoms in the surface layer of the second-conductivity well region together with introduction thereinto of impurity ions; (3) removing the photo-resist layer from the second-conductivity well region and forming side wall spacers on side walls of respective one of the gate electrodes through the silicon nitride film, and thereafter masking the first-conductivity type well region with photo-resist layer to implant impurity ions of the second conductivity type so as to cause incorporation of nitrogen atoms and silicon atoms from the silicon nitride film into the surface layer of the second-conductivity well region together with introduction thereinto of impurity ions; (4) removing the photo-resist layer from the first-conductivity well region and masking the second-conductivity well region with photo-resist layer to implant impurity ions of the second conductivity type so as to cause incorporation of nitrogen atoms and silicon atoms from the silicon nitride film into the surface layer of the second-conductivity well region together with introduction thereinto of impurity ions, and then removing the photo-resist layer from the second-conductivity well region; (c)" removing the silicon nitride film; (d)" forming a titanium film over the silicon semiconductor substrate; (e)" subjecting the silicon semiconductor substrate having the titanium film to a first heat treatment so as to transform the titanium film into a titanium silicide film containing nitrogen atoms; (f) removing unreacted part of the titanium film to leave the titanium silicide film formed by the first heat treatment; and (g) subjecting the silicon semiconductor substrate having the titanium silicide film so as to transform the silicon nitride film into a TiSi$_2$ C54-crystal structure which is stoichiometrically stable.

The fabrication method of the invention does not have disadvantage that an n-type semiconductor, as compared with a p-type, is prevented from siliciding to increase the sheet resist layerance thereof, worsening the heat resist layerance. It is therefore possible to form a uniform thickness of a silicide film for a semiconductor both of the p-type and the n-type.

The conditions for anneal can be set separately for a heat treatment (anneal) of activating the n-channel side (p-well) and a heat treatment for activating the p-channel side (n-well). In addition, it is possible to form a CMOS semiconductor device possessing both of a salicide n-channel with reduced leakage currents and a p-channel with suppressed short-channel effects. The fabrication of a surface-channel transistor satisfied with forming conditions for both the n-channel and the p-channel is possible by simultaneous implant of impurity ions into source and drain regions.

If the ion implantation of the step (4) of (b)" is after the step (e)", reaction of impurity ions and titanium is suppressed, thereby reducing transistor parasitic series resist layerance. Since a step of implanting silicon ions into a silicon semiconductor substrate is included between the step (d)" and the step (e)", mixing of titanium and silicon can be made prior to silicidation, thereby uniformly reacting at an initial stage of the silicidation. In particular, it is possible to avoid lowering in electric resist layerance for fine interconnections and variation thereof, while improving heat resist layerance.

Transformation of crystal type from C49 into C54 is possible even for fine interconnections by carrying out the second heat treatment at a temperature of 900° C. or higher, thus attaining electric resist layerance reduction. Meanwhile, in the conventional silicidation technique, heat resist layerance is low wherein aggregation occurs in a heat treatment at 800° C. or higher, so that it was impossible for a fine interconnection to transform from a C49-crystal with high resist layerance into a C54-crystal with low resist layerance. However, the second heat treatment on the heat-resist layering titanium silicide film according to the invention enables reduction of electric resist layerance for fine interconnections.

The semiconductor device of the present invention can be fabricated by the above fabrication method, and the semiconductor device comprises: wells of first and second conductivity types formed in a surface layer of a silicon semiconductor substrate; isolation layers formed on the silicon semiconductor substrate; gate dielectric films and gate electrodes formed respectively on the first and second conductivity type wells; titanium silicide films respectively formed on the gate electrodes; side wall spacers formed on side walls of each of the gate electrodes; source and drain regions formed in the surface layer on respective sides of each of the gate electrodes; regions having a junction shallower than that of the source and drain regions respectively formed in the surface layer beneath the side walls; and titanium silicide film respectively formed on the source and drain regions.

The p-conductivity type source and drain region have a junction depth equivalent to or shallower than the depth of the n-conductivity type source and drain regions. This provides a CMOS transistor structure having an n-channel and a p-channel both resist layerive to the short-channel effect.

It is possible to make equivalent the sheet resist layerance of titanium silicide films for the p-channel side and the n-channel side by structuring the first conductivity type well as an n-type and the second conductivity type well as a p-type, and making substantially equal the thickness of the titanium silicide films on the p-type well and the n-type well. The conventionally reported semiconductor device has a thickness of a titanium silicide film on the p-channel side which is thicker than that of the n-channel side. Where there is such unevenness in thickness of the titanium silicide films, the interface of the titanium silicide film and the silicon semiconductor device is closed to the junction, increasing junction current leakage. However, the present invention can prevent junction current leakage from increasing.

Further, the source and drain regions are prevented from spreading toward the depth thereof to suppress the short-channel effect by determining the thickness of the side wall spacer with respect to the direction parallel with the silicon semiconductor substrate 0.7 times the depth of the source/drain region and/or it is thicker than the gate electrode.

The fabrication method of a semiconductor device of the invention comprises the steps of: (a)''' forming a first silicon nitride film over a silicon semiconductor substrate, the silicon semiconductor substrate having a gate dielectric film and a gate electrode of polysilicon having a thickness of 100–200 nm formed thereon; (b)''' (1) implanting impurity ions of a conductivity type opposite to that of a channel region present beneath the gate electrode into desired areas of the silicon semiconductor substrate so as to incorporate nitride atoms and silicon atoms from the first silicon nitride film into a surface layer of the silicon semiconductor substrate together with introducing of impurity ions thereinto; (2) removing the first silicon nitride film and depositing an insulation film to a thickness of 200–300 nm over the silicon semiconductor substrate, subjecting the insulation film to isotropic etching to form side wall spacers on side walls of the gate electrode, and forming a second silicon nitride film over the silicon semiconductor substrate to implant impurity ions of the conductivity type opposite to that of the channel region so as to cause incorporation (b) of nitrogen atoms and silicon atoms from the second silicon nitride film into the gate electrode as well as the surface layer to be formed into source and drain regions of the silicon semiconductor substrate together with introducing impurity ions thereinto, (c)''' removing the second silicon nitride film to perform a heat treatment for restoration of crystal defects; (d)''' forming a titanium film over the silicon semiconductor substrate; and (e)''' subjecting the silicon semiconductor substrate having the titanium film to further heat treatment so as to transform by self-aligning the titanium film into a titanium silicide film containing nitrogen atoms.

Therefore, a semiconductor device possessing a favorable transistor characteristics is easily fabricated without complexity. A shallow junction depth is provided for LDD regions of a semiconductor device by determining the conditions of ion-implant in the step (1) of (b)''' as 20–30 keV and $5 \times 10^{13}$–$5 \times 10^{14}$/cm$^2$. Further, a high concentration of source and drain regions are formed by determining the conditions of ion-implant in the step (2) of (b)''' as 40–60 keV and $1 \times 10^{15}$–$5 \times 10^{15}$/cm$^2$, suppressing the increase in parasitic resist layerance due to spreading sideways of the LDD regions. The junctions of source and drain regions are positioned distant from the titanium silicide film by doing the heat treatment of the step (c)''' for restoration from crystal defects under conditions of at 800° C.–950° C. for 5–60 minutes, reducing junction current leakage.

Further, the semiconductor device of the invention comprises: a silicon semiconductor substrate having a gate electrode formed thereon through a gate dielectric film, the gate electrode containing at least polysilicon having a thickness of 100–200 nm; a titanium silicide film formed on the gate electrode; side wall spacers formed to a thickness of 150–200 nm on side walls of the gate electrode; source and drain regions formed to a depth of 120–200 nm in the surface layer on respective sides of the gate electrode, the source and drain regions being of a conductivity type opposite to that of a channel region provided therebetween; regions having a junction shallower than that of the source and drain regions respectively formed in the surface layer beneath the side walls; and titanium silicide films respectively formed on the source and drain regions.

Therefore, a trade-off is eliminated in the relations of depletion of a gate electrode with junction leakage and the short-channel effect, thus providing favorable characteristics for the semiconductor device. Further, shallower junction regions than the source and drain regions have an impurity concentration of $5 \times 10^{18} - 5 \times 10^{19}/cm^3$, suppressing increase of parasitic resist layerance due to spreading sideways of the LDD regions.

What is claimed is:

1. A method of fabricating a semiconductor device comprising the steps of:
   (a) forming a gate electrode overlying a gate insulating film on a silicon semiconductor substrate;
   (b) forming a silicon nitride film directly on a surface of the silicon semiconductor substrate and the gate electrode after inhibiting native oxidation of the surface; and
   (c) implanting impurity ions into a desired area in a surface layer of the substrate and the electrode through the silicon nitride film, and simultaneously incorporating, in the desired area of the surface layer, nitrogen atoms and silicon atoms derived from the silicon nitride film in order to prevent oxygen atoms from being knocked into the desired area.

2. The method of claim 1 in which the silicon semiconductor substrate before the formation of the silicon nitride film has an oxygen concentration of $1 \times 10^{18}/cm^3$ or less in the desired area to be implanted with impurity ions.

3. The method of claim 2 in which the oxygen concentration of $1 \times 10^{18}/cm^3$ or less is achieved by subjecting the silicon semiconductor substrate into an intrinsic gettering method.

4. The method of claim 1 in which the silicon semiconductor substrate to be used in step (a) is maintained in nitrogen gas, at a dew point below $-100°$ C. and under a pressure higher than the atmospheric pressure, in order to remove moisture which may exist on the surface thereof.

5. A method of fabricating a semiconductor device comprising the steps of: forming a gate electrode polysilicon overlying a gate insulating film on a silicon semiconductor substrate; (a)' forming a silicon nitride film directly on a surface of the silicon semiconductor substrate and the rate electrode; (b)' implanting impurity ions into desired areas of the silicon semiconductor substrate and the electrode, whereby nitrogen atoms and silicon atoms from the silicon nitride film are incorporated into the surface of the silicon semiconductor substrate together with introduction thereinto of the impurity ions; (c)' removing the silicon nitride film; (d)' forming a titanium film on the silicon semiconductor substrate; and (e)' subjecting the silicon semiconductor substrate having the titanium film to a heat treatment so as to transform the titanium film into a titanium silicide film containing nitrogen atoms.

6. The method of claim in which the silicon semiconductor substrate is subjected to a heat treatment before the step (c)', thereby activating impurity ions contained in the surface layer of the semiconductor substrate to form an impurity diffusion layer.

7. The method of claim 5 in which the steps (c)' and (d)' are carried out substantially in the absence of oxygen.

8. The method of claim 5 in which the silicon semiconductor substrate to be used in the step (a)' is maintained in an inert gas, at a dew point below $-100°$ C. and under a pressure higher than the atmospheric pressure, in order to remove moisture which may exist on the surface thereof.

9. A method of fabricating a semiconductor device comprising the steps of (a)" forming a silicon nitride film on a silicon semiconductor substrate, which has well regions of a first conductivity type and a second conductivity type formed in the surface layer thereof, and a gate dielectric film, a gate electrode of silicon, and an isolation layer formed on the surface layer; (b)" implanting impurity ions into desired areas of the silicon semiconductor substrate through the silicon nitride film, in order to prevent oxygen atoms from being knocked into the desired areas, wherein
   (1) masking the first-conductivity well region with a photo-resist layer and implanting impurity ions of the first conductivity type to cause incorporation of nitrogen atoms and silicon atoms from the silicon nitride film into the second-conductivity well region of the surface layer together with introduction thereinto of the impurity ions; (2) removing the photo-resist layer from the first-conductivity well region and masking the second-conductivity well region with a photo-resist layer to implant impurity ions of the second conductivity type so as to cause incorporation of nitrogen atoms and silicon atoms from the silicon nitride film into the surface layer of the second-conductivity well region together with introduction thereinto of the impurity ions; (3) removing the photo-resist layer from the second-conductivity well region and forming side wall spacers on side walls of respective one of the gate electrodes, and thereafter masking the first-conductivity type well region with a photo-resist layer to implant impurity ions of the first conductivity type so as to cause incorporation of nitrogen atoms and silicon atoms from the silicon nitride film into the surface layer of the second-conductivity well region together with introduction thereinto of the impurity ions; (4) removing the photo-resist layer from the first-conductivity well region and masking the second-conductivity well region with a photo-resist layer to implant impurity ions of the second conductivity type so as to cause incorporation of nitrogen atoms and silicon atoms from the silicon nitride film into the surface layer of the second-conductivity well region together with introduction thereinto of the impurity ions, and then removing the photo-resist layer from the second-conductivity well region; (c)" removing the silicon nitride film; (d)" forming a titanium film on the silicon semiconductor substrate; (e)" subjecting the silicon semiconductor substrate having the titanium film to a first heat treatment so as to transform the titanium film into a titanium silicide film containing nitrogen atoms; (f) removing untransformed part of the titanium film; and (g) subjecting the silicon semiconductor substrate having the titanium silicide film to a second heat treatment so as to transform the titanium silicide film into a $TiSi_2$ C54-crystal structure which is stoichiometrically stable.

10. The method of claim 9 in which the impurity ions of the first conductivity type of the steps (1) and (3) of (b)" are donor type impurity ions and the impurity ions of the second conductivity type of the steps (2) and (4) of (b)" are acceptor type impurity ions.

11. The method of claim 9 in which the silicon semiconductor substrate is subjected to a heat treatment after the steps (3) and (4) of (b)", thereby activating impurity ions contained in the surface layer of the silicon semiconductor substrate to form impurity diffusion layers.

12. The method of claim 9 in which the ion implantation of the step (4) of (b)" is after the step (e)".

13. The method of claim 9 in which the silicon semiconductor substrate is subjected to the second heat treatment after the steps (3) of (b)" and (g), thereby activating impurity ions contained in the surface layer of the silicon semiconductor substrate to form impurity diffusion layers.

14. The method of claim 9 in which a step of implanting silicon ions into a silicon semiconductor substrate is included between the step (d)" and the step (e)".

15. The method of claim 9 in which the second heat treatment is conducted at 800° C. or more.

16. The method of claim 9 in which a silicon nitride film is further deposides after the side wall spacers are formed and before the first-conductivity well region is marked with a photo-resist layer in the step (3) of (b)".

17. A method of fabricating a semiconductor device comprising the steps of:
(a)''' forming a first silicon nitride film on a silicon semiconductor substrate, the silicon semiconductor substrate having a gate dielectric film and a gate electrode of polysilicon having a thickness of 100–200 nm formed thereon; (b)''' (1) implanting impurity ions of a conductivity type opposite to that of a channel region present beneath the gate electrode into desired areas of the silicon semiconductor substrate so as to incorporate nitrogen atoms and silicon atoms from the first silicon nitride film into a surface layer of the silicon semiconductor substrate together with introducing of the impurity ions thereinto, in order to prevent oxygen atoms from being knocked into the desired areas: (2) removing the first silicon nitride film and depositing an insulation film to a thickness of 200–300 nm over the silicon semiconductor substrate, subjecting the insulation film to isotropic etching to form side wall spacers on side walls of the gate electrode, and forming a second silicon nitride film on the silicon semiconductor substrate to implant impurity ions of the conductivity type opposite to that of the channel region so as to cause incorporation of nitrogen atoms and silicon atoms from the second silicon nitride film into the gate electrode as well as the surface layer to be formed into source and drain regions of the silicon semiconductor substrate together with introducing of the impurity ions thereinto; (c)''' removing the second silicon nitride film to perform a heat treatment for restoration from crystal defects; (d)''' forming a titanium film on the silicon semiconductor substrate; and (e)''' subjecting the silicon semiconductor substrate having the titanium film to further heat treatment so as to transform by self-aligning the titanium film into a titanium silicide film containing nitrogen atoms.

18. The method of claim 17 in which the ions-implantation in the step (1) of (b)''' is 20–30 keV and $5\times10^{13}$–$5\times10^{14}$/cm$^2$.

19. The method of claim 17 in which the ions-implantation in the step (1) of (b)''' is conducted under a condition of 40–60 keV and $1\times10^{15}$–$5\times10^{15}$/cm$^2$.

20. The method of claim 17 in which the heat treatment of the step (c)''' for restoration from crystal defects in conducted at 800–950° C. for 5–60 minutes.

21. The method of claim 9, wherein said step (a)" includes forming the silicon nitride film directly on the surface of the silicon semiconductor substrate.

22. The method of claim 21, wherein the oxygen concentration of the silicon semiconductor substrate is made $1\times10^{18}$/cm$^3$ or less by subjecting the silicon semiconductor substrate to an intrinsic getting method before the step (a)".

23. The method of claim 17, wherein said step (a)''' includes forming the silicon nitride film directly on the surface of the silicon semiconductor substrate.

24. The method of claim 23, wherein the oxygen concentration of the silicon semiconductor substrate is made $1\times10^{18}$/cm$^3$ or less by subjecting the silicon semiconductor substrate to an intrinsic getting method before the step (a)'''.

25. The method of claim 5 in which the silicon semiconductor substrate before the formation of the silicon nitride film has an oxygen concentration of $1\times10^{18}$/cm$^3$ or less in the desired area to be implanted with impurity ions.

26. The method of claim 5 in which the oxygen concentration of $1\times10^{18}$/cm$^3$ or less is achieved by subjecting the silicon semiconductor substrate into an intrinsic gettering method.

27. The method of claim 9 in which the silicon semiconductor substrate before the formation of the silicon nitride film has an oxygen concentration of $1\times10^{18}$/cm$^3$ or less in the desired area to be implanted with impurity ions.

28. The method of claim 9 in which the oxygen concentration of $1\times10^{18}$/cm$^3$ or less is achieved by subjecting the silicon semiconductor substrate into an intrinsic gettering method.

29. The method of claim 17 in which the silicon semiconductor substrate before the formation of the silicon nitride film has an oxygen concentration of $1\times10^{18}$/cm$^3$ or less on the desired area to be implanted with impurity ions.

30. The method of claim 17 in which the oxygen concentration of $1\times10^{18}$/cm$^3$ or less is achieved by subjecting the silicon semiconductor substrate into an intrinsic gettering method.

31. The method according to claim 1, wherein the silicon semiconductor substrate unoxidized, the method further comprising the step of:
(a) isolating the unoxodized silicon semiconductor substrate in at least an inert gas, selected from the group consisting of nitrogen and argon, to prevent oxide formation prior to forming the silicon nitride film is step (b).

32. The method according to claim 1 wherein step (c) further comprises filling crystal defects in the silicon semiconductor substrate with the nitrogen atoms to minimize juction leakage current of the semiconductor device by preventing heavy metal contaminants from diffusing into the semiconductor substrate.

33. The method according to claim 1 further comprising the step of:
(d) forming a silicide film overlying the desired area, the silicide film having a sheet resistance controllable by nitrogen and silicon atoms incorporated into the desired area to maximize compliance with manufacturing tolerances in the sheet resistance.

* * * * *